US012700445B2

(12) United States Patent
Oh

(10) Patent No.: US 12,700,445 B2
(45) Date of Patent: *Aug. 4, 2026

(54) SEMICONDUCTOR MEMORY DEVICE AND MEMORY SYSTEM INCLUDING THE SAME

(71) Applicant: SAMSUNG ELECTRONICS CO., LTD., Suwon-si (KR)

(72) Inventor: Taeyoung Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/789,866

(22) Filed: Jul. 31, 2024

(65) Prior Publication Data

US 2024/0395304 A1 Nov. 28, 2024

Related U.S. Application Data

(63) Continuation of application No. 17/885,081, filed on Aug. 10, 2022, now Pat. No. 12,080,334.
(Continued)

(30) Foreign Application Priority Data

Apr. 11, 2022 (KR) ........................ 10-2022-0044441
Apr. 27, 2022 (KR) ........................ 10-2022-0051804

(51) Int. Cl.
*G11C 11/40* (2006.01)
*G11C 11/406* (2006.01)
*G11C 11/4096* (2006.01)

(52) U.S. Cl.
CPC ... *G11C 11/40618* (2013.01); *G11C 11/40611* (2013.01); *G11C 11/4096* (2013.01)

(58) Field of Classification Search
CPC ......... G11C 11/40618; G11C 11/40611; G11C 11/4096; G11C 11/4072; G11C 11/4078; G11C 11/408; G11C 11/4063
See application file for complete search history.

(56) References Cited

U.S. PATENT DOCUMENTS 9,299,400 B2 3/2016 Bains et al.
9,589,606 B2 3/2017 Lin et al.
(Continued)

FOREIGN PATENT DOCUMENTS

CN 108369820 A 8/2018
CN 2021-10731684 6/2021
WO 2022-066178 A1 3/2022

OTHER PUBLICATIONS

Office Action dated Feb. 11, 2026 issued in corresponding to Taiwanese Patent Application No. 111139450.

*Primary Examiner* — Mohammed A Bashar
(74) *Attorney, Agent, or Firm* — Morgan, Lewis & Bockius LLP

(57) ABSTRACT

A semiconductor memory device includes a row hammer management circuit and a refresh control circuit. The row hammer management circuit counts the number of times of access on each memory cell row to store the counted values in count cells of each memory cell row as count data. A hammer address queue in the row hammer management circuit stores candidate hammer addresses, which are intensively accessed, in response to a number of the candidate hammer addresses reaching a second number, transitions a logic level of an error signal provided to the memory controller, and, in response to the number of the candidate hammer addresses reaching the first number, outputs one of the candidate hammer addresses as a hammer address. The refresh control circuit performs a hammer refresh operation (Continued)

on victim memory cell rows which are physically adjacent to a memory cell row corresponding to the hammer address.

19 Claims, 41 Drawing Sheets

Related U.S. Application Data

(60) Provisional application No. 63/332,389, filed on Apr. 19, 2022.

(56) References Cited

U.S. PATENT DOCUMENTS

| | | | |
|---|---|---|---|
| 10,825,534 B2 | 11/2020 | Nale | |
| 10,943,636 B1 | 3/2021 | Wu et al. | |
| 11,521,669 B2 | 12/2022 | Enomoto et al. | |
| 11,935,576 B2 | 3/2024 | Ishikawa et al. | |
| 11,942,137 B2 | 3/2024 | Kim | |
| 2014/0281207 A1 | 9/2014 | Mandava et al. | |
| 2016/0224262 A1 | 8/2016 | Mandava et al. | |
| 2017/0213586 A1 | 7/2017 | Kang et al. | |
| 2018/0114561 A1 | 4/2018 | Fisch et al. | |
| 2019/0348107 A1* | 11/2019 | Shin | G11C 11/40622 |
| 2022/0068348 A1 | 3/2022 | Bennett et al. | |
| 2022/0230672 A1* | 7/2022 | Ayyapureddi | G11C 11/406 |
| 2023/0326511 A1 | 10/2023 | Oh | |

* cited by examiner

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CID0 | CID1 | CID2 |
| | H | R4 | R5 | R6 | R7 | R8 | R9 | R10 | R11 | R12 | R13 | R14 | R15 | R16 | CID3/R17 |
| WR | L | H | L | H | H | L | BL | BA0 | BA1 | BG0 | BG1 | BG2 | CID0 | CID1 | CID2 |
| | H | V | C3 | C4 | C5 | C6 | C7 | C8 | C9 | C10 | V | H | L | V | CID3 |
| RD | L | H | L | H | H | H | BL | BA0 | BA1 | BG0 | BG1 | BG2 | CID0 | CID1 | CID2 |
| | H | C2 | C3 | C4 | C5 | C6 | C7 | C8 | C9 | C10 | V | H | V | V | CID3 |

FIG. 20

| CMD | CS_n | CA0 | CA1 | CA2 | CA3 | CA4 | CA5 | CA6 | CA7 | CA8 | CA9 | CA10 | CA11 | CA12 | CA13 |
|-----|------|-----|-----|-----|-----|-----|-----|-----|-----|-----|-----|------|------|------|------|
| WRA | L | H | L | H | H | L | BL | BA0 | BA1 | BG0 | BG1 | BG2 | CID0 | CID1 | CID2 |
| | H | V | C3 | C4 | C5 | C6 | C7 | C8 | C9 | C10 | V | AP | L | V | CID3 |
| RDA | L | H | L | H | H | H | BL | BA0 | BA1 | BG0 | BG1 | BG2 | CID0 | CID1 | CID2 |
| | H | C2 | C3 | C4 | C5 | C6 | C7 | C8 | C9 | C10 | V | AP | V | V | CID3 |

FIG. 21

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| PREab | L | H | H | L | H | L | CID3 | V | V | V | V | L | CID0 | CID1 | CID2 |
| PREsb | L | H | H | L | H | L | CID3 | BA0 | BA1 | V | V | H | CID0 | CID1 | CID2 |
| PREpb | L | H | H | L | H | h | CID3 | BA0 | BA1 | BG0 | BG1 | BG2 | CID0 | CID1 | CID2 |

MRxx

| Function | Type | OP[7:0] |
|---|---|---|
| Error_Mode | R | If OP[7:0]=xxx1xxxx,PRHT_QUEUE is full |

MRyy

| Function | Type | OP[7:6] | OP[5:0] |
|---|---|---|---|
| PRHT_QUEUE_FULL | R | RFU | BG Address/Bank Address |

SEMICONDUCTOR MEMORY DEVICE AND MEMORY SYSTEM INCLUDING THE SAME

CROSS-REFERENCE TO RELATED APPLICATIONS

This application is a continuation application of U.S. patent application Ser. No. 17/885,081, filed on Aug. 10, 2022, which claims priority under 35 U.S.C. § 119 to Korean Patent Application No. 10-2022-0044441, filed on Apr. 11, 2022 and to Korean Patent Application No. 10-2022-0051804, filed on Apr. 27, 2022, and to U.S. Provisional Application No. 63/332,389, filed on Apr. 19, 2022, the disclosures of which are incorporated by reference herein in their entireties.

TECHNICAL FIELD

Embodiments of the present disclosure relate to memories, and more particularly, to semiconductor memory devices capable of defending against a row hammer attack and memory systems including the same.

DISCUSSION OF RELATED ART

A semiconductor memory device may be classified as a volatile memory device or a nonvolatile memory device. A volatile memory device refers to a memory device that loses data stored therein upon losing power. As an example of a volatile memory device, a dynamic random access memory (DRAM) may be used in various devices such as a mobile system, a server, or a graphic device.

SUMMARY

Example embodiments may provide a semiconductor memory device capable of defending against a row hammer attack while managing a row hammer of all of a plurality of memory cell rows.

Example embodiments may provide a memory system including a semiconductor memory device capable of defending against a row hammer attack while managing a row hammer of all of a plurality of memory cell rows.

According to example embodiments, a semiconductor memory device includes a memory cell array, a row hammer management circuit and a refresh control circuit. The memory cell array includes a plurality of memory cell rows. Each of the plurality of memory cell rows includes a plurality of memory cells. The row hammer management circuit counts the number of times of access associated with each of the plurality of memory cell rows in response to an active command from an external memory controller to store the counted values in count cells of each of the plurality of memory cell rows as count data. The row hammer management circuit includes a hammer address queue. The hammer address queue stores one or more candidate hammer addresses up to a first number based on a first-in first-out (FIFO) scheme, which are intensively accessed, from among the plurality of memory cell rows, based on a comparison of the counted value with a first reference number of times, in response to a number of the candidate hammer addresses stored therein reaching a second number equal to or smaller than the first number, transitions a logic level of an error signal provided to the memory controller, and, in response to the number of the candidate hammer addresses stored therein reaching the first number, outputs one of the candidate hammer addresses stored therein as a hammer address.

The refresh control circuit receives the hammer address and performs a hammer refresh operation on one or more victim memory cell rows which are physically adjacent to a memory cell row corresponding to the hammer address.

According to example embodiments, a semiconductor memory device includes a memory cell array, a row hammer management circuit and a refresh control circuit. The memory cell array includes a plurality of memory cell rows. Each of the plurality of memory cell rows includes a plurality of memory cells. The row hammer management circuit counts the number of times of access associated with each of the plurality of memory cell rows in response to an active command from an external memory controller to store the counted values in count cells of each of the plurality of memory cell rows as count data. The row hammer management circuit includes a hammer address queue. The hammer address queue stores one or more candidate hammer addresses up to a first number based on first-in first-out (FIFO) scheme, which are intensively accessed, from among the plurality of memory cell rows, based on a first comparison of the counted value with a first reference number of times, transitions a logic level of an error signal provided to the memory controller based on a second comparison of the count data which is further associated with each of the candidate hammer addresses after the candidate hammer addresses are stored in the plurality of FIFO registers, with a second reference number of times and a third reference number of times, and output one of the candidate hammer addresses stored therein as a hammer address based on a result of the second comparison. The refresh control circuit receives the hammer address and performs a hammer refresh operation on one or more victim memory cell rows which are physically adjacent to a memory cell row corresponding to the hammer address.

According to example embodiments, a memory system includes a semiconductor memory device and a memory controller that controls the semiconductor memory device. The semiconductor memory device includes a memory cell array, a row hammer management circuit and a refresh control circuit. The memory cell array includes a plurality of memory cell rows. Each of the plurality of memory cell rows includes a plurality of memory cells. The row hammer management circuit counts the number of times of access associated with each of the plurality of memory cell rows in response to an active command from the memory controller to store the counted values in count cells of each of the plurality of memory cell rows as count data. The row hammer management circuit includes a hammer address queue. The hammer address queue stores one or more candidate hammer addresses up to a first number based on a first-in first-out (FIFO) scheme, which are intensively accessed, from among the plurality of memory cell rows, based on a comparison of the counted value with a first reference number of times, in response to a number of the candidate hammer addresses stored therein reaching a second number equal to or smaller than the first number, transitions a logic level of an error signal provided to the memory controller, and, in response to the number of the candidate hammer addresses stored therein reaching the first number, outputs one of the candidate hammer addresses stored therein as a hammer address. The refresh control circuit receives the hammer address and performs a hammer refresh operation on one or more victim memory cell rows which are physically adjacent to a memory cell row corresponding to the hammer address. The row hammer management circuit further includes a random number generator. The random number generator generates a random count data to be stored in the count cells of each of the plurality of memory cell rows based on a random initialization command from the memory controller during a power-up sequence of the semiconductor memory device Accordingly, the semiconductor memory device according to example embodiments may store active count of each of a plurality of memory cell rows in count cells of each of the plurality of memory cell rows as the count data, and may update the count data based on a subsequent command which is applied after the active command. In addition, a hammer address queue in the row hammer management circuit may transition a logic level of an error signal provided to a memory controller from a first logic level to a second logic level in response to candidate hammer addresses being stored in all or a portion of FIFO registers in the hammer address queue. Accordingly, the semiconductor memory device may manage row hammer attacks on the candidate hammer addresses after the candidate hammer addresses are stored in the hammer address queue.

BRIEF DESCRIPTION OF THE DRAWINGS

The above and other features of the present disclosure will become more apparent by describing in detail embodiments thereof with reference to the accompanying drawings.

FIG. 9 illustrates an example of a hammer address queue in the row hammer management circuit of FIG. 5A or FIG. 5B according to example embodiments.

FIG. 11 illustrates an example of a hammer address queue in the row hammer management circuit of FIG. 5A or FIG. 5B according to example embodiments.

FIG. 12A illustrates an example of a hammer address queue in the row hammer management circuit of FIG. 5A or FIG. 5B according to example embodiments.

FIGS. 19 through 21 illustrate example commands which may be used in the memory system of FIG. 1 according to example embodiments.

FIGS. 33A and 33B illustrate an example state diagram of a semiconductor memory device according to example embodiments.

FIG. 37 illustrates examples of mode registers in each of the semiconductor memory devices in FIG. 36 according to example embodiments.

DETAILED DESCRIPTION

Figure 1:
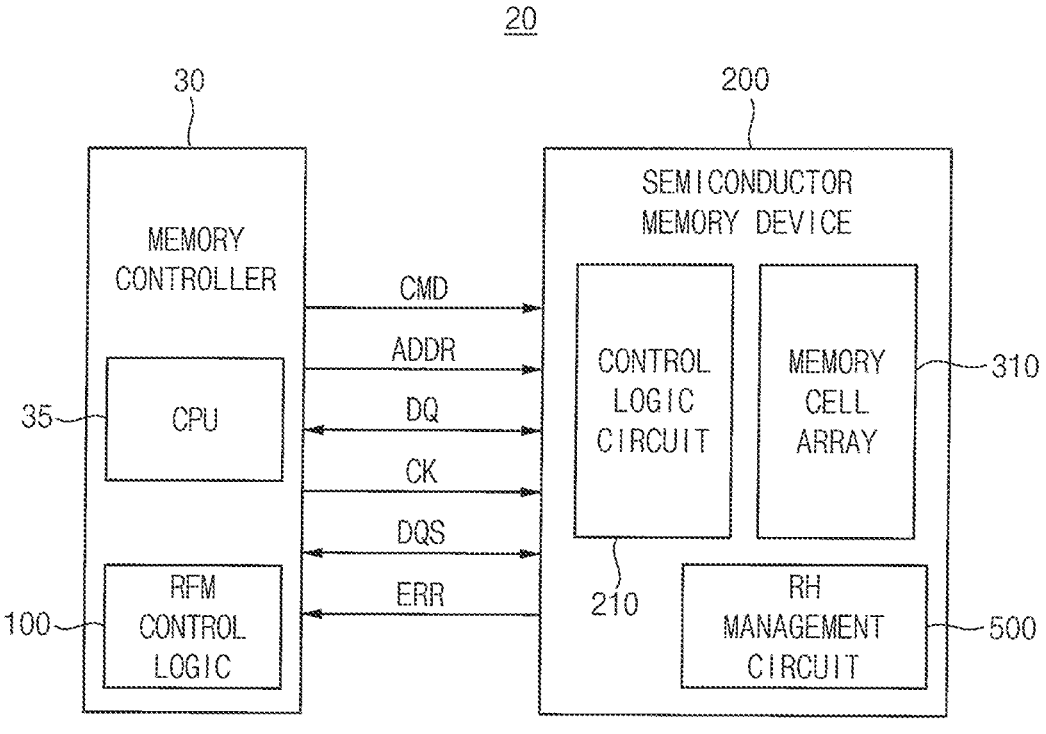
FIG. 1 is a block diagram illustrating a memory system according to example embodiments.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

FIG. 1 is a block diagram illustrating a memory system according to example embodiments.

Referring to FIG. 1, a memory system 20 may include a memory controller 30 and a semiconductor memory device 200.

The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as, for example, a dynamic random access memory (DRAM), double data rate 5 (DDR5) synchronous DRAM (SDRAM), a DDR6 SDRAM etc.

The memory controller 30 transmits a clock signal CK (also referred to as a command clock signal), a command CMD, and an address (signal) ADDR to the semiconductor memory device 200. Herein, for convenience of description, the terms of a clock signal CK, a command CMD, and an address ADDR and the terms of clock signals CK, commands CMD, and addresses ADDR may be used interchangeably. The memory controller 30 may transmit a data strobe signal DQS to the semiconductor memory device 200 when the memory controller 30 writes a data signal DQ in the semiconductor memory device 200. The semiconductor memory device 200 may transmit a data strobe signal DQS to the memory controller 30 when the memory controller 30 reads the data signal DQ from the semiconductor memory device 200. The address ADDR may be accompanied by the command CMD and the address ADDR and may also be referred to as an access address.

The memory controller 30 may include a refresh management (RFM) control logic 100 that generates an RFM command associated with a row hammer of the plurality of memory cell rows.

The semiconductor memory device 200 includes a memory cell array 310 that stores the data signal DQ, a control logic circuit 210 and a row hammer (RH) management circuit 500.

The control logic circuit 210 may control operations of the semiconductor memory device 200. The memory cell array 310 may include a plurality of memory cell rows and each of the memory cell rows may include a plurality of (volatile) memory cells.

The row hammer management circuit 500 may count the number of times of access associated with each of the plurality of memory cell rows in response to an active command from the memory controller 30 to store the counted values in count cells of each of the plurality of memory cell rows as count data. The row hammer management circuit 500 may store one or more candidate hammer addresses up to a first number based on first-in first-out (FIFO), which are intensively accessed, from among the plurality of memory cell rows, based on a comparison of the counted value with a first reference number of times (e.g., NTH1 shown in FIG. 5A), may transition a logic level of an error signal ERR provided to the memory controller 30 in response to a number of the candidate hammer addresses stored therein reaching a second number equal to or smaller than the first number, and may output one of the candidate hammer addresses stored therein as a hammer address, in response to the number of the candidate hammer addresses stored therein reaching the first number. Herein, the terms "intensively accessed" may mean that a particular memory cell row is accessed I same number as or more than the first reference number of times.

In response to a subsequent command such as an active count update command or a precharge command applied after the active command, the row hammer management circuit 500 may perform an internal read-update-write operation, to read the count data from a target memory cell row from among the plurality of memory cell rows, to update the read count data, and to write the updated count data in the target memory cell row.

The row hammer management circuit 500 may update the counted values stored in the count cells of the target memory cell row in response to the subsequent command. The active count update command may be a dedicated command for designating the internal read-update-write operation, which is applied to the semiconductor memory device 200 after a read command or a write command on the target memory cell row and before precharging the target memory cell row.

In example embodiments, the hammer management circuit 500 may perform the internal read-update-write operation before precharging the target memory cell row in response to either a read command including an auto precharge or a write command including an auto precharge which is selectively applied after the active command is applied.

The semiconductor memory device 200 performs a refresh operation periodically due to charge leakage of memory cells storing data. Due to scaling down of the manufacturing process of the semiconductor memory device 200, the storage capacitance of the memory cell is decreased and the refresh period is shortened. The refresh period is further shortened because the entire refresh time is increased as the memory capacity of the semiconductor memory device 200 is increased.

To compensate for degradation of adjacent memory cells due to the intensive access to a particular row or a hammer address, a target row refresh (TRR) scheme was adopted and an in-memory refresh scheme is developed to reduce the burden of the memory controller. In embodiments, the memory controller is completely responsible for the hammer refresh operation in the TRR scheme and the semiconductor memory device is completely responsible for the hammer refresh operation in the in-memory refresh scheme.

The demand for increased chip size overhead for the in-memory refresh may be high as the memory capacity is increased and demands for low power consumption of the semiconductor memory device are increased. In addition, the power consumption may be increased due to the semiconductor memory device implementing the hammer refresh operation even though there is no intensive access. In addition, a row hammer of some of memory cell rows selected from the plurality of the memory cell rows is managed.

In the memory system 20 according to example embodiments, while the row hammer management circuit 500 counts each of active numbers associated with the plurality of memory cell rows to store the counted values in the count cells of each of the plurality of memory cell rows as count data, and may manage the row hammer of all of the memory cell rows based on the counted values, the semiconductor memory device 200 may notify the memory controller 30 of a state of a hammer address which are included in the row hammer management circuit 500 and stores candidate hammer addresses using the error signal ERR.

Figure 2:
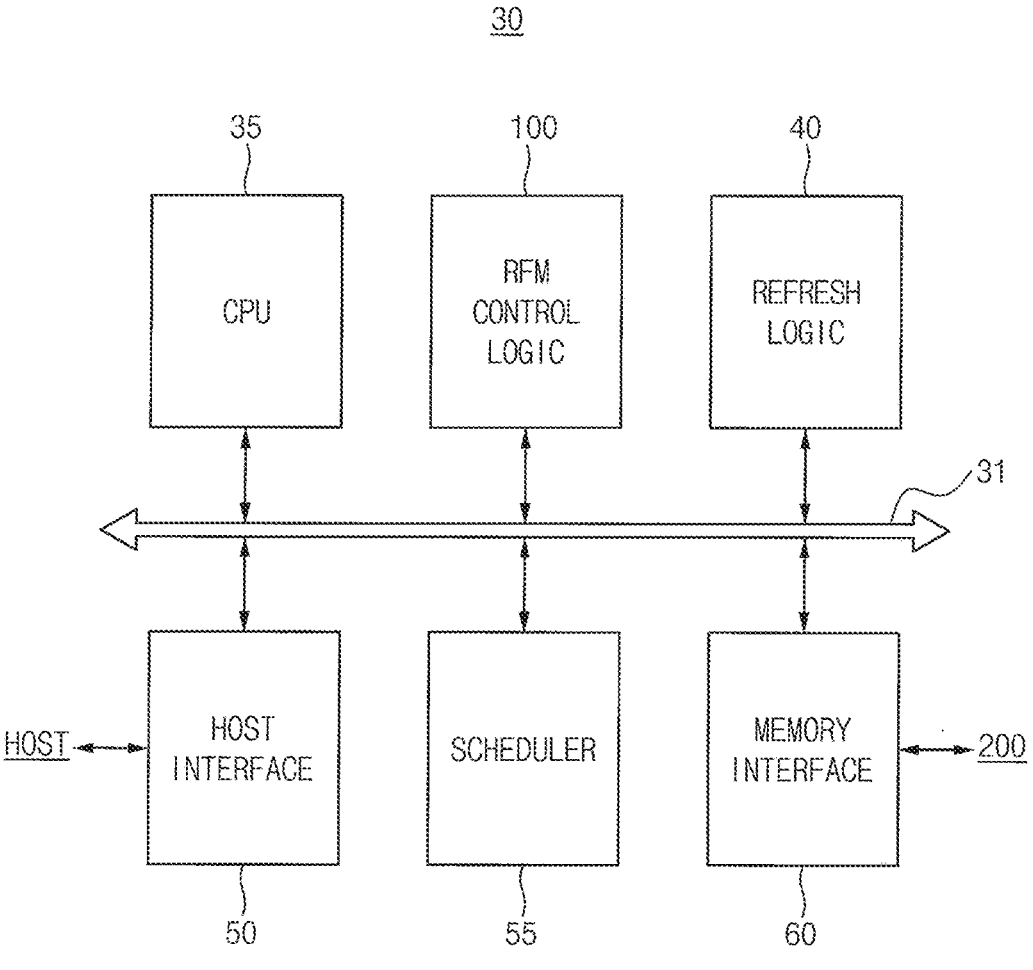
FIG. 2 is a block diagram illustrating the memory controller in FIG. 1 according to example embodiments.

FIG. 2 is a block diagram illustrating the memory controller in FIG. 1 according to example embodiments.

Referring to FIG. 2, the memory controller 30 may include a central processing unit (CPU) 35, the RFM control logic 100, a refresh logic 40, a host interface 50, a scheduler 55 and a memory interface 60, which are connected to each other through a bus 31.

The CPU 35 may control overall operation of the memory controller 30. The CPU 35 may control the RFM control logic 100, the refresh logic 40, the host interface 50, the scheduler 55 and the memory interface 60 through the bus 31.

The refresh logic 40 may generate auto refresh command for refreshing memory cells of the plurality of memory cell rows based on a refresh interval of the semiconductor memory device 200.

The host interface 50 may perform interfacing with a host.

The scheduler 55 may manage scheduling and transmission of sequences of commands generated in the memory controller 30. The scheduler 55 may transmit the active command and subsequent commands to the semiconductor memory device 200 via the memory interface 60, and the semiconductor memory device 200 may update the active count of each of the memory cell rows to manage the row hammer of all of the memory cell rows.

The memory interface 60 may perform interfacing with the semiconductor memory device 200.

Figure 3:
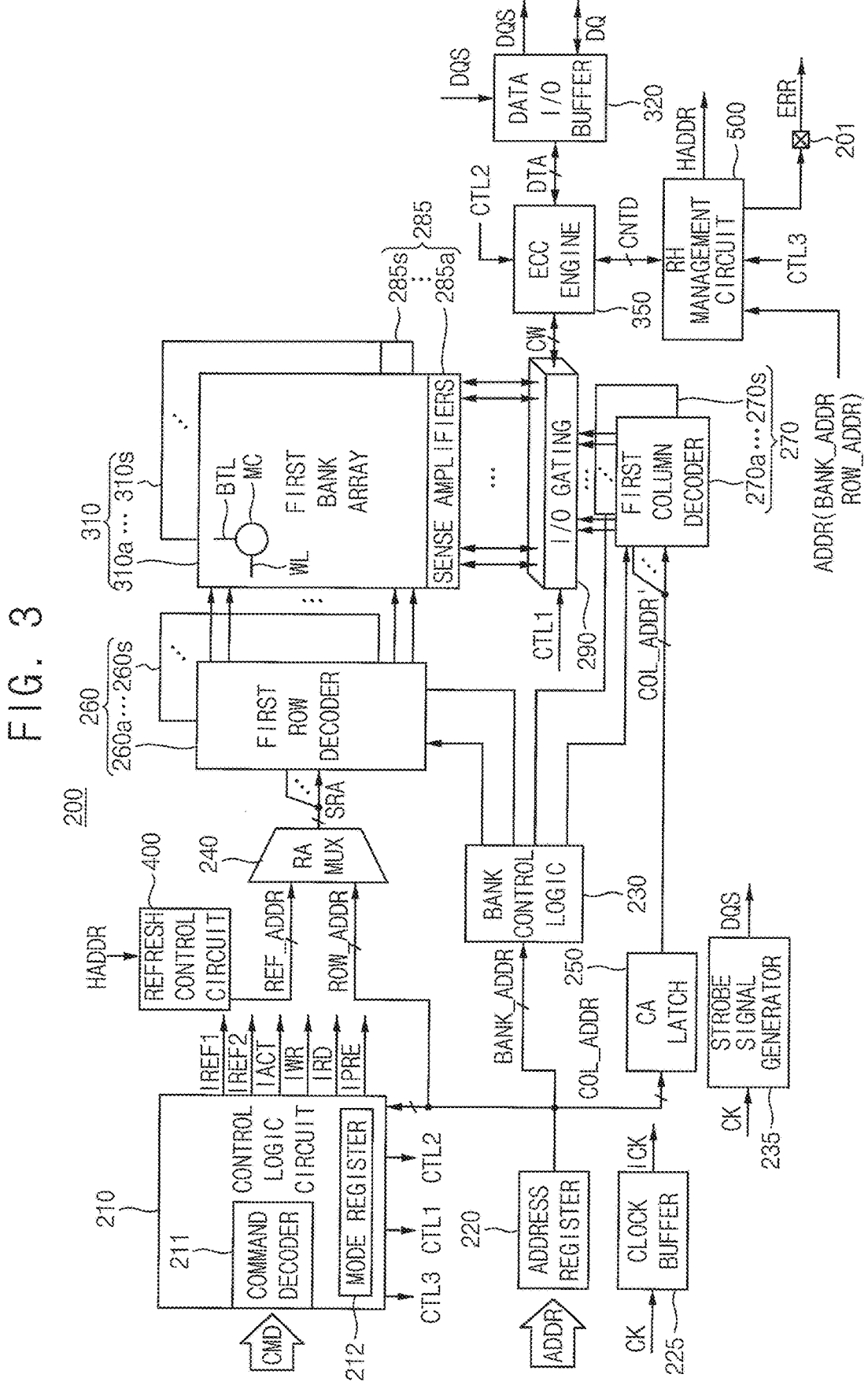
FIG. 3 is a block diagram illustrating an example of the semiconductor memory device in FIG. 1 according to example embodiments.

FIG. 3 is a block diagram illustrating an example of the semiconductor memory device in FIG. 1 according to example embodiments.

Referring to FIG. 3, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an I/O gating circuit 290, an error correction code (ECC) engine 350, a clock buffer 225, a strobe signal generator 235, the row hammer management circuit 500 and a data I/O buffer 320.

The memory cell array 310 may include first through sixteenth bank arrays 310a~310s. The row decoder 260 may include first through sixteenth row decoders 260a~260s respectively coupled to the first through sixteenth bank arrays 310a~310s. The column decoder 270 may include first through sixteenth column decoders 270a~270s respectively coupled to the first through sixteenth bank arrays 310a~310s. The sense amplifier unit 285 may include first through sixteenth sense amplifiers 285a~285s respectively coupled to the first through sixteenth bank arrays 310a~310s.

The first through sixteenth bank arrays 310a~310s, the first through sixteenth row decoders 260a~260s, the first through sixteenth column decoders 270a~270s and first through sixteenth sense amplifiers 285a~285s may form first through sixteenth banks. Each of the first through sixteenth bank arrays 310a~310s includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260a~260s corresponding to the bank address BANK_ADDR is activated in response to the bank control signals, and one of the first through sixteenth column decoders 270a~270s corresponding to the bank address BANK_ADDR is activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a~260s.

The refresh control circuit 400 may sequentially increase or decrease the refresh row address REF_ADDR in a normal refresh mode in response to first and second refresh control signals IREF1 and IREF2 from the control logic circuit 210. The refresh control circuit 400 may receive a hammer address HADDR in a hammer refresh mode, and may output one or more hammer refresh addresses designating one or more victim memory cell rows physically adjacent to a memory cell row corresponding to the hammer address as the refresh row address REF_ADDR.

The activated one of the first through sixteenth row decoders 260a~260s, by the bank control logic 230, may decode the row address SRA that is output from the row address multiplexer 240, and may activate a word-line corresponding to the row address SRA. For example, the activated bank row decoder applies a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column address COL_ADDR' that is an increment of the received column address COL_ADDR. The column address latch 250 may apply the temporarily stored or generated column address COL_ADDR' to the first through sixteenth column decoders 270a~270s.

The activated one of the first through sixteenth column decoders 270a~270s activates a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through sixteenth bank arrays 310a~310s, and write drivers for writing data to the first through sixteenth bank arrays 310a~310s.

A codeword CW (e.g., read codeword RCW in FIG. 16) read from a selected one bank array of the first through sixteenth bank arrays 310a~310s is sensed by a sense amplifier coupled to the selected one bank array from which the data is to be read, and is stored in the read data latches. The codeword CW stored in the read data latches may be provided to the data I/O buffer 320 as data DTA (e.g., corrected data C_DTA in FIG. 16) after ECC decoding is performed on the codeword CW by the ECC engine 350. The data I/O buffer 320 may convert the data DTA into the data signal DQ and may transmit the data signal DQ along with the data strobe signal DQS to the memory controller 30.

The data signal DQ to be written in a selected one bank array of the first through sixteenth bank arrays 310a~310s may be provided to the data I/O buffer 320 from the memory controller 30. The data I/O buffer 320 may convert the data signal DQ to the data DTA and may provide the data DTA to the ECC engine 350. The ECC engine 350 may perform ECC encoding on the data DTA to generate parity bits, and the ECC engine 350 may provide the codeword CW including the data DTA and the parity bits to the I/O gating circuit 290. The I/O gating circuit 290 may write the codeword CW in a sub-page in the selected one bank array through the write drivers.

The data I/O buffer 320 may provide the data signal DQ from the memory controller 30 to the ECC engine 350 by converting the data signal DQ to the data DTA in a write operation of the semiconductor memory device 200, and may convert the data DTA to the data signal DQ from the ECC engine 350 and may transmit the data signal DQ and the data strobe signal DQS to the memory controller 30 in a read operation of the semiconductor memory device 200.

The ECC engine 350 may perform ECC encoding on the data DTA and may perform an ECC decoding on the codeword CW based on a second control signal CTL2 from the control logic circuit 210. The ECC engine 350 may perform ECC encoding and ECC decoding on count data CNTD provided from the row hammer management circuit 500 based on the second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The strobe signal generator 235 may receive the clock signal CK, may generate the data strobe signal DQS based on the clock signal CK and may provide the data strobe signal DQS to the memory controller 30.

The row hammer management circuit 500 may count the number of times of access associated with each of the plurality of memory cell rows in response to an active command from the memory controller 30 to store the counted values in count cells of each of the plurality of memory cell rows as count data. The row hammer management circuit 500 may store one or more candidate hammer addresses up to a first number based on first-in first-out (FIFO), which are intensively accessed, from among the plurality of memory cell rows, based on a comparison of the counted value with the first reference number of times (e.g., NTH1 shown in FIG. 5A), may transition a logic level of the error signal ERR provided to the memory controller 30 through an error pin 201 in response to a number of the candidate hammer addresses stored therein reaching a second number equal to or smaller than the first number, and may provide one of the candidate hammer addresses stored therein as a hammer address HADDR to the refresh control circuit 400, in response to the number of the candidate hammer addresses stored therein reaching the first number.

The control logic circuit 210 may control operations of the semiconductor memory device 200. For example, the control logic circuit 210 may generate control signals for the semiconductor memory device 200 to perform a write operation, a read operation, a normal refresh operation and a hammer refresh operation. The control logic circuit 210 may include a command decoder 211 that decodes the command CMD received from the memory controller 30 and a mode register 212 that sets an operation mode of the semiconductor memory device 200.

Figure 4:
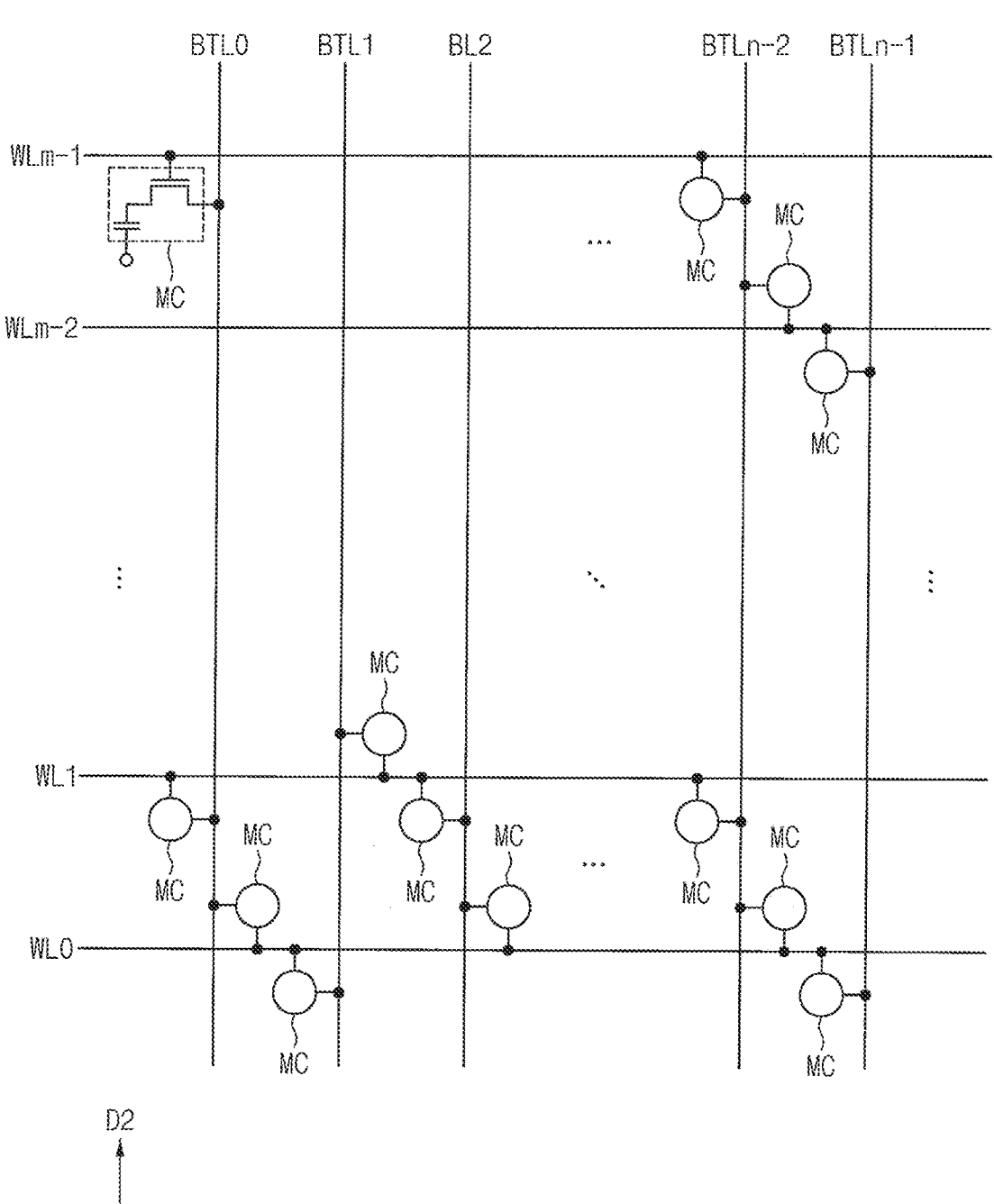
FIG. 4 illustrates an example of the first bank array in the semiconductor memory device of FIG. 3 according to example embodiments.

For example, the command decoder 211 may generate the control signals corresponding to the command CMD by decoding a write enable signal, a row address strobe signal, a column address strobe signal, a chip select signal, etc. The control logic circuit 210 may provide a first control signal CTL1 to the I/O gating circuit 290, the second control signal CTL2 to the ECC engine 350 and a third control signal CTL3 to the row hammer management circuit 500. In addition, the command decoder 211 may generate internal command signals including the first refresh control signal IREF1, the second refresh control signal IREF2, an active signal IACT, a precharge signal IPRE, a read signal IRD and a write signal IWR by decoding the command CMD. FIG. 4 illustrates an example of the first bank array in the semiconductor memory device of FIG. 3 according to example embodiments.

Referring to FIG. 4, the first bank array 310a includes a plurality of word-lines WL0~WLm−1 (m is a natural number greater than two), a plurality of bit-lines BTL0~BTLn−1 (n is a natural number greater than two), and a plurality of memory cells MCs disposed at intersections between the word-lines WL0~WLm−1 and the bit-lines BTL0~BTLn−1. Each of the memory cells p MCs includes a cell transistor coupled to each of the word-lines WL0~WLm−1 and each of the bit-lines BTL0~BTLn−1 and a cell capacitor coupled to the cell transistor. Each of the memory cells MCs may have a DRAM cell structure. Each of the word-lines WL0~WLm−1 extends in a first direction D1 and each of the bit-lines BTL1~BTLn−1 extends in a second direction D2 crossing the first direction D1.

The word-lines WL0~WLm−1 coupled to the plurality of memory cells MCs may be referred to as rows of the first bank array 310a and the bit-lines BTL0~BTLn−1 coupled to the plurality of memory cells MCs may be referred to as columns of the first bank array 310a.

Figure 5A:
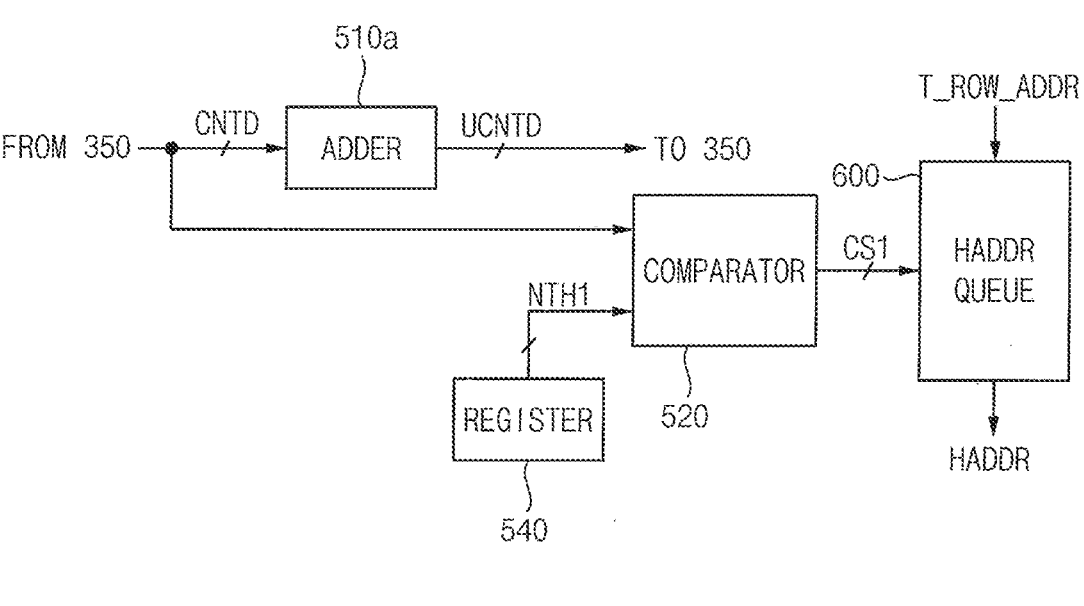
FIG. 5A is a block diagram illustrating an example of the row hammer management circuit in the semiconductor memory device of FIG. 3 according to example embodiments.
Figure 5A:
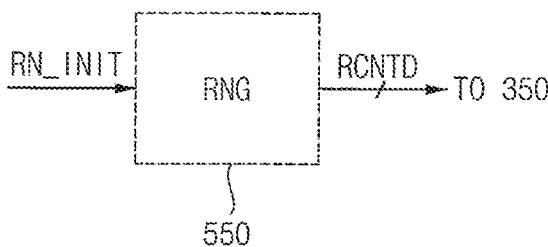

FIG. 5A is a block diagram illustrating an example of the row hammer management circuit in the semiconductor memory device of FIG. 3 according to example embodiments.

Referring to FIG. 5A, a row hammer management circuit 500a may include an adder 510a (which may also be referred to as an adder circuit), a comparator 520 (which may also be referred to as a comparator circuit), a register 540 and a hammer address queue 600. In example embodiments, the row hammer management circuit 500a may further include a random number generator RNG 550 (which may also be referred to as a random number generator circuit).

The adder 510a updates the read count data CNTD read from the count cells of the target memory cell row to provide an updated count data UCNTD by increasing the count data CNTD by one, which is read from the count cells of the target memory cell row, and on which an ECC decoding operation is performed on. The adder 510a may update the read count data CNTD. The adder 510a may be implemented with an up-counter.

The updated count data UCNTD is provided to the ECC engine 350 and the ECC engine 350 performs an ECC encoding operation on the updated count data UCNTD.

The register 540 may store a first reference number of times NTH1. The comparator 520 may compare the read count data CNTD with the first reference number of times NTH1 to output a first comparison signal CS1 indicating a result of the comparison.

The first reference number of times NTH1 may include a default reference number of times and multiples of the default reference number of times. Thus, the first comparison signal CS1 may include a plurality of bits.

The hammer address queue 600, in response to the first comparison signal CS1 indicating that the read count data CNTD is equal to or greater than the first reference number of times NTH1, may store a target access address T_ROW-_ADDR designating the target memory cell row as a candidate hammer address, and may provide the refresh control circuit 400 in FIG. 3 with one of candidate hammer addresses stored therein as the hammer address HADDR. The hammer address queue 600 may store the target access addresses T_ROW_ADDR whose number of times of access is equal to or greater than the first reference number of times NTH1 as the candidate hammer addresses, and may indicate a state of the hammer address queue 600 based on a number of the candidate hammer addresses stored therein.

The random number generator 550 may generate random count data RCNTD to be stored in the count cells of each of the plurality of memory cell rows based on a random initialization signal RN_INIT that is based on a random initialization command from the memory controller 30 during a power-up sequence of the semiconductor memory device 200, and may store the random count data RCNTD in the count cells in each of the memory cell rows through the ECC engine 350. The random initialization signal RN_INIT may be provided from the control logic circuit 210 in FIG. 3 and may be included in the third control circuit CTL3.

Figure 5B:
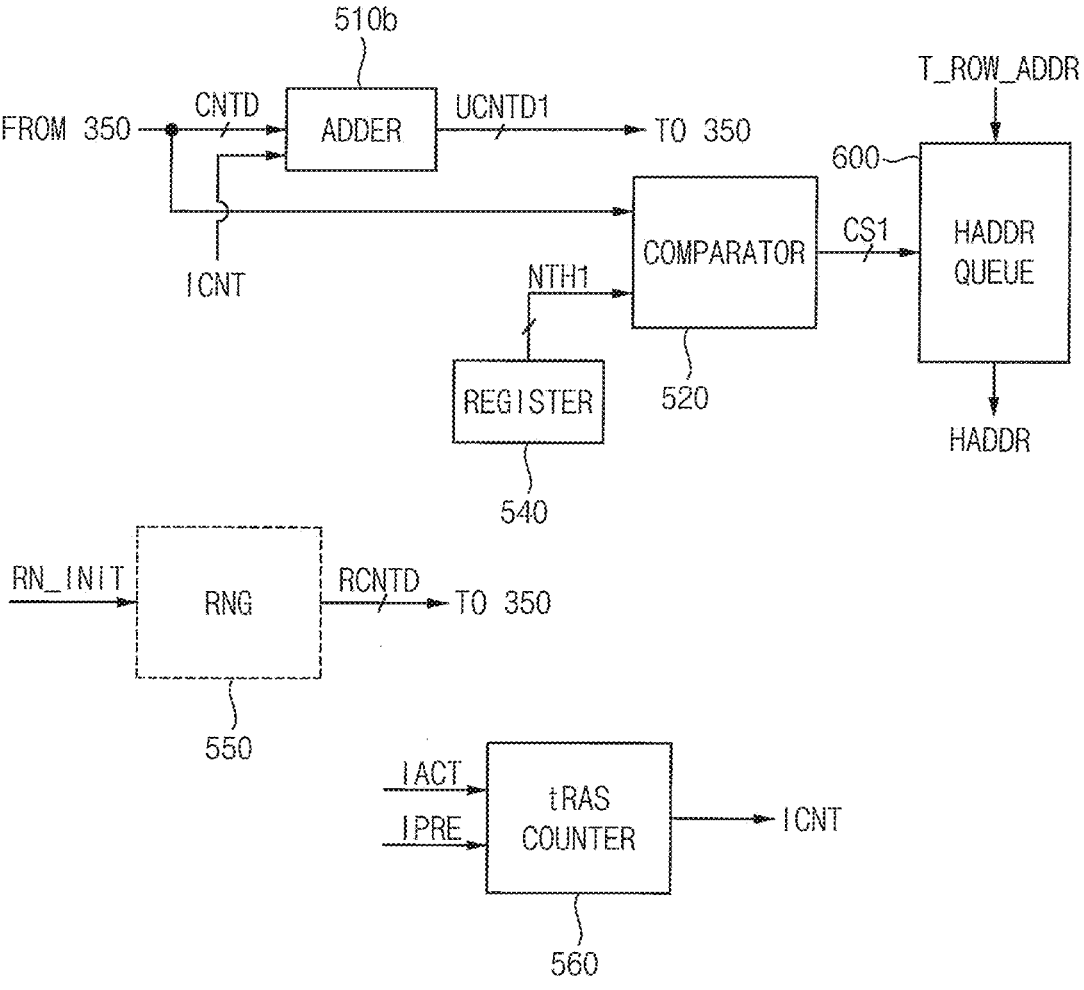
FIG. 5B is a block diagram illustrating an example of the row hammer management circuit in the semiconductor memory device of FIG. 3 according to example embodiments.

FIG. 5B is a block diagram illustrating an example of the row hammer management circuit in the semiconductor memory device of FIG. 3 according to example embodiments.

Referring to FIG. 5B, a row hammer management circuit 500b may include an adder 510b, a comparator 520, a register 540, a (tRAS) counter 560 (which may also be referred to as a counter circuit) and a hammer address queue 600. The row hammer management circuit 500b may further include a random number generator 550.

The row hammer management circuit 500b of FIG. 5B differs from the row hammer management circuit 500a of FIG. 5A in that the row hammer management circuit 500b further includes the counter 560, and differs in an operation of the adder 510b.

The counter 560 may generate an interval counting value ICNT by starting a counting operation in response to receiving the active signal IACT and ending the counting operation in response to receiving the precharge signal IPRE, and may provide the interval counting signal ICNT to the adder 510b. Therefore, the interval counting value ICNT may represent an activation time interval tRAS of the target memory cell row. That is, the counter 560 may count a timing interval between the active command and the precharge command on the target memory cell row because the active signal IACT is associated with the active command and the precharge signal IPRE is associated with the precharge command.

The adder 510b may read count data CNTD read from the count cells of the target memory cell row and the interval counting value ICNT to provide an updated count data UCNTD1. The count data CNTD is provided to the adder 510b after the count data CNTD is read from the count cells of the target memory cell row, and an ECC decoding operation is performed on the count data CNTD. Therefore, the updated count data UCNTD1 may reflect the activation time interval tRAS of the target memory cell row. The updated count data UCNTD1 is provided to the ECC engine 350 and the ECC engine 350 performs an ECC encoding operation on the updated count data UCNTD1.

Therefore, the row hammer management circuit 500b may determine the hammer address HADDR by reflecting the activation time interval tRAS of the target memory cell row, and may prevent a pass gate effect generated due to an enabled word-line (e.g., the target memory cell row).

Figure 6:
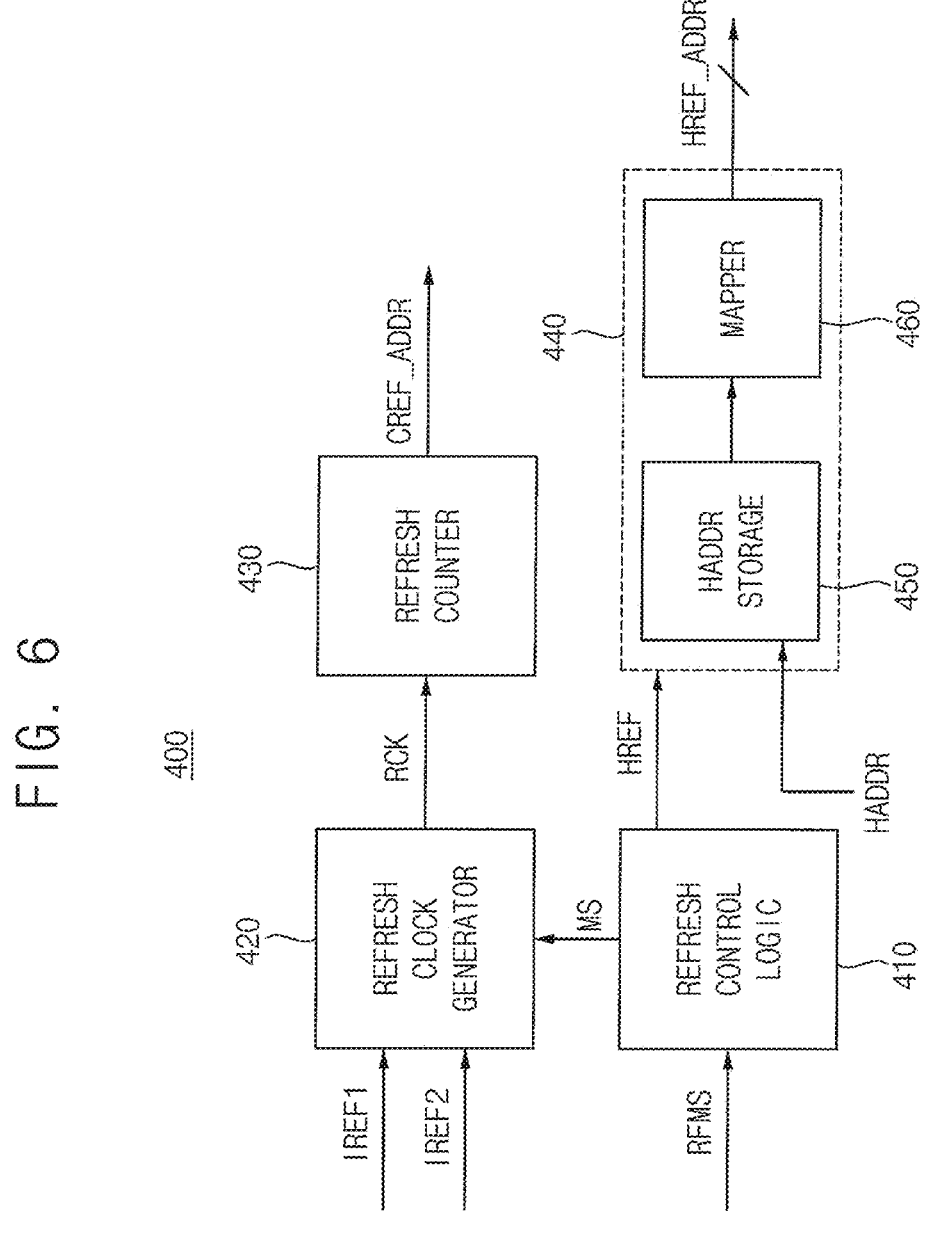
FIG. 6 is a block diagram illustrating an example of the refresh control circuit in FIG. 3 according to example embodiments.

FIG. 6 is a block diagram illustrating an example of the refresh control circuit in FIG. 3 according to example embodiments.

Referring to FIG. 6, the refresh control circuit 400 may include a refresh control logic 410, a refresh clock generator 420 (which may also be referred to as a refresh clock generator circuit), a refresh counter 430 (which may also be referred to as a refresh counter) and a hammer refresh address generator 440.

The refresh control logic 410 may provide a mode signal MS in response to a refresh management signal RFMS. In addition, the refresh control logic 410 may provide the hammer refresh address generator 440 with a hammer refresh signal HREF to control output timing of the hammer address in response to one of the first refresh control signal IREF1 and the second refresh control signal IREF2.

The control logic circuit 210 in FIG. 3 may provide the refresh control circuit 400 with the refresh management signal RFMS based on a refresh management command from the memory controller 30.

The refresh clock generator 420 may generate a refresh clock signal RCK indicating a timing of a normal refresh operation based on the first refresh control signal IREF1, the second refresh control signal IREF2 and the mode signal MS. The refresh clock generator 420 may generate the refresh clock signal RCK in response to receiving the first refresh control signal IREF1 or during a time when the second refresh control signal IREF2 is activated.

When the command CMD from the memory controller 30 corresponds to an auto refresh command, the control logic circuit 210 in FIG. 3 may apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh control signal IREF2 to the refresh control circuit 400, and the second refresh control signal IREF2 is activated from a time point when the control logic circuit 210 receives the self-refresh entry command to a time point when the control logic circuit 210 receives a self-refresh exit command.

The refresh counter 430 may generate a counter refresh address CREF_ADDR sequentially designating the memory cell rows by performing a counting operation at the period of the refresh clock signal RCK, and may provide the counter refresh address CREF_ADDR as the refresh row address REF_ADDR to the row address multiplexer 240 in FIG. 3.

The hammer refresh address generator 440 may include a hammer address storage 450 and a mapper 460 (which may also be referred to as a mapper circuit).

The hammer address storage 450 may store the hammer address HADDR and may output the hammer address HADDR to the mapper 460 in response to the hammer refresh signal HREF. The mapper 460 may generate hammer refresh addresses HREF_ADDR designating one or more victim memory cell rows physically adjacent to a memory cell row corresponding to the hammer address HADDR.

The hammer refresh address generator 440 may provide the hammer refresh address HREF_ADDR as the refresh row address REF_ADDR to the row address multiplexer 240 in FIG. 3.

Figure 7:
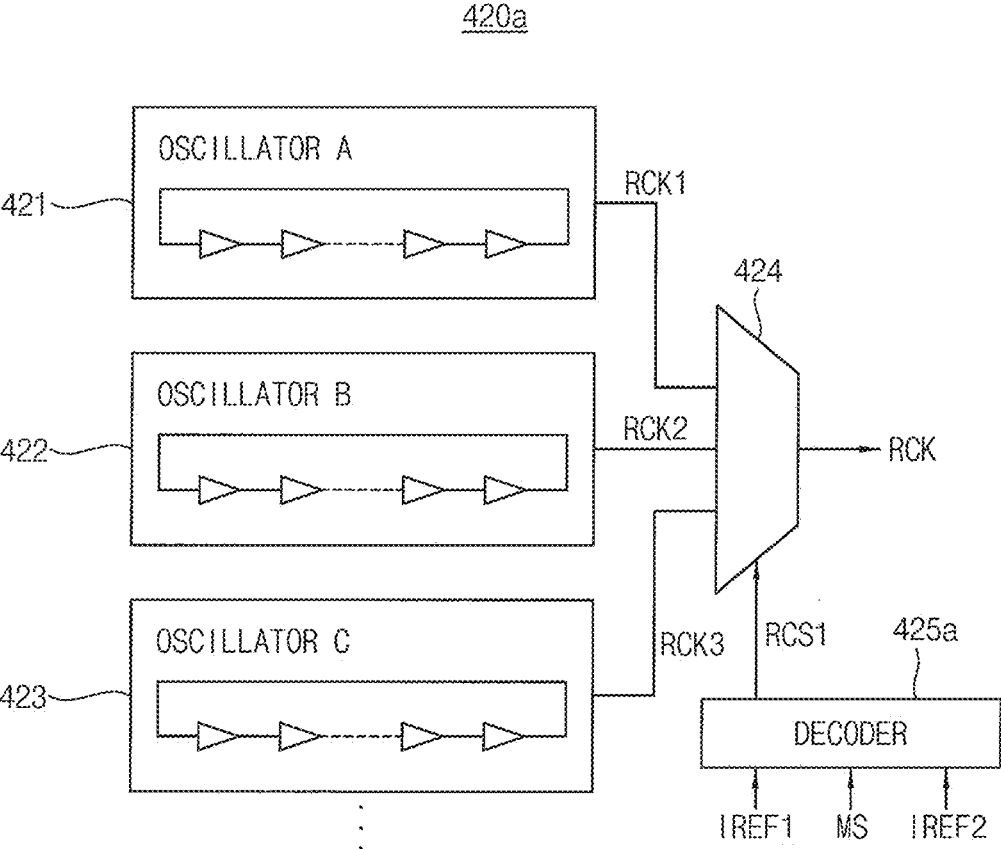
FIG. 7 is a circuit diagram illustrating an example of the refresh clock generator shown in FIG. 6 according to example embodiments.

FIG. 7 is a circuit diagram illustrating an example of the refresh clock generator shown in FIG. 6 according to example embodiments.

Referring to FIG. 7, a refresh clock generator 420a may include a plurality of oscillators 421, 422 and 423, a multiplexer 424 and a decoder 425a. The decoder 425a may decode the first refresh control signal IREF1, the second refresh control signal IREF2 and the mode signal MS to output a clock control signal RCS1. The oscillators 421, 422, and 423 generate refresh clock signals RCK1, RCK2 and RCK3 having different periods. The multiplexer 424 selects one of the refresh clock signals RCK1, RCK2 and RCK3 to provide the refresh clock signal RCK in response to the clock control signal RCS1.

Because the mode signal MS indicates that the row hammer event occurs, the refresh clock generator 420a may adjust a refresh cycle by selecting one of the refresh clock signals RCK1, RCK2 and RCK3.

Figure 8:
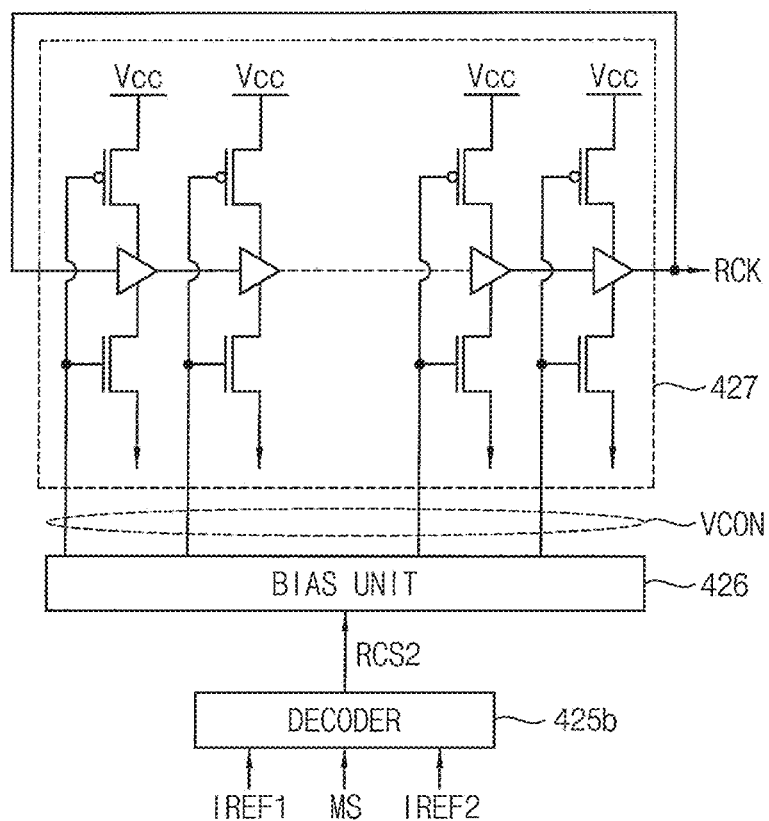
FIG. 8 is a circuit diagram illustrating an example of the refresh clock generator in FIG. 6 according to example embodiments.

FIG. 8 is a circuit diagram illustrating an example of the refresh clock generator in FIG. 6 according to example embodiments.

Referring to FIG. 8, a refresh clock generator 420b may include a decoder 425b, a bias unit 426 and an oscillator 427.

The decoder 425b may decode the first refresh control signal IREF1, the second refresh control signal IREF2 and the mode signal MS to output a clock control signal RCS2. The bias unit 426 generates a control voltage VCON in response to the clock control signal RCS2. The oscillator 427 generates the refresh clock signal RCK having a variable period, according to the control voltage VCON.

Because the mode signal MS indicates that the row hammer event occurs, the refresh clock generator 420b may adjust a refresh cycle by varying a period of the refresh clock signal RCK based on the clock control signal RCS2.

Figure 9:
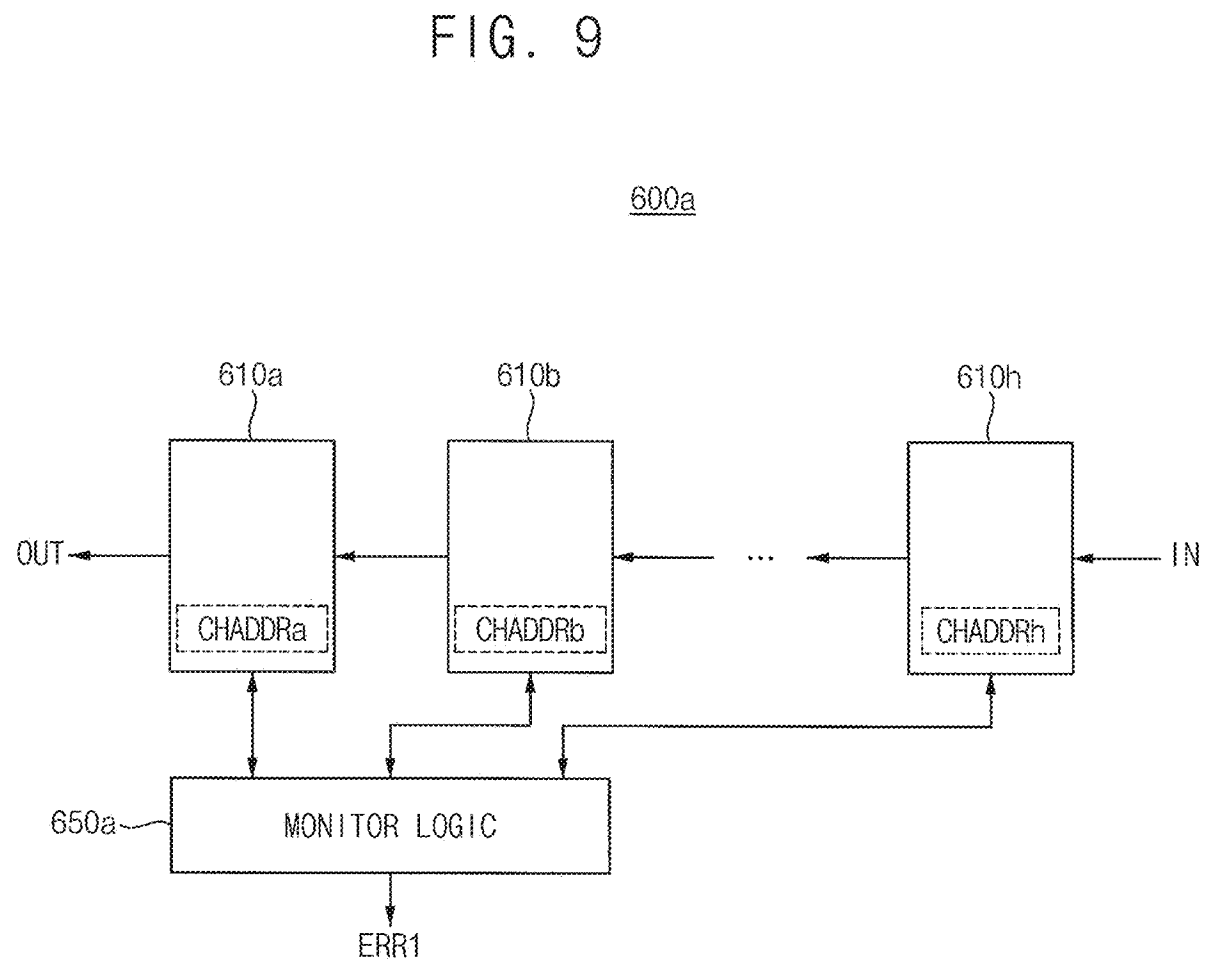

FIG. 9 illustrates an example of a hammer address queue in the row hammer management circuit of FIG. 5A or FIG. 5B according to example embodiments.

Referring to FIG. 9, a hammer address queue 600a may include a plurality of FIFO registers 610a, 610b, . . . , 610h and a monitor logic 650a (which may also be referred to as a monitor logic circuit). A number of the plurality of FIFO registers 610a, 610b, . . . , 610h may correspond to a first number.

The plurality of FIFO registers 610a, 610b, . . . , 610h may store a plurality of candidate hammer addresses CHADDRa, CHADDRb, . . . , CHADDRh up to the first number based on the FIFO scheme from an input terminal IN to an output terminal OUT.

The monitor logic 650a may be connected to the plurality of FIFO registers 610a, 610b, 610h, may manage the plurality of FIFO registers 610a, 610b, . . . , 610h and may monitor whether each of the plurality of FIFO registers 610a, 610b, . . . , 610h stores a candidate hammer address. In response to the number of the candidate hammer addresses stored in the plurality of FIFO registers FIFO registers 610a, 610b, . . . , 610h reaching the first number (that is, in response to the plurality of FIFO registers FIFO registers being full), the monitor logic 650a may output a candidate hammer address that is input first from among all of the candidate hammer addresses as the hammer address HADDR, and may notify the memory controller 30 of a state of the hammer address queue 600a by transitioning a logic level of an error signal ERR1 from a first logic level to a second logic level different from the first logic level in response to outputting the hammer address HADDR.

In response to a transition of the error signal ERR1, the memory controller 30 of FIG. 2 applies a refresh management command to the semiconductor memory device 200, and the monitor logic 650a may transition the error signal ERR1 to the first logic level in response to the hammer refresh operation based on the hammer address HADDR being completed. That is, the monitor logic 650a may transition the error signal ERR1 to the first logic level in response to the hammer refresh operation after a predetermined time interval elapses from a time point at which the monitor logic 650a outputs the hammer address HADDR.

Figure 10:
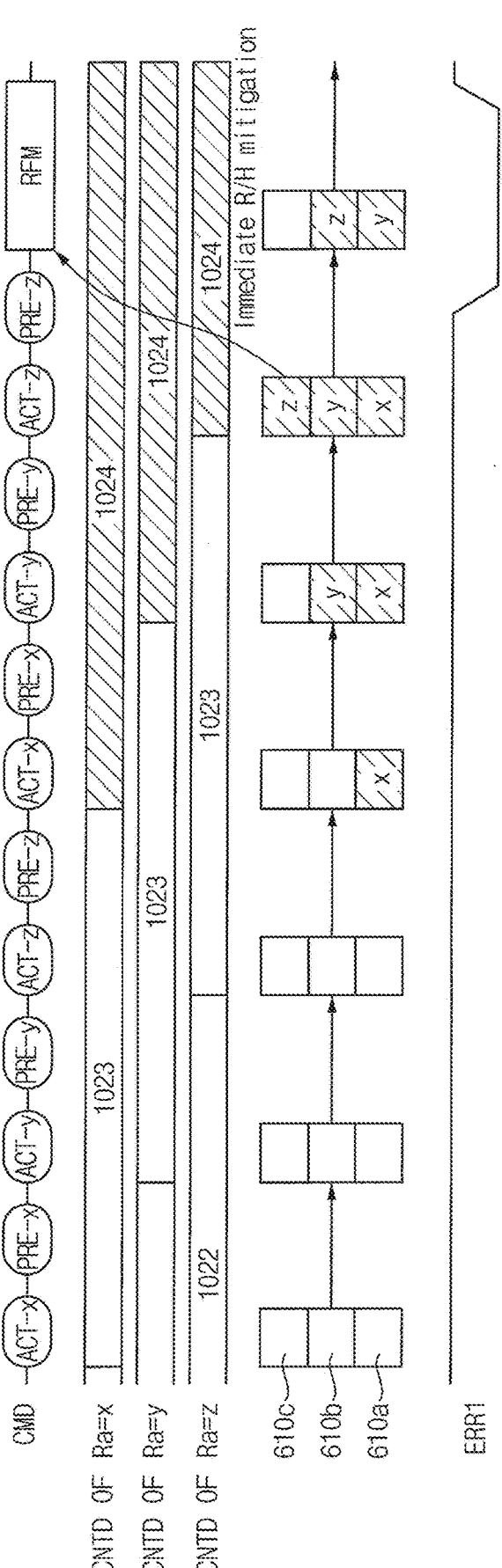
FIG. 10 is a timing diagram illustrating an example operation of the hammer address queue of FIG. 9 according to example embodiments.

FIG. 10 is a timing diagram illustrating an example operation of the hammer address queue of FIG. 9 according to example embodiments.

In FIG. 10, it is assumed that the plurality of FIFO registers 610a, 610b, . . . , 610h in FIG. 9 include three FIFO registers 610a, 610b and 610c, and accesses memory cell rows designated by a row address RA=x, a row address RA=y and a row address RA=z, which are repeated. In addition, it is assumed that the first reference number of times NTH1 corresponds to 1024.

In FIG. 10, ACT-x denotes an active command accompanying the row address RA=x, PRE-x denotes a precharge command on a memory cell row designated by the row address RA=x, ACT-y denotes an active command accompanying the row address RA=y PRE-y denotes a precharge command on a memory cell row designated by the row address RA=y, ACT-z denotes an active command accompanying the row address RA=z, and PRE-z denotes a precharge command on a memory cell row designated by the row address RA=z.

Referring to FIGS. 9 and 10, in response to the counted value (e.g., the count data CNTD) associated with the memory cell row designated by the row address RA=x reaching 1024, the row address RA=x is stored in the FIFO register 610a as a candidate hammer address. In response to the counted value (e.g., the count data CNTD) associated with the memory cell row designated by the row address RA=y reaching 1024, the row address RA=y is stored in the FIFO register 610b as a candidate hammer address. In response to the counted value (e.g., the count data CNTD) associated with the memory cell row designated by the row address RA=z reaching 1024, the row address RA=z is stored in the FIFO register 610a as a candidate hammer address.

Because all of the FIFO registers 610*a*, 610*b* and 610*c* store candidate hammer addresses, the monitor logic 650*a* notifies the memory controller 30 of the hammer address queue 600*a* being full (that is, there being no available space in the hammer address queue 600*a*) by transitioning the error signal ERR1 to the second logic level. The memory controller 30, in response to the transition of the error signal ERR1, may withhold application of the active command to the semiconductor memory device 200 and may apply a refresh management RFM command to the semiconductor memory device 200. The monitor logic 650*a* may transition the error signal ERR1 from the first logic level (e.g., a logic high level) to the second logic level (e.g., a logic low level) in response to the row address RA=x stored in the FIFO register 610*a* being output as the hammer address.

The refresh control circuit 400 in FIG. 6 may perform a hammer refresh operation on one or more victim memory cell rows which are physically adjacent to a memory cell row corresponding to the hammer address, and the monitor logic 650*a* may transition the error signal ERR1 to the first logic level after the hammer refresh operation is completed. The hammer refresh operation is represented by Immediate R/H mitigation in FIG. 10.

Figure 11:
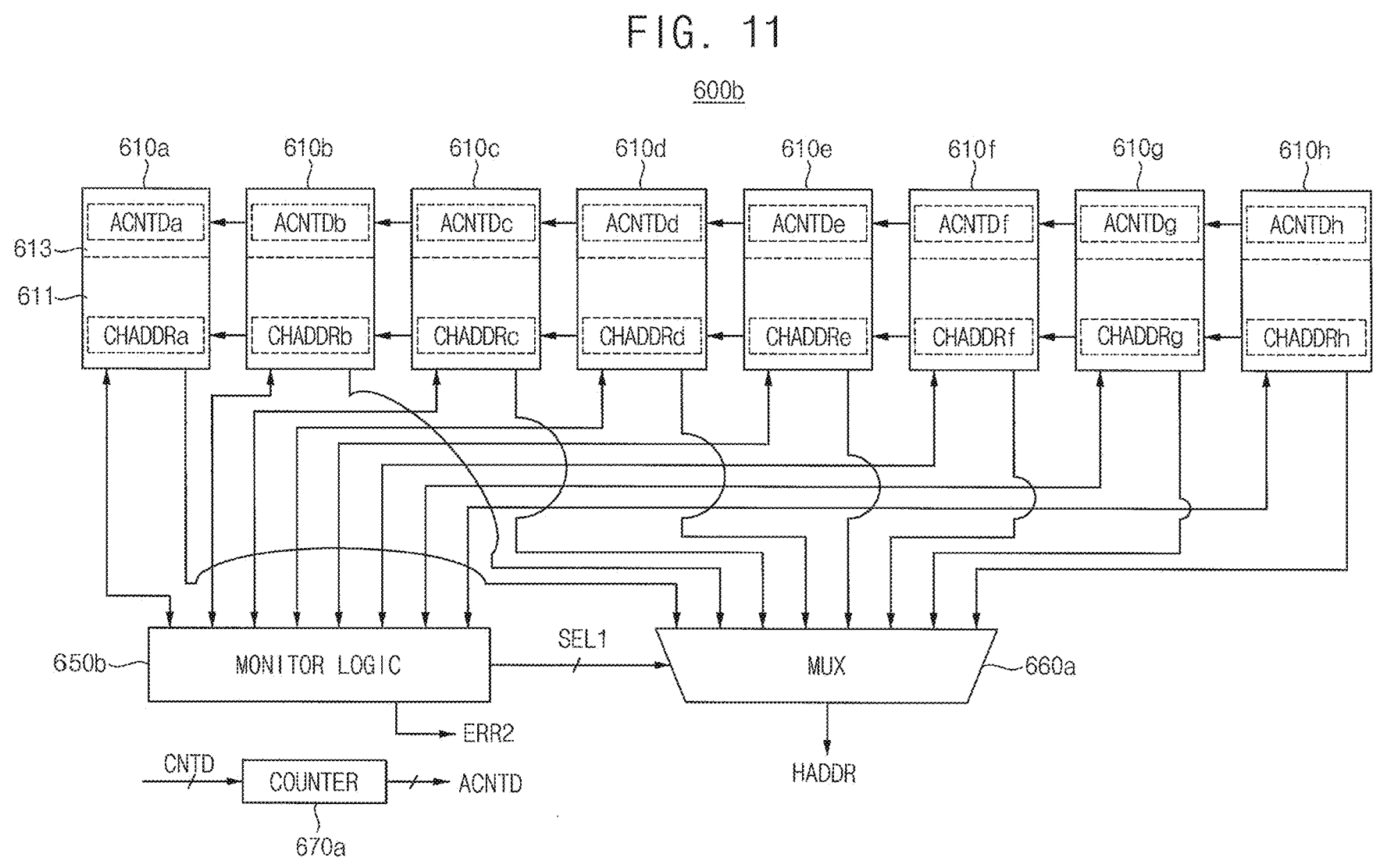

FIG. 11 illustrates an example of a hammer address queue in the row hammer management circuit of FIG. 5A or FIG. 5B according to example embodiments.

Referring to FIG. 11, a hammer address queue 600*b* may include a plurality of FIFO registers 610*a*, 610*b*, 610*c*, 610*d*, 610*c*, 610*f*, 610*g* and 610*h*, a monitor logic 650*b*, a multiplexer 660*a* and a counter 670*a*. A number of the plurality of FIFO registers 610*a*, 610*b*, 610*c*, 610*d*, 610*c*, 610*f*, 610*g* and 610*h* may correspond to a first number.

Each of the plurality of FIFO registers 610*a*, 610*b*, 610*c*, 610*d*, 610*c*, 610*f*, 610*g* and 610*h* may store a respective one of a plurality of candidate hammer addresses CHADDRa, CHADDRb, CHADDRc, CHADDRd, CHADDRe, CHADDRf, CHADDRg and CHADDRh up to the first number, each of whose number of times of access is equal to or greater than the first reference number of times NTH1. Each of the plurality of FIFO registers 610*a*, 610*b*, 610*c*, 610*d*, 610*c*, 610*f*, 610*g* and 610*h* may also store a respective one of additional number of times of access associated with each of the candidate hammer addresses CHADDRa, CHADDRb, CHADDRc, CHADDRd, CHADDRe, CHADDRf, CHADDRg and CHADDRh after the candidate hammer addresses CHADDRa, CHADDRb, CHADDRc, CHADDRd, CHADDRe, CHADDRf, CHADDRg and CHADDRh are stored in the plurality of FIFO registers 610*a*, 610*b*, 610*c*, 610*d*, 610*c*, 610*f*, 610*g* and 610*h* as a respective one of additional count data ACNTDa, ACNTDb, ACNTDc, ACNTDd, ACNTDe, ACNTDf, ACNTDg and ACNTDh, based on the FIFO scheme.

The monitor logic 650*b* may be connected to the plurality of FIFO registers 610*a*, 610*b*, 610*c*, 610*d*, 610*c*, 610*f*, 610*g* and 610*h*, may manage the plurality of FIFO registers 610*a*, 610*b*, 610*c*, 610*d*, 610*c*, 610*f*, 610*g* and 610*h* and may monitor whether each of the plurality of FIFO registers 610*a*, 610*b*, 610*c*, 610*d*, 610*e*, 610*f*, 610*g* and 610*h* stores a candidate hammer address. In response to the number of the candidate hammer addresses stored in the plurality of FIFO registers 610*a*, 610*b*, 610*c*, 610*d*, 610*c*, 610*f*, 610*g* and 610*h* reaching a second number smaller than the first number (that is, in response to the plurality of FIFO registers being full), the monitor logic 650*b* may notify the memory controller 30 of a state of the hammer address queue 600*b* by transitioning a logic level of an error signal ERR2 from a first logic level to a second logic level different from the first logic level, and may generate a selection signal SEL1 based on the additional count data ACNTDa, ACNTDb, ACNTDc, ACNTDd, ACNTDe, ACNTDf, ACNTDg and ACNTDh.

The multiplexer 660*a* may receive the candidate hammer addresses CHADDRa, CHADDRb, CHADDRc, CHADDRd, CHADDRe, CHADDRf, CHADDRg and CHADDRh and may output a candidate hammer address whose additional count data is greatest from among the candidate hammer addresses CHADDRa, CHADDRb, CHADDRc, CHADDRd, CHADDRe, CHADDRf, CHADDRg and CHADDRh as the hammer address HADDR based on the selection signal SEL1.

The memory controller 30, in response to the transition of the error signal ERR1, may withhold application of the active command to the semiconductor memory device 200 and may apply a refresh management RFM command to the semiconductor memory device 200. The monitor logic 650*b* may transition the error signal ERR2 from the first logic level (e.g., a logic high level) to the second logic level (e.g., a logic low level) in response to the hammer address HADDR being output from one of the plurality of FIFO registers 610*a*, 610*b*, 610*c*, 610*d*, 610*e*, 610*f*, 610*g* and 610*h*.

The counter 670*a* may count the count data CNTD associated with each of the candidate hammer addresses CHADDRa, CHADDRb, CHADDRc, CHADDRd, CHADDRe, CHADDRf, CHADDRg and CHADDRh after each of the candidate hammer addresses CHADDRa, CHADDRb, CHADDRc, CHADDRd, CHADDRe, CHADDRf, CHADDRg and CHADDRh is stored in a respective one of the plurality of FIFO registers 610*a*, 610*b*, 610*c*, 610*d*, 610*e*, 610*f*, 610*g* and 610*h* to generate the additional count data ACNTD, and may store the additional count data ACNTD in a corresponding FIFO register.

Each of the plurality of FIFO registers 610*a*, 610*b*, 610*c*, 610*d*, 610*e*, 610*f*, 610*g* and 610*h* may include a first region 611 to store a candidate hammer address such as the candidate hammer address CHADDRa and a second region 613 to store additional count data such as the additional count data ACNTDa.

When the hammer address queue 600*b* is employed by the row hammer management circuit 500, the row hammer management circuit 500 may store the active command which the memory controller 30 issues during a turn-around time in which the memory controller 30 identifies the transition of the error signal ERR2, and the refresh control circuit 400 may perform the hammer refresh operation on one or more victim memory cell rows which is physically adjacent to a memory cell row corresponding to a candidate hammer address that is lastly stored in the hammer address queue 600*b*.

Figure 12A:
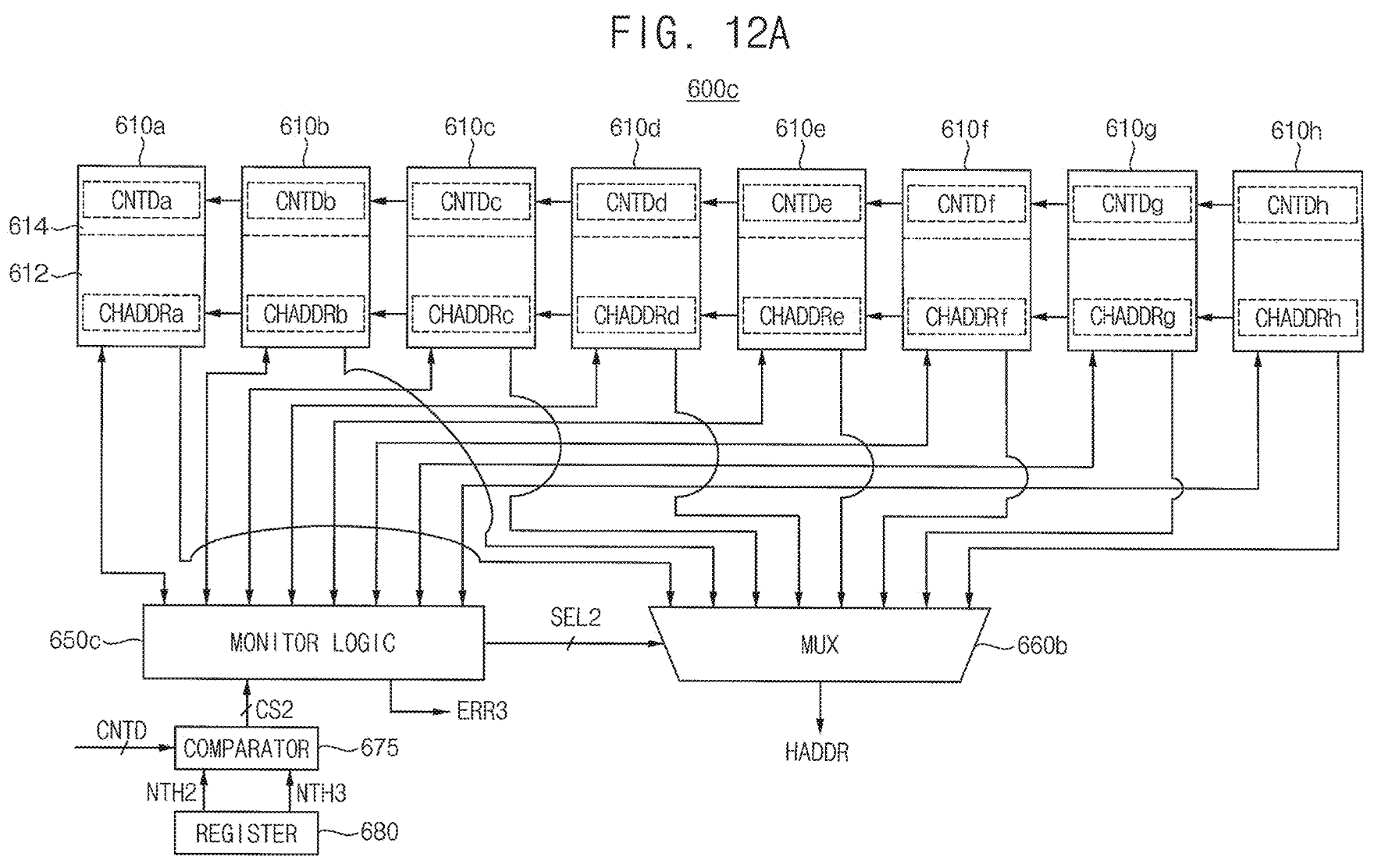

FIG. 12A illustrates an example of a hammer address queue in the row hammer management circuit of FIG. 5A or FIG. 5B according to example embodiments.

Referring to FIG. 12A, a hammer address queue 600*b* may include a plurality of FIFO registers 610*a*, 610*b*, 610*c*, 610*d*, 610*c*, 610*f*, 610*g* and 610*h*, a monitor logic 650*c*, a multiplexer 660*b*, a comparator 675 and a register 680. A number of the plurality of FIFO registers 610*a*, 610*b*, 610*c*, 610*d*, 610*e*, 610*f*, 610*g* and 610*h* may correspond to a first number.

Each of the plurality of FIFO registers 610*a*, 610*b*, 610*c*, 610*d*, 610*c*, 610*f*, 610*g* and 610*h* may store a respective one of a plurality of candidate hammer addresses CHADDRa, CHADDRb, CHADDRc, CHADDRd, CHADDRe, CHADDRf, CHADDRg and CHADDRh, each of whose number of times of access is equal to or greater than the first reference number of times NTH1. Each of the plurality of FIFO registers 610a, 610b, 610c, 610d, 610c, 610f, 610g and 610h may also store a respective one of additional number of times access associated with each of the candidate hammer addresses CHADDRa, CHADDRb, CHADDRc, CHADDRd, CHADDRe, CHADDRf, CHADDRg and CHADDRh after the candidate hammer addresses CHADDRa, CHADDRb, CHADDRc, CHADDRd, CHAD-DRe, CHADDRf, CHADDRg and CHADDRh are stored in the plurality of FIFO registers 610a, 610b, 610c, 610d, 610e, 610f, 610g and 610h as a respective one of count data CNTDa, CNTDb, CNTDc, CNTDd, CNTDe, CNTDf, CNTDg and CNTDh, based on the FIFO scheme.

The monitor logic 650c may be connected to the plurality of FIFO registers 610a, 610b, 610c, 610d, 610c, 610f, 610g and 610h, may manage the plurality of FIFO registers 610a, 610b, 610c, 610d, 610c, 610f, 610g and 610h and may monitor whether each of the plurality of FIFO registers 610a, 610b, 610c, 610d, 610c, 610f, 610g and 610h stores a candidate hammer address.

The register 680 may store a second reference number of times NTH2 greater than the first reference number of times NTH1, and a third reference number of times NTH3 greater than the second reference number of times NTH2. The register 680 may provide the second reference number of times NTH2 and the third reference number of times NTH3 to the comparator 675.

The comparator 675 may compare each of the count data CNTDa, CNTDb, CNTDc, CNTDd, CNTDe, CNTDf, CNTDg and CNTDh stored in each of the plurality of FIFO registers 610a, 610b, 610c, 610d, 610c, 610f, 610g and 610h as the count data CNTD with the second reference number of times NTH2 and the third reference number of times NTH3 to generate (e.g., output) a second comparison signal CS2, and may provide the second comparison signal CS2 to the monitor logic 650c. The second comparison signal CS2 may include a plurality of bits and may indicate whether the count data CNTD is larger or smaller with respect to the second reference number of times NTH2 and the third reference number of times NTH3.

The monitor logic 650c may generate a selection signal SEL2 associated with selecting a first candidate hammer address corresponding to the count data exceeding the second reference number of times NTH2, from among the candidate hammer addresses CHADDRa, CHADDRb, CHADDRc, CHADDRd, CHADDRe, CHADDRf, CHADDRg and CHADDRh, based on the second comparison signal CS2, and may provide the selection signal SEL2 to the multiplexer 660b. The monitor logic 650c may generate the selection signal SEL2 associated with selecting a second candidate hammer address corresponding to the count data exceeding the third reference number of times NTH3, from among the candidate hammer addresses CHADDRa, CHADDRb, CHADDRc, CHADDRd, CHAD-DRe, CHADDRf, CHADDRg and CHADDRh, based on the second comparison signal CS2, may provide the selection signal SEL2 to the multiplexer 660b and may transition a logic level of an error signal ERR3 from the first logic level to the second logic level.

The multiplexer 660b may receive the candidate hammer addresses CHADDRa, CHADDRb, CHADDRc, CHADDRd, CHADDRe, CHADDRf, CHADDRg and CHADDRh and may output the first candidate hammer address corresponding to the count data exceeding the second reference number of times NTH2 as the hammer address HADDR, or may output the second candidate hammer address corresponding to the count data exceeding the third reference number of times NTH3 as the hammer address HADDR, based on the selection signal SEL2.

When the hammer address queue 600c outputs the first candidate hammer address as the hammer address HADDR, the refresh control circuit 400 in FIG. 3 may perform the hammer refresh operation on two victim memory cell rows which are physically adjacent to a first memory cell row corresponding to the first candidate hammer address at normal refresh timings on the plurality of memory cell rows.

When the hammer address queue 600c outputs the second candidate hammer address as the hammer address HADDR, the memory controller 30, in response to the transition of the error signal ERR3, may withhold application of the active command to the semiconductor memory device 200 and may apply a refresh management RFM command to the semiconductor memory device 200. The refresh control circuit 400 in FIG. 3 may perform the hammer refresh operation on four victim memory cell rows which are physically adjacent to a second memory cell row corresponding to the second candidate hammer in response to the refresh management signal RFMS.

Each of the plurality of FIFO registers 610a, 610b, 610c, 610d, 610e, 610f, 610g and 610h may include a first region 612 to store a candidate hammer address such as the candidate hammer address CHADDRa, and a second region 614 to store a count data such as the additional count data CNTDa.

Figure 12B:
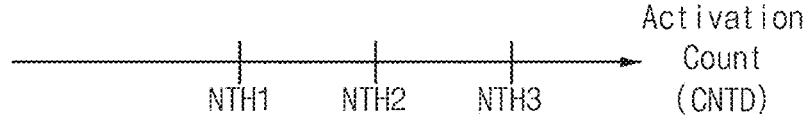
FIG. 12B illustrates an example operation of the hammer address queue of FIG. 12A according to example embodiments.

FIG. 12B illustrates an example operation of the hammer address queue of FIG. 12A according to example embodiments.

Referring to FIGS. 5A, 12A and 12B, when the count data CNTD (e.g., an activation count) of a specific memory cell row is equal to or greater than the first reference number of times NTH1, the row hammer management circuit 500a stores a row address of the specific memory cell row in the hammer address queue 600c as a candidate hammer address. When the count data CNTD of the specific memory cell row is equal to or greater than the second reference number of times NTH2 after the row address of the specific memory cell row being stored in the hammer address queue 600c, the monitor logic 650c generates the selection signal SEL2 for selecting the row address of the specific memory cell row with a priority from among the candidate hammer addresses stored in the plurality of FIFO registers 610a, 610b, 610c, 610d, 610e, 610f, 610g and 610h. The refresh control circuit 400 in FIG. 3 may perform the hammer refresh operation on victim memory cell rows which are physically adjacent to the specific memory cell row having priority at normal refresh timings on the plurality of memory cell rows.

When the row address of the specific memory cell row is still stored in one of the plurality of FIFO registers 610a, 610b, 610c, 610d, 610e, 610f, 610g and 610h and the count data CNTD of the specific memory cell row is equal to or greater than the third reference number of times NTH3, the monitor logic 650c transitions a logic level of the error signal ERR3 from the first logic level to the second logic level and generates the selection signal SEL2 for selecting the row address of the specific memory cell row. The memory controller 30, in response to the transition of the error signal ERR3, may withhold application of the active command to the semiconductor memory device 200 and may apply the refresh management RFM command to the semiconductor memory device 200. The refresh control circuit 400 in FIG. 3 may perform the hammer refresh operation on victim memory cell rows which are physically adjacent to the specific memory cell row in response to the refresh management signal RFMS.

In FIGS. 5A, 5B and 9 through 12B, it is described that the row hammer management circuit 500 includes one hammer address queue 600. However, embodiments are not limited thereto. For example, in example embodiments, the row hammer management circuit 500 may include a plurality of hammer address queues corresponding to a number of the first through sixteenth bank arrays 310a~310s in FIG. 3, and each of the plurality of hammer address queues may be associated with a respective one of the first through sixteenth bank arrays 310a~310s. When one of the plurality of hammer address queues is full of the candidate hammer addresses, the one hammer address queue transitions a logic level of a corresponding error signal to a second logic level, and the memory controller 30 may apply a refresh management command to a bank array corresponding to the one hammer address queue in response to transition of the corresponding error signal while the memory controller 30 performs a normal operation on other bank arrays. That is, the error signals from the plurality of hammer address queues may be merged, and the merged error signal is provided to the memory controller 30.

In addition, instead of using the error signal ERR, the plurality of hammer address queues may write a bank address of the corresponding bank in the mode register 212 in FIG. 3, and the memory controller 30 may apply a refresh management command to the corresponding bank array by reading the mode register 212 while the memory controller 30 performs a normal operation on other bank arrays.

Figure 13:
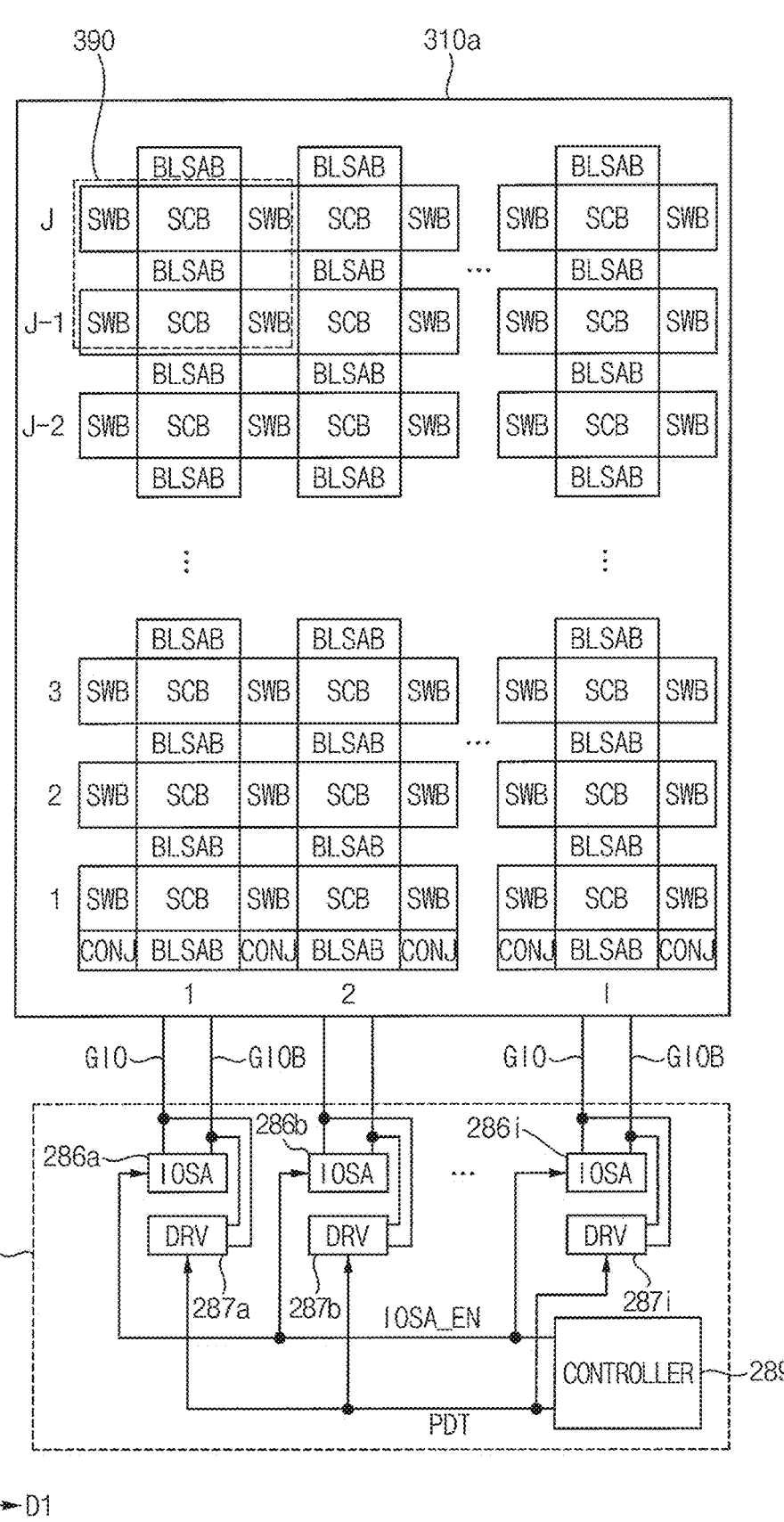
FIG. 13 illustrates the first bank array and the first sense amplifier in the semiconductor memory device of FIG. 3 according to some example embodiments.

FIG. 13 illustrates the first bank array and the first sense amplifier in the semiconductor memory device of FIG. 3 according to some example embodiments.

Referring to FIG. 13, in the first bank array 310a, I sub-array blocks SCB may be disposed in the first direction D1, and J sub-array blocks SCB may be disposed in the second direction D2 perpendicular to the first direction D1. I and J represent a number of the sub-array blocks SCB in the first direction D1 and the second direction D2, respectively, and are natural numbers greater than two.

I sub-array blocks SCB disposed in the first direction D1 in one row may be referred to as a row block. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example, between the sub-array blocks SCB in the second direction D2 and above and below each of the sub-array blocks SCB in the second direction D2. Bit-line sense amplifiers that sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator may be disposed in each of the conjunction regions CONJ.

The first sense amplifier 285a may be disposed in the first direction D1 with respect to the first bank array 310a and the first sense amplifier 285a may include I I/O sense amplifiers IOSAs 286a, 286b, . . . , 286i, I drivers DRVs 287a, 287b, . . . , 287i and a controller 289. The controller 289 may control the I I/O sense amplifiers 286a, 286b, . . . , 286i and the I drivers 287a, 287b, . . . , 287i by providing an enable signal IOSA_EN to the I I/O sense amplifiers 286a, 286b, . . . , 286i in a read operation and by providing a driving signal PDT to the I drivers DRVs 287a, 287b, . . . , 287i in a write operation.

A portion 390 in the first bank array 310a will be described with reference to FIG. 14 below.

Figure 14:
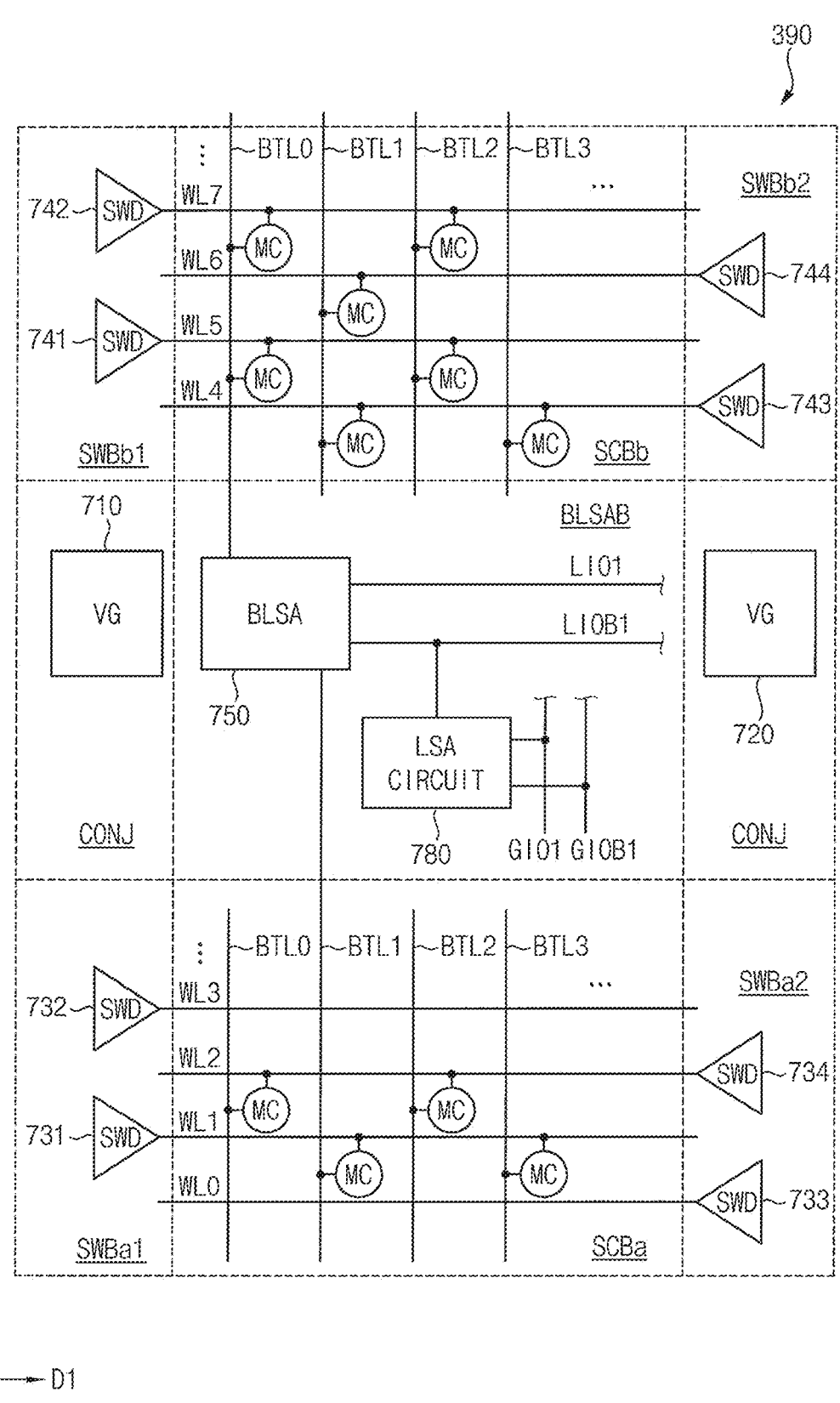
FIG. 14 illustrates a portion of the first bank array in FIG. 13 according to example embodiments.

FIG. 14 illustrates a portion of the first bank array in FIG. 13 according to example embodiments.

Referring to FIGS. 13 and 14, in the portion 390 of the first bank array 310a, sub-array blocks SCBa and SCBb, the bit-line sense amplifier regions BLSAB, four sub word-line driver regions SWBa1, SWBa2, SWBb1 and SWBb2 and two of the conjunction regions CONJ are disposed.

The sub-array block SCBa may include a plurality of word-lines WL0~WL3 extending in the second direction D2 and a plurality of bit-line BTL0~BTL3 extending in the first direction D1. The sub-array block SCBa may include a plurality of memory cells MCs disposed at intersections of the word-lines WL0~WL3 and the bit-line BTL0~BTL3. The sub-array block SCBb may include a plurality of word-lines WL4~WL7 extending in the second direction D2 and the plurality of bit-line BTL0~BTL3 extending in the first direction D1. The sub-array block SCBb may include a plurality of memory cells MCs disposed at intersections of the word-lines WL4~WL7 and the bit-line BTL0~BTL3.

With reference to FIG. 14, the sub word-line driver regions SWBa1 and SWBa2 may include a plurality of sub word-line drivers 731, 732, 733 and 734 that respectively drive the word-lines WL0~WL3. The sub word-line driver regions SWBb1 and SWBb2 may include a plurality of sub word-line drivers 741, 742, 743 and 744 that respectively drive the word-lines WL4~WL7.

The bit-line sense amplifier region BLSAB may include a bit-line sense amplifier BLSA 750 coupled to the bit-line BTL0 in the subarray block SCBb and the bit-line BTL1 in the subarray block SCBa, and a local sense amplifier LSA circuit 780. The bit-line sense amplifier 750 may sense and amplify a voltage difference between the bit-lines BTL0 and BTL1 to provide the amplified voltage difference to a local I/O line pair LIO1 and LIOB1.

The local sense amplifier circuit 780 may control an electrical connection between the local I/O line pair LIO1 and LIOB1 and a global I/O line pair GIO1 and GIOB1.

As illustrated in FIG. 14, the conjunction regions CONJ may be disposed adjacent to the bit-line sense amplifier region BLSAB and the sub word-line driver regions SWBa1, SWBb1, SWBa2 and SWBb2. Voltage generators 710 and 720 may be disposed in the conjunction regions CONJ.

Figure 15:
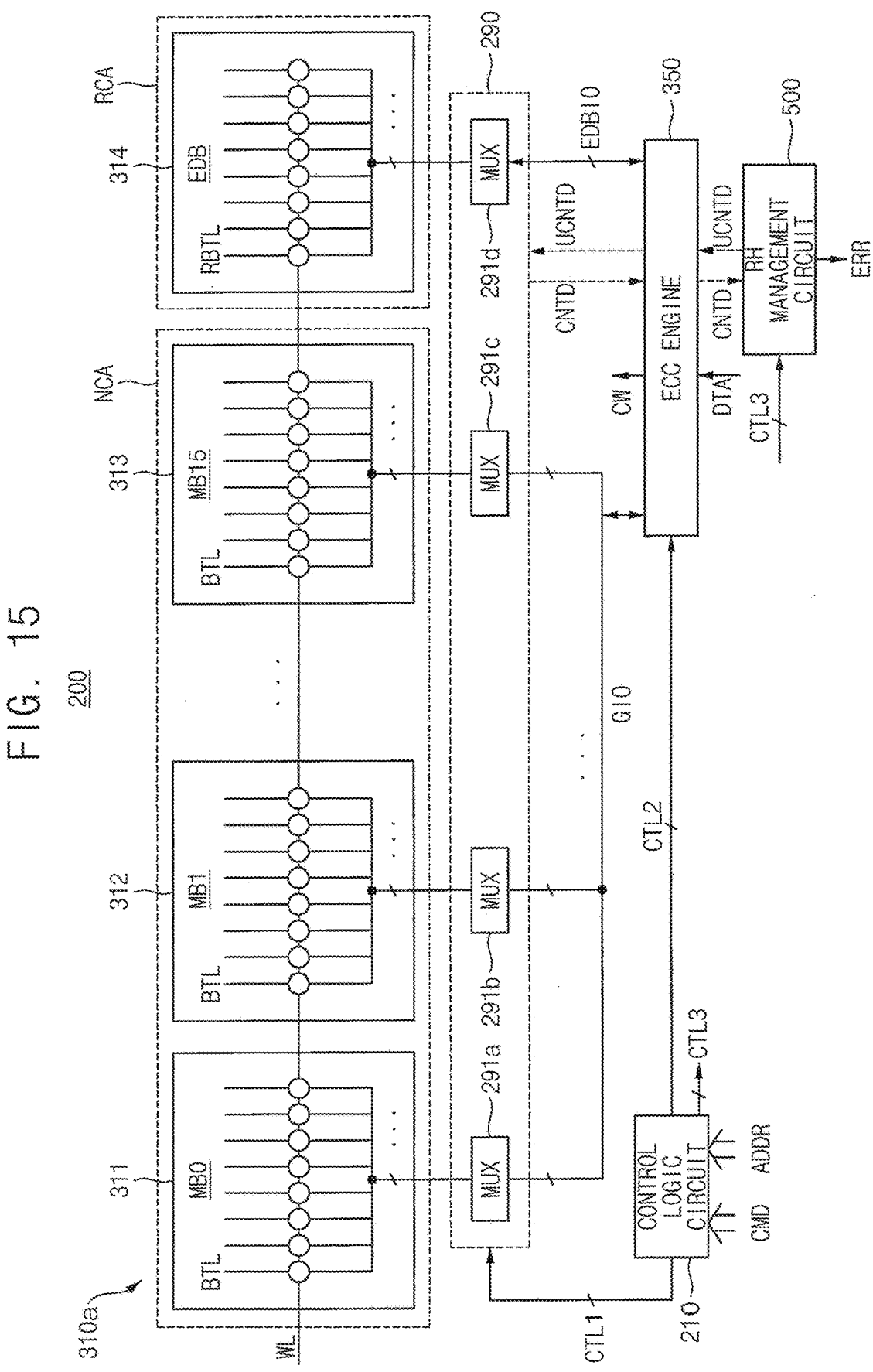
FIG. 15 illustrates a portion of the semiconductor memory device of FIG. 3 for explaining a write operation according to example embodiments.

FIG. 15 illustrates a portion of the semiconductor memory device of FIG. 3 for explaining a write operation according to example embodiments.

In FIG. 15, the control logic circuit 210, the first bank array 310a, the I/O gating circuit 290, the ECC engine 350 and the row hammer management circuit 500 are illustrated.

Referring to FIG. 15, the first bank array 310a includes a normal cell array NCA and a redundancy cell array RCA.

The normal cell array NCA includes a plurality of first memory blocks MB0~MB15, e.g., 311~313, and the redundancy cell array RCA includes at least a second memory block 314. The first memory blocks 311~313 are memory blocks that determine or are used to determine a memory capacity of the semiconductor memory device 200. The second memory block 314 may be used for ECC and/or redundancy repair. Since the second memory block 314 for ECC and/or redundancy repair is used for ECC, data line repair and block repair to repair 'failed' cells generated in the first memory blocks 311~313, the second memory block 314 is also referred to as an EDB block. The first memory blocks 311~313 and the second memory block 314 may each be representative of a subarray block SCB in FIG. 13.

The I/O gating circuit 290 includes a plurality of switching circuits 291a~291d respectively connected to the first memory blocks 311~313 and the second memory block 314.

The ECC engine 350 may be connected to the switching circuits 291a~291d through first data lines GIO and second data lines EDBIO. The control logic circuit 210 may receive the command CMD and the address ADDR, and may decode the command CMD to generate the first control signal CTL1 for controlling the switching circuits 291a~291d, the second control signal CTL2 for controlling the ECC engine 350 and the third control signal CTL3 for controlling the row hammer management circuit 500.

When the command CMD is a write command, the control logic circuit 210 provides the second control signal CTL2 to the ECC engine 350. The ECC engine 350 performs the ECC encoding on the data DTA to generate parity data associated with the data DTA, and provides the I/O gating circuit 290 with the codeword CW including the data DTA and the parity data. The control logic circuit 210 provides the first control signal CTL1 to the I/O gating circuit 290 such that the codeword CW is to be stored in a sub-page of the target page in the first bank array 310a.

When the command CMD that is received after the write command corresponds to the active count update command, the control logic circuit 210 provides the first control signal CTL1 to the I/O gating circuit 290 such that the I/O gating circuit 290 reads the count data CNTD and a count parity data associated with the count data CNTD from the target page of the first bank array 310, and provides the count data CNTD and the count parity data to the ECC engine 350. The ECC engine 350 performs an ECC decoding operation on the count data CNTD and the count parity data, corrects an error bit in the count data CNTD and provides the count data CNTD as a corrected count data to the row hammer management circuit 500, based on the second control signal CTL2.

The row hammer management circuit 500 updates the count data CNTD to provide the updated count data UCNTD to the ECC engine 350. The ECC engine 350 performs ECC encoding on the updated count data UCNTD to generate updated count parity data and stores the updated count data UCNTD and the updated count parity data in the target page through the I/O gating circuit 290.

That is, the ECC engine 350 and row hammer management circuit 500 may perform the internal read-update-write operation to read the count data CNTD, to update the read count data and to write the updated count data, in response to the active count update command. In addition, the row hammer management circuit 500, in response to all or a portion of the FIFO registers storing the candidate hammer addresses, each of whose number of times of access is equal to or greater than the first reference number of times NTH1, may notify the memory controller 30 of states of the FIFO registers by transitioning a logic level of the error signal ERR from the first logic level to the second logic level.

Figure 16:
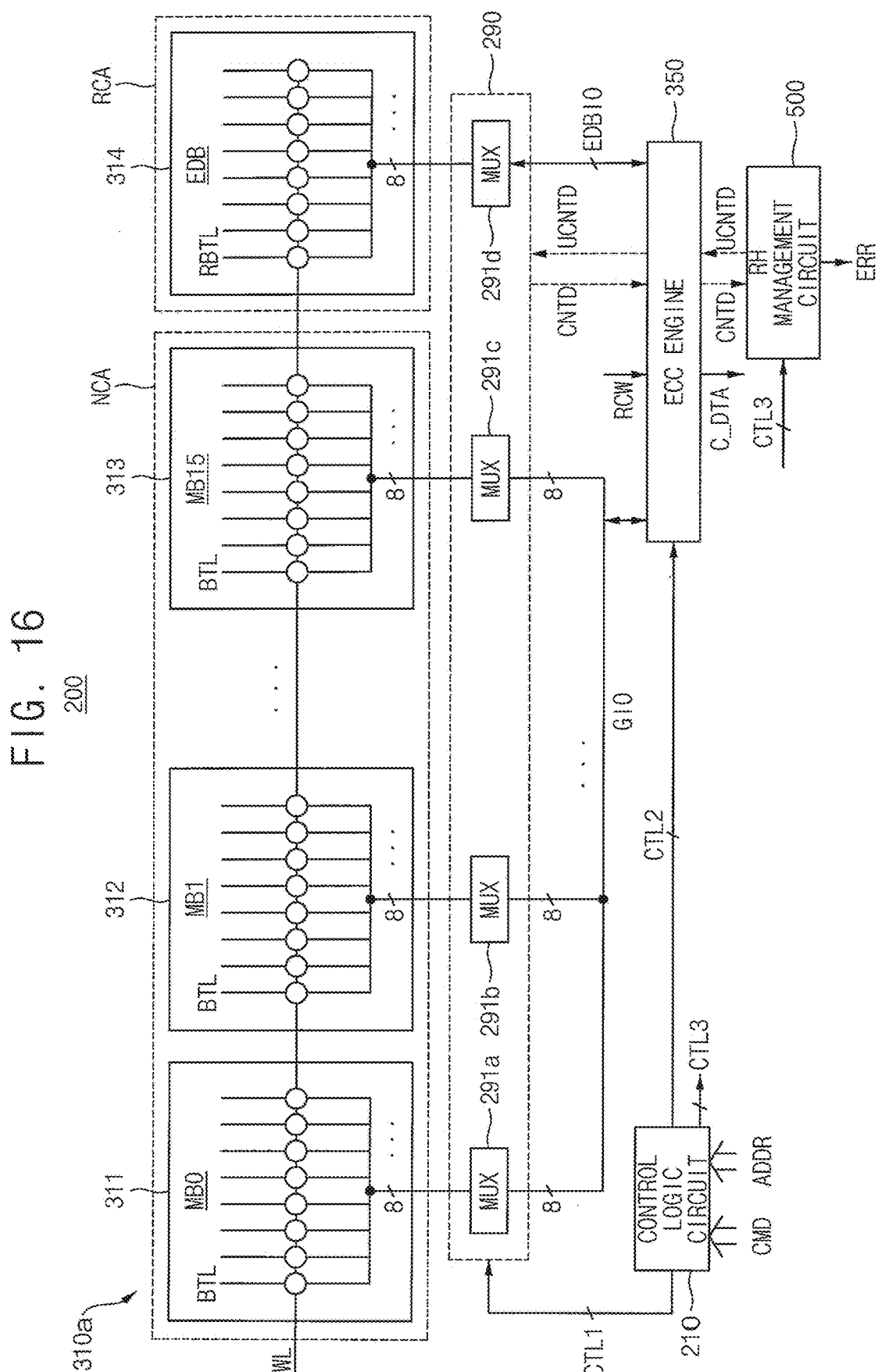
FIG. 16 illustrates a portion of the semiconductor memory device of FIG. 3 for explaining a read operation according to example embodiments.

FIG. 16 illustrates a portion of the semiconductor memory device of FIG. 3 for explaining a read operation according to example embodiments. For convenience of explanation, a further description of components and technical aspects previously described with reference to FIG. 15 will be omitted.

Referring to FIG. 16, when the command CMD is a read command that designates a read operation, the control logic circuit 210 provides the first control signal CTL1 to the I/O gating circuit 290 such that a (read) codeword RCW stored in the sub-page of the target page in the first bank array 310a is provided to the ECC engine 350.

When the command CMD that is received after the write command corresponds to the active count update command, the control logic circuit 210 provides the first control signal CTL1 to the I/O gating circuit 290 such that the I/O gating circuit 290 reads the count data CNTD and a count parity data associated with the count data CNTD from the target page of the first bank array 310, and provides the count data CNTD and the count parity data to the ECC engine 350. The ECC engine 350 performs an ECC decoding operation on the count data CNTD and the count parity data, corrects an error bit in the count data CNTD and provides the count data CNTD as a corrected count data to the row hammer management circuit 500, based on the second control signal CTL2.

The row hammer management circuit 500 updates the count data CNTD to provide the updated count data UCNTD to the ECC engine 350. The ECC engine 350 performs ECC encoding on the updated count data UCNTD to generate updated count parity data, and stores the updated count data UCNTD and the updated count parity data in the target page through the I/O gating circuit 290.

That is, the ECC engine 350 and row hammer management circuit 500 may perform the internal read-update-write operation to read the count data CNTD, to update the read count data and to write the updated count data, in response to the active count update command. In addition, the row hammer management circuit 500, in response to all or a portion of the FIFO registers storing the candidate hammer addresses, each of whose number of times of access is equal to or greater than the first reference number of times NTH1, may notify the memory controller 30 of states of the FIFO registers by transitioning a logic level of the error signal ERR from the first logic level to the second logic level.

Figure 17:
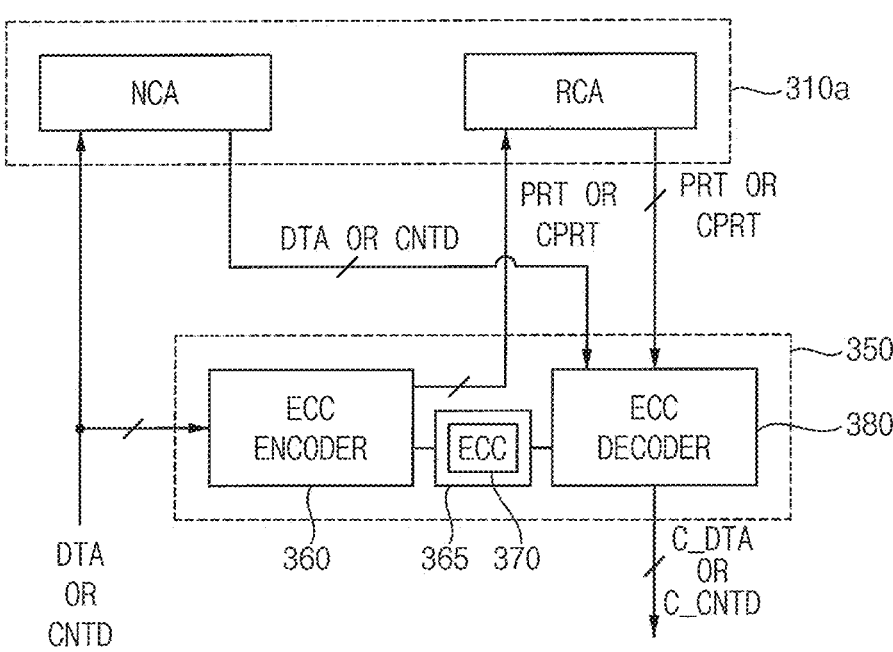
FIG. 17 is a block diagram illustrating an example of the ECC engine in the semiconductor memory device of FIG. 3 according to example embodiments.

FIG. 17 is a block diagram illustrating an example of the ECC engine in the semiconductor memory device of FIG. 3 according to example embodiments.

Referring to FIG. 17, the ECC engine 350 may include an ECC encoder 360, an ECC decoder 380 and a (ECC) memory 365. The memory 365 may store an ECC 370. The ECC 370 may be a single error correction (SEC) code or a single error correction/double error detection (SECDED) code.

The ECC encoder 360 may receive the data DTA from the data I/O buffer 320 and generate parity data PRT using the ECC 370 associated with the data DTA to be stored in the normal cell array NCA of the first bank array 310a. The parity data PRT may be stored in the redundancy cell array RCA of the first bank array 310a. In addition, the ECC encoder 360 may receive the count data CNTD as an updated count data UCNTD from the row hammer management circuit 500, and generate count parity data CPRT using the ECC 370 associated with the count data CNTD (e.g., updated count data UCNTD) to be stored in the normal cell array NCA of the first bank array 310a. The count parity data CPRT may be stored in the redundancy cell array RCA of the first bank array 310a.

The ECC decoder 380 may perform an ECC decoding operation on read data RMD based on the read data RMD and the parity data PRT read from the first bank array 310*a* using the ECC 370. When the read data RMD includes an error bit as a result of the ECC decoding, the ECC decoder 380 may correct the error bit in the read data RMD and may provide corrected data C_DTA to the data I/O buffer 320.

In addition, the ECC decoder 380 may perform an ECC decoding operation on the count data CNTD based on the count data CNTD and the count parity data CPRT read from the first bank array 310*a* using the ECC 370. When the count data CNTD includes an error bit as a result of the ECC decoding, the ECC decoder 380 may correct the error bit in the count data CNTD and may provide corrected count data C_CNTD to the row hammer management circuit 500.

Figure 18:
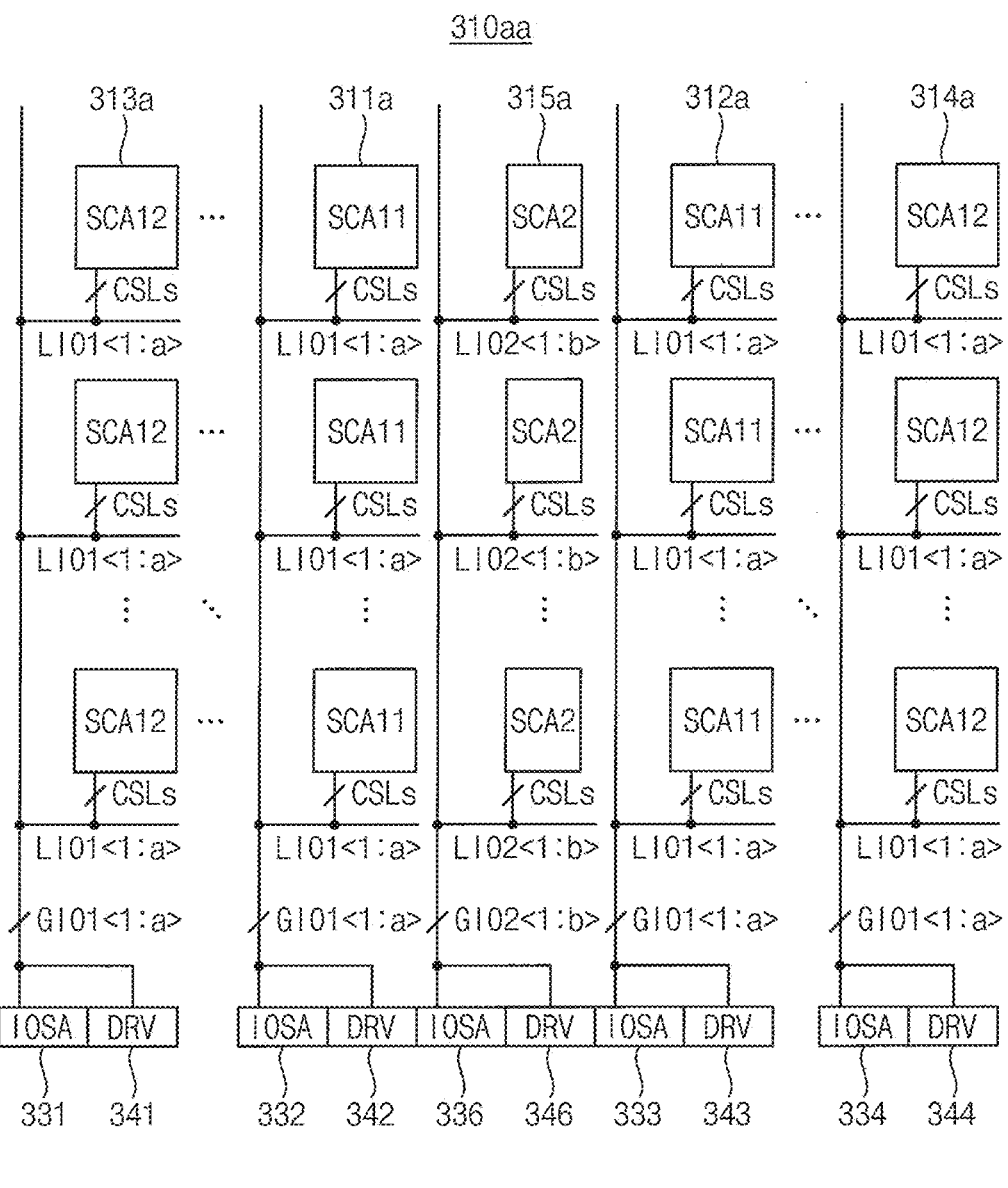
FIG. 18 is a block diagram illustrating an example of the first bank array in FIG. 3 according to example embodiments.

FIG. 18 is a block diagram illustrating an example of the first bank array in FIG. 3 according to example embodiments.

Referring to FIG. 18, a first bank array 310*aa* may include first subarray blocks SCA11 311*a* and 312*a*, second subarray blocks SCA12 313*a* and 314*a*, third subarray blocks SCA2 315*a*, I/O sense amplifiers 331, 332, 333, 334 and 336 and drivers 341, 342, 343, 344 and 346.

Data I/O for each of the first subarray blocks 311*a* and 312*a* and the second subarray blocks 313*a* and 314*a* may be performed through first global I/O lines GIO1<1:a> and first local I/O lines LIO1<1:a>. Here, a may be a natural number equal to or greater than 8. Depending on a read command or a write command, "a" bit-lines of each of the first subarray blocks 311*a* and 312*a* and the second subarray blocks 313*a* and 314*a* disposed in the first direction D1 may be selected by a column select signal transmitted through one of column select lines CSLs. The number of the first subarray blocks 311*a* and 312*a* and the second subarray blocks 313*a* and 314*a* may be different according to various embodiments and, for example, may be determined depending on the number of bits of data that the semiconductor memory device 200 is able to process.

Data I/O for the third subarray blocks 315*a* may be performed through second global I/O lines G102<1:b> and second local I/O lines LIO2<1:b>. Here, b may be a natural number smaller than a. Depending on a read command or a write command, "b" bit-lines of the third subarray blocks 315*a* may be selected by a column select signal that is transmitted through one of the column select lines CSLs. The number of the third subarray blocks 315*a* may be different according to various embodiments.

In example embodiments, the first bank array 310*aa* may further include first subarray blocks, second subarray blocks and third subarray blocks disposed in the second direction D2.

In example embodiments, the first subarray blocks 311*a* and 312*a* may store normal data and the count data, the second subarray blocks 313*a* and 314*a* may store the normal data and the third subarray blocks 315*a* may store the parity data and the count parity data. The normal data may be, for example, data that the semiconductor memory device 200 receives from an external device or data that the semiconductor memory device 200 will provide to the external device.

The I/O sense amplifier 331 may sense and amplify voltages of the first global I/O lines GIO1<1:a>, which are determined depending on bits output through the first global I/O lines GIO1<1:a>. Each of the I/O sense amplifiers 332, 333, 334 and 336 may operate in a manner similar to the I/O sense amplifier 331. The I/O sense amplifier 336 may sense and amplify voltages of the second global I/O lines GIO2<1:b>, which are determined depending on bits output through the second global I/O lines GIO2<1:b>.

The driver 341 may provide data to memory cells of the first subarray blocks 313*a* through the first global I/O lines GIO1<1:a>, the first local I/O lines LIO1<1:a>, and "a" bit-lines selected by a column select signal transmitted through one of column select lines CSLs based on a write command. The data may include bits received through one data I/O pin, or may include bits received through a plurality of data I/O pins aligned at a rising edge or a falling edge of a data strobe signal.

The drivers 342, 343, 344 and 346 may operate in a manner substantially similar to the driver 341. The driver 346 may transmit the parity data or the count parity data to memory cells of the third subarray blocks 315*a* through the second global I/O lines GIO2<1:b>, the second local I/O lines LIO2<1:b>, and "b" bit-lines selected by a column select signal transmitted through one of column select lines CSLs.

FIGS. 19 through 21 illustrate example commands which may be used in the memory system of FIG. 1 according to example embodiments.

FIG. 19 illustrates combinations of a chip selection signal CS_n and first through fourteenth command-address signals CA0~CA13 representing an active command ACT, a write command WR and a read command RD. FIG. 20 illustrates combinations of the chip selection signal CS_n and the first through fourteenth command-address signals CA0~CA13 representing a write command WRA including an auto precharge and a read command RDA including an auto precharge. FIG. 21 illustrates combinations of the chip selection signal CS_n and the first through fourteenth command-address signals CA0~CA13 representing precharge commands PREab, PREsb and PREpb.

In FIGS. 19 through 21, H indicates a logic high level, L indicates a logic low level, V indicates a valid logic level corresponding to one of the logic high level H and the logic low level L, R0~R17 indicate bits of a row address, BA0 through BA2 indicate bits of a bank address, BG0 through BG2 indicate bits of a bank group address, and CID0 through CID3 indicate a die identifier of a memory die (or a memory chip) when the semiconductor memory device 200 is implemented with a stacked memory device including a plurality of memory dies. In addition, in FIGS. 19 and 20, C2~C10 indicate bits of a column address, in FIG. 14, BL indicates burst length flag and in FIG. 20, AP indicates auto precharge flag.

Referring to FIG. 19, the active command ACT, the write command WR and the read command RD may be transferred during two cycles, for example, during the logic high level H and the logic low level L of the chip selection signal CS_n. The active command ACT may include the bank address bits BA0 and BA1 and the row address bits R0~R17.

Referring to FIG. 20, the write command WRA including an auto precharge and the read command RDA including an auto precharge may be transferred during two cycles, for example, during the logic high level H and the logic low level L of the chip selection signal CS_n, and may include the bank address bits BA0 and BAL and the column address bits C3~C10 or C2~C10. Either the tenth command-address signal CA9 or the eleventh command-address signal CA10 of the write command WRA including an auto precharge and the read command RDA including an auto precharge may be used as an active count update flag.

In FIG. 21, PREpb is a precharge command that precharges a particular bank in a particular bank group, PREab is an all bank precharge command that precharges all banks in all bank groups and PREsb is a same bank precharge command that precharges the same bank in all bank groups.

Referring to FIG. 21, the ninth command-address signal CA8 or the tenth command-address signal CA9 of each of the precharge commands PREab and PREsb may be used as an active count update flag designating the internal read-update-write operation.

Figure 22:
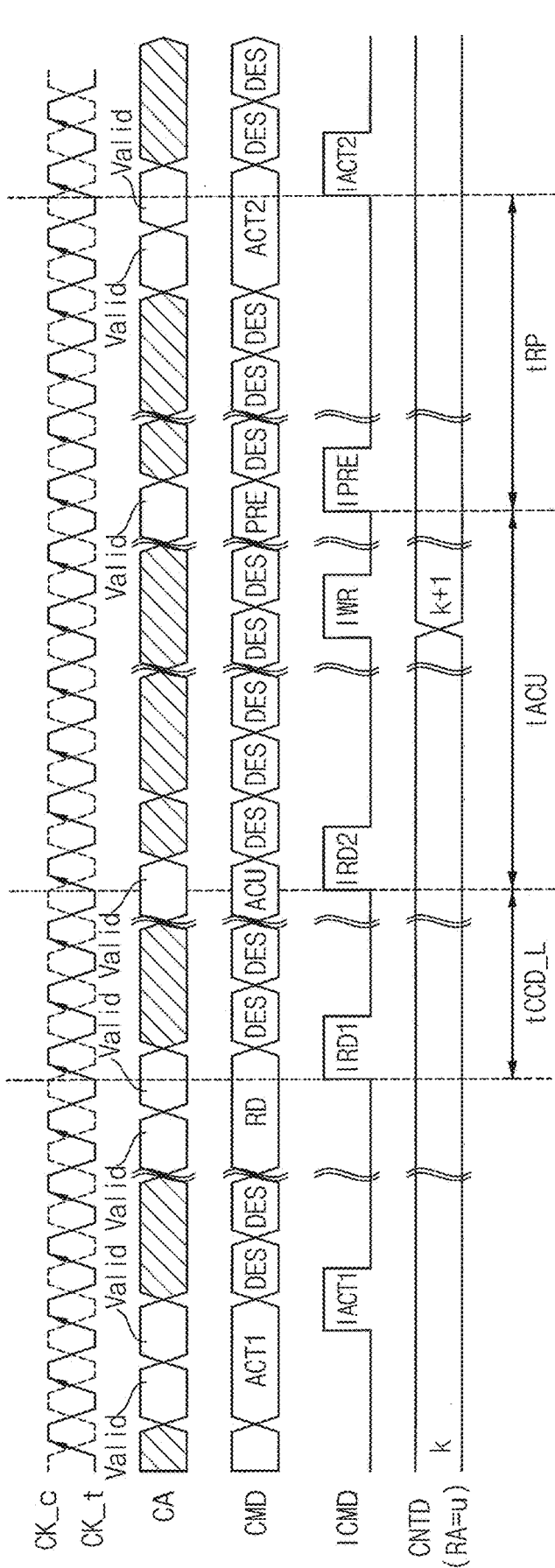
FIGS. 22 and 23 illustrate examples of command protocols of the memory system when the memory system uses the active count update command, respectively, according to example embodiments.
Figure 23:
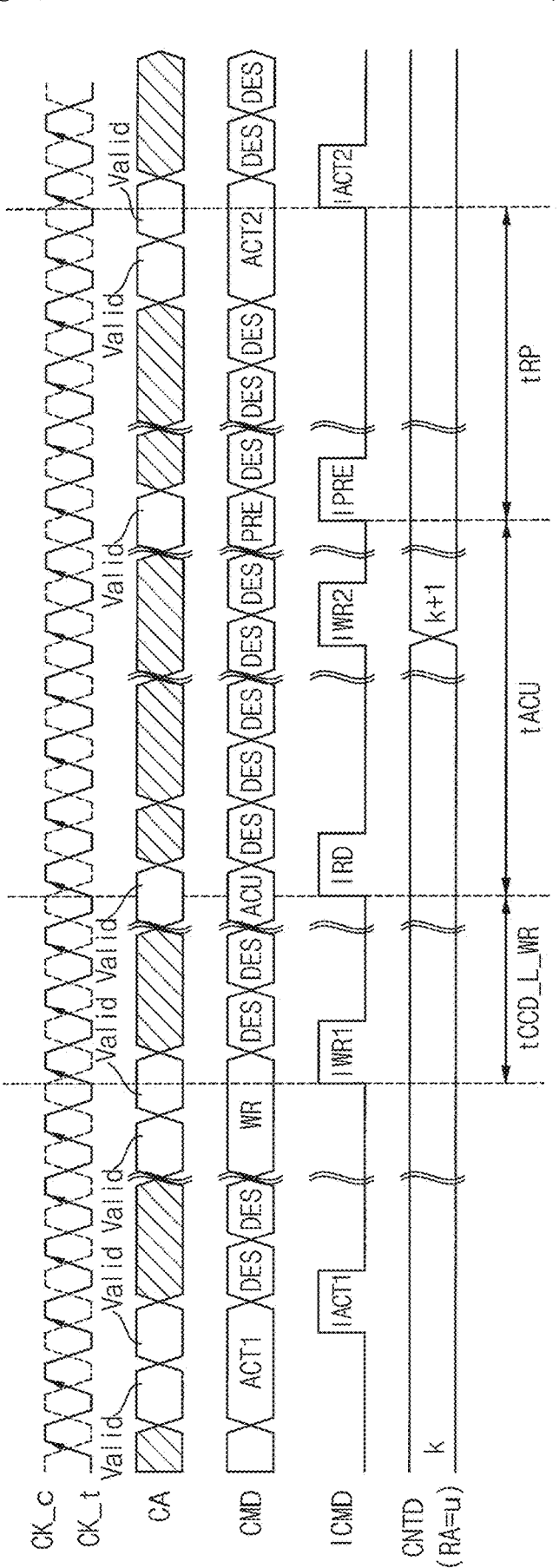

FIGS. 22 and 23 illustrate examples of command protocols of the memory system when the memory system uses the active count update command, respectively, according to example embodiments.

In FIGS. 22 and 23, differential clock signal pair CK_t and CK_c are illustrated.

Referring to FIGS. 1, 2, 3 and 22, the scheduler 55 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT1.

After applying the first active command ACT1, the scheduler 55 applies a read command RD designating a read operation on the first target memory cell row to the semiconductor memory device 200 in synchronization with an edge of the clock signal CK_t. The control logic circuit 210, in response to the read command RD, performs a read operation on data stored in the first target memory cell row by enabling a first read signal IRD1.

After a time interval corresponding to a delay time of consecutive read commands to the same bank group tCCD_L from applying the read command RD, the scheduler 55 applies an active count update command ACU to the semiconductor memory device 200 in synchronization with an edge of the clock signal CK_t, and the control logic circuit 210 reads the count data CNTD from the first target memory cell row, updates the read count data CNTD and stores the updated count data in the first target memory cell row by sequentially enabling a second read signal IRD2 and a write signal IWR in response to the active count update command ACU. Therefore, bit values stored in the first target memory cell row designated by the first target row address (e.g., RA=u) is increased by one from k to k+1.

After a time interval corresponding to a time tACU of performing the internal read-update-write operation from applying the active count update command ACU, the scheduler 55 applies a precharge command PRE to the semiconductor memory device 200 and the control logic circuit 210, in response to the precharge command PRE, precharges the first target word-line by enabling a precharge signal IPRE.

After a time interval corresponding to the precharge time tRP elapses, the scheduler 55 applies a second active command ACT2 associated with a second target memory cell row to the semiconductor memory device 200 and the control logic circuit 210, in response to the second active command ACT2, enables a second target word-line connected to the second target memory cell row by enabling a second active signal IACT2.

Referring to FIGS. 1, 2, 3 and 23, the scheduler 55 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT1.

After applying the first active command ACT1, the scheduler 55 applies a write command WR designating a write operation on the first target memory cell row to the semiconductor memory device 200 in synchronization with an edge of the clock signal CK_t. The control logic circuit 210, in response to the write command WR, performs a write operation to store data in the first target memory cell row by enabling a first write signal IWR1.

After a time interval corresponding to a delay time of consecutive write commands to the same bank group tCCD_L_WR from applying the write command WR elapses, the scheduler 55 applies an active count update command ACU to the semiconductor memory device 200 in synchronization with an edge of the clock signal CK_t, and the control logic circuit 210 reads the count data CNTD from the first target memory cell row, updates the read count data CNTD and stores the updated count data in the first target memory cell row by sequentially enabling a read signal IRD and a second write signal IWR2 in response to the active count update command ACU. Therefore, bit values stored in the first target memory cell row designated by the first target row address (e.g., RA=u) is increased by one from k to k+1.

After a time interval corresponding to a time tACU of performing the internal read-update-write operation from applying the active count update command ACU elapses, the scheduler 55 applies a precharge command PRE to the semiconductor memory device 200 and the control logic circuit 210, in response to the precharge command PRE, precharges the first target word-line by enabling a precharge signal IPRE.

After a time interval corresponding to precharge time tRP elapses, the scheduler 55 applies a second active command ACT2 associated with a second target memory cell row to the semiconductor memory device 200 and the control logic circuit 210, in response to the second active command ACT2, enables a second target word-line connected to the second target memory cell row by enabling a second active signal IACT2.

Figure 24:
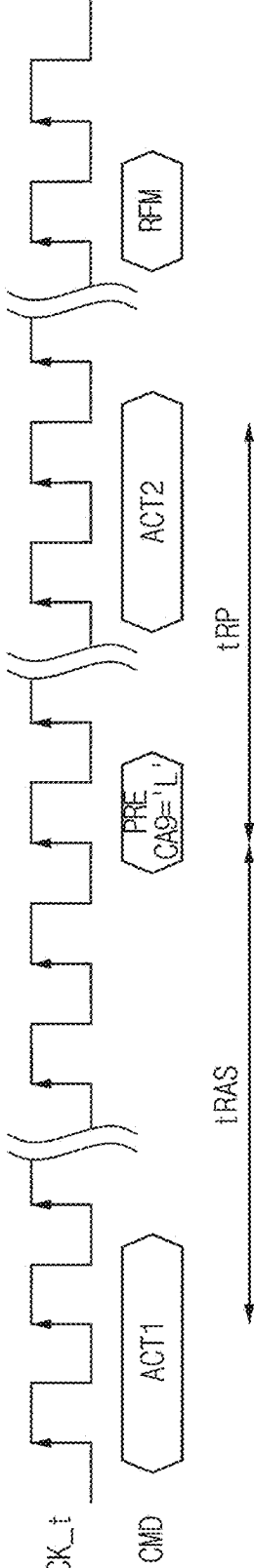
FIG. 24 illustrates an example of the command protocol of the memory system when the memory system updates the count data based on the precharge command according to example embodiments.

FIG. 24 illustrates an example of the command protocol of the memory system when the memory system updates the count data based on the precharge command according to example embodiments.

Referring to FIGS. 1, 2, 21 and 24, the scheduler 55 applies the first active command ACT1 to the semiconductor memory device 200 in synchronization with an edge of the clock signal CK_t, and applies the precharge command PRE designating an internal read-update-write operation on the count data stored in a target memory cell designated by a target row address accompanied by the first active command ACT1 to the semiconductor memory device 200 after a tRAS corresponding to active to precharge time elapses. In this case, the scheduler 55 may set the tenth command-address signal CA9 of the precharge command PRE to a logic low level L.

According to example embodiments, the scheduler 55 may apply a read command or a write command to the semiconductor memory device 200 in synchronization with an edge of the clock signal CK_t.

After a time interval corresponding to the precharge time tRP elapses, the scheduler 55 applies a second active command ACT2 to the semiconductor memory device 200 in synchronization with an edge of the clock signal CK_t and applies a refresh management command RFM to the semiconductor memory device 200. The semiconductor memory device 200 performs a hammer refresh operation on two victim memory cell rows physically adjacent to a memory cell row corresponding to the hammer address, in response to the refresh management command RFM.

Figure 25:
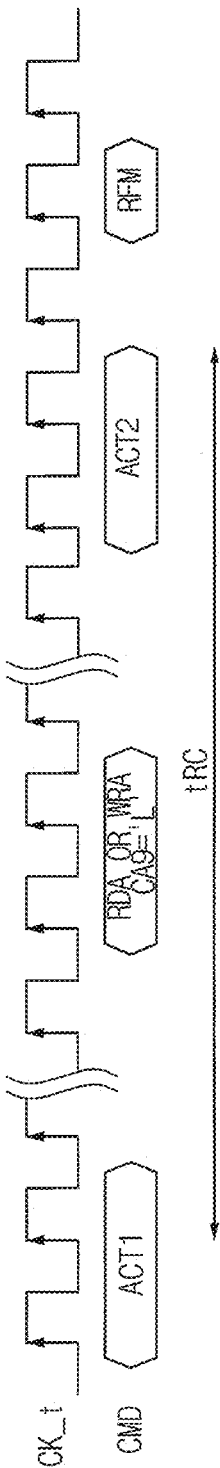
FIG. 25 illustrates an example of the command protocol of the memory system when the memory system updates the count data based on the read command including an auto precharge or the write command including an auto precharge according to example embodiments.

FIG. 25 illustrates an example of the command protocol of the memory system when the memory system updates the count data based on the read command including an auto precharge or the write command including an auto precharge according to example embodiments.

Referring to FIGS. 1, 2, 20 and 25, the scheduler 55 applies the first active command ACT1 to the semiconductor memory device 200 in synchronization with an edge of the clock signal CK_t, and applies the read command RDA including an auto precharge or the write command WRA including an auto precharge designating an internal read-update-write operation on the count data stored in a target memory cell designated by a target row address accompanied by the first active command ACT1 to the semiconductor memory device 200. In this case, the scheduler 55 may set the tenth command-address signal CA9 of the read command RDA including an auto precharge or the write command WRA including an auto precharge to a logic low level L. The row hammer management circuit 500 may perform the internal read-update-write operation in response to the logic low level L of the tenth command-address signal CA9.

After a time interval corresponding to the active time tRC from applying the first active command ACT1 elapses, the scheduler 55 applies a second active command ACT2 to the semiconductor memory device 200 and applies a refresh management command RFM to the semiconductor memory device 200. The semiconductor memory device 200 performs a hammer refresh operation on two victim memory cell rows physically adjacent to a memory cell row corresponding to the hammer address, in response to the refresh management command RFM.

In FIG. 25, the scheduler 55 may selectively apply the read command RDA including an auto precharge or the write command WRA including an auto precharge to the semiconductor memory device 200.

Figure 26:
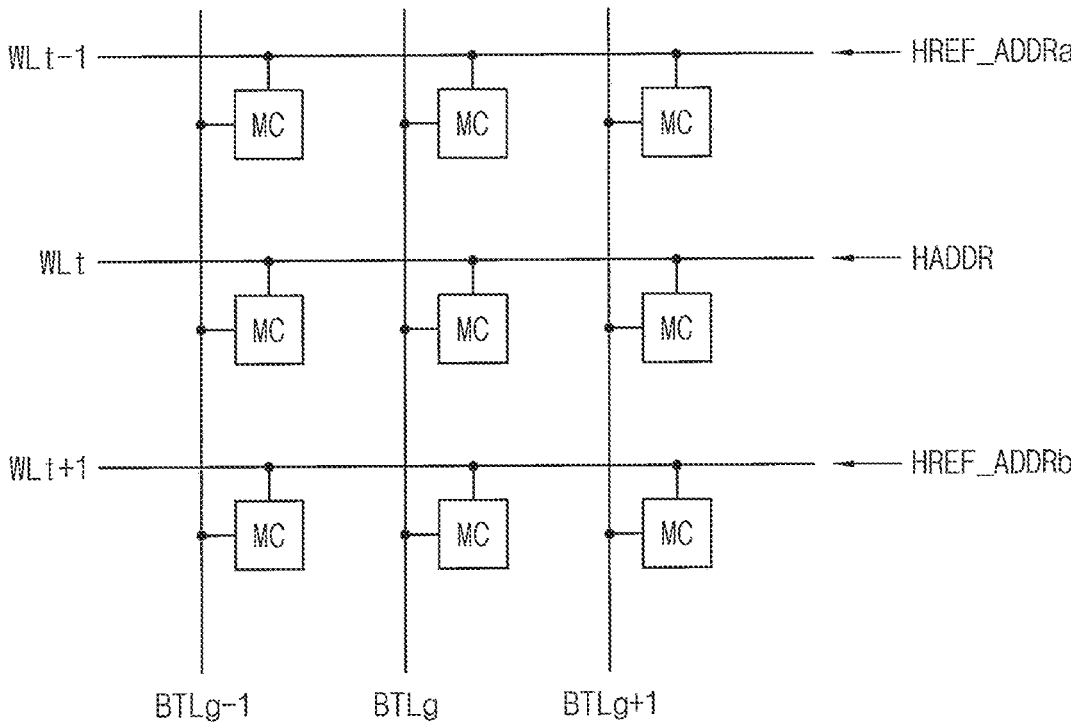
FIG. 26 is a diagram illustrating a portion of a memory cell array for describing generation of hammer refresh addresses according to example embodiments.
Figure 26:
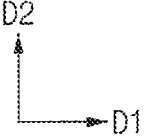

FIG. 26 is a diagram illustrating a portion of a memory cell array for describing generation of hammer refresh addresses according to example embodiments.

FIG. 26 illustrates three word-lines WLt−1, WLt and WLt+1, three bit-lines BTLg−1, BTLg and BTLg+1 and memory cells MC coupled to the word-lines WLt−1, WLt and WLt+1 and the bit-lines BTLg−1, BTLg and BTLg+1 in the memory cell array. The three word-lines WLt−1, WLt and WLt+1 extend in the first direction D1 and are arranged sequentially along the second direction D2. The three bit-lines BTLg−1, BTLg and BTLg+1 extend in the second direction D2 and are arranged sequentially along the first direction D1. The word-lines WLt−1 and WLt are physically disposed directly adjacent to each other, as there are no intervening word-lines between the word-lines WLt−1 and WLt.

For example, the middle word-line WLt may correspond to the hammer address HADDR that has been intensively accessed. It will be understood that "an intensively-accessed word-line" refers to a word-line that has a relatively higher activation number and/or has a relatively higher activation frequency. Whenever the hammer word-line (e.g., the middle word-line WLt) is accessed, the hammer word-line WLt is enabled and precharged, and the voltage level of the hammer word-line WLt is increased and decreased. Word-line coupling may cause the voltage levels of the adjacent word-lines WLt−1 and WLt+1 to fluctuate as the voltage level of the hammer word-line WLt varies, and thus, the cell charges of the memory cells MC coupled to the adjacent word-lines WLt−1 and WLt+1 may be affected. As the hammer word-line WLt is accessed more frequently, the cell charges of the memory cells MC coupled to the adjacent word-lines WLt−1 and WLt+1 may be lost more rapidly.

The hammer refresh address generator 440 in FIG. 6 may provide the hammer refresh address HREF_ADDR representing the addresses HREF_ADDRa and HREF-ADDRb of the rows (e.g., the word-lines WLt−1 and WLt+1) that are physically adjacent to the row of the hammer address HADDR (e.g., the hammer word-line WLt), and a refresh operation for the adjacent word-lines WLt−1 and WLt+1 may be performed additionally based on (e.g., in response to) the hammer refresh address HREF_ADDR to reduce or prevent the loss of data stored in the memory cells MC.

Figure 27:
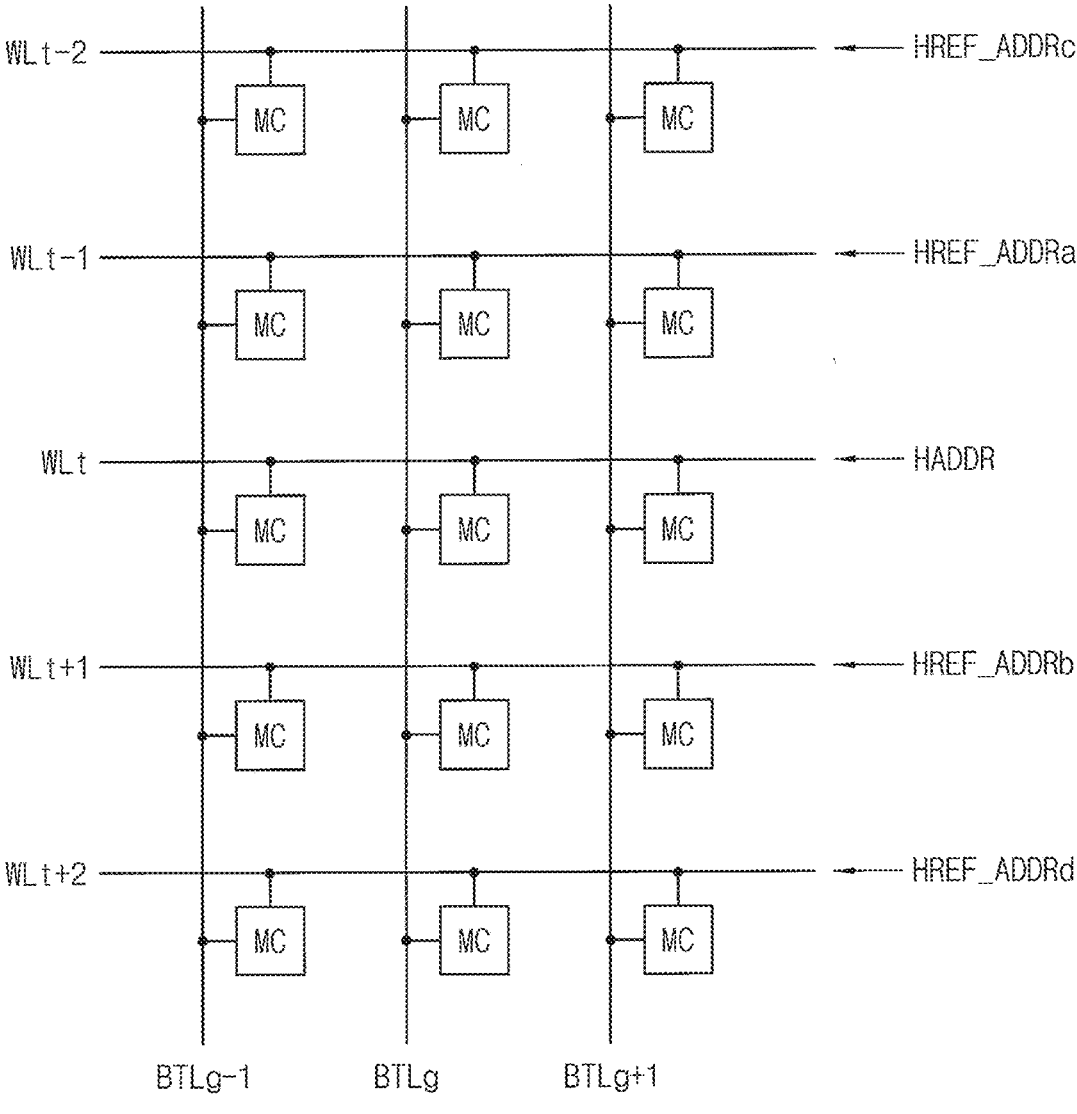
FIG. 27 is a diagram illustrating a portion of a memory cell array for describing generation of hammer refresh addresses in response to the second type of hammer address according to example embodiments.
Figure 27:
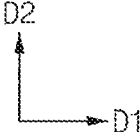

FIG. 27 is a diagram illustrating a portion of a memory cell array for describing generation of hammer refresh addresses in response to the second type of hammer address according to example embodiments.

FIG. 27 illustrates five word-lines WLt−2, WLt−1, WLt, WLt+1 and WLt+2, three bit-lines BTLg−1, BTLg and BTLg+1 and memory cells MC coupled to the word-lines WLt−2, WLt−1, WLt, WLt+1 and WLt+2 and the bit-lines BTLg−1, BTLg and BTLg+1 in the memory cell array. The five word-lines WLt−2, WLt−1, WLt, WLt+1 and WLt+2 extend in the first direction D1 and are arranged sequentially along the second direction D2.

The hammer refresh address generator 440 in FIG. 6 may provide the hammer refresh address HREF_ADDR representing addresses HREF_ADDRa, HREF_ADDRb, HREF_ADDRc and HREF_ADDRd of the rows (e.g., the word-lines WLt−1, WLt+1, WLt−2 and WLt+2) that are physically adjacent to the row of the hammer address HADDR (e.g., the middle word-line WLt), and a refresh operation for the adjacent word-lines WLt−1, WLt+1, WLt−2 and WLt+2 may be performed additionally based on (e.g., in response to) the hammer refresh address HREF_ADDR to reduce or prevent the loss of data stored in the memory cells MC.

Figure 28A:
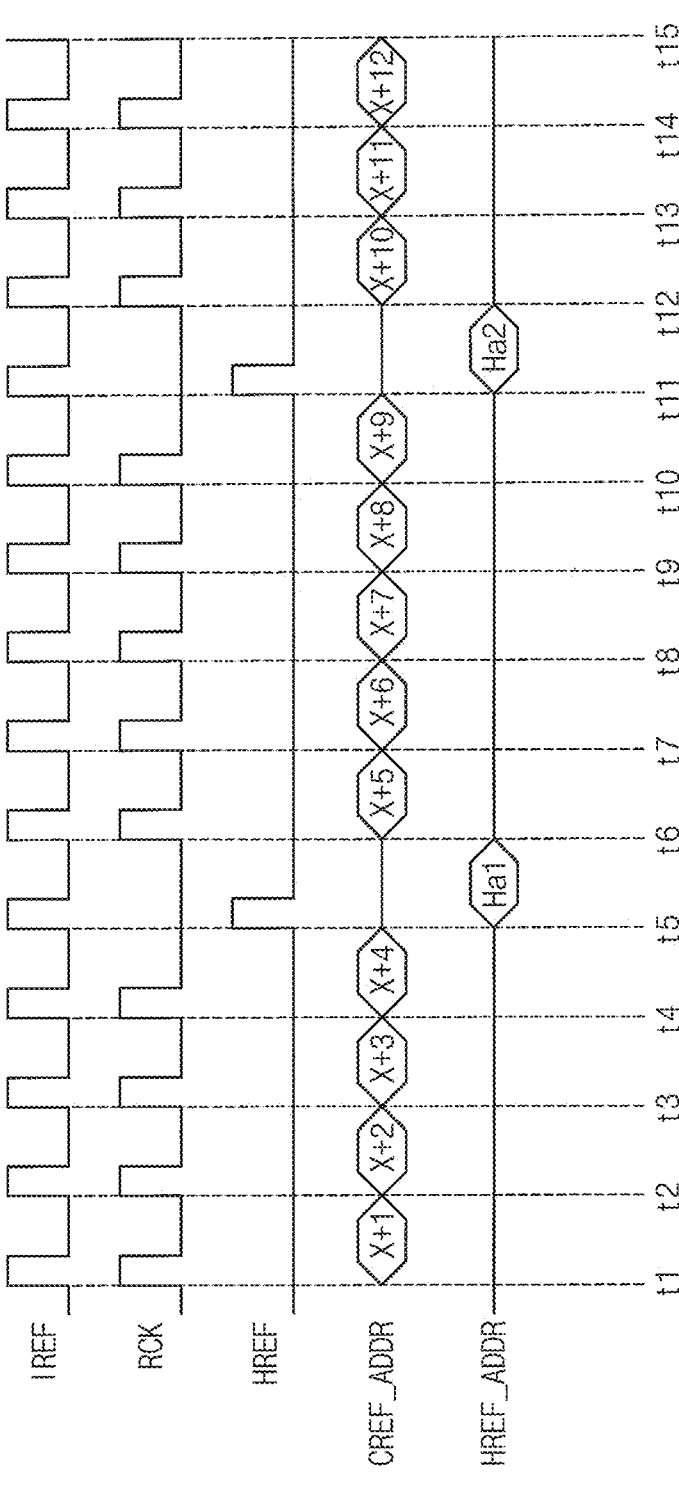
FIGS. 28A, 28B and 29 are timing diagrams illustrating example operations of a refresh control circuit of FIG. 6 according to example embodiments.
Figure 28B:
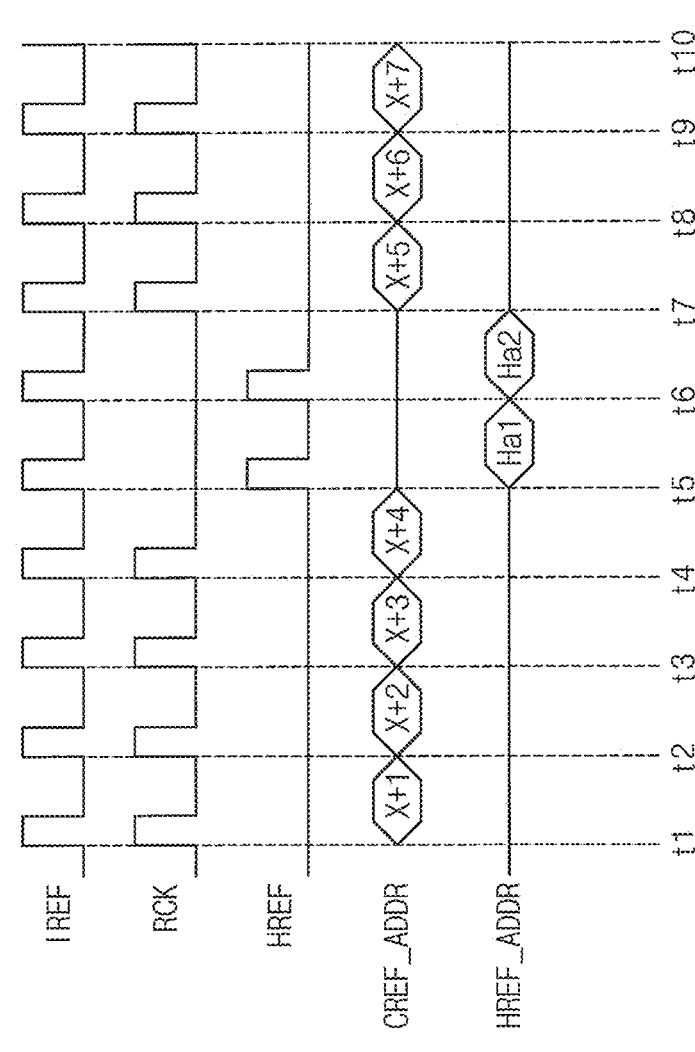
Figure 29:
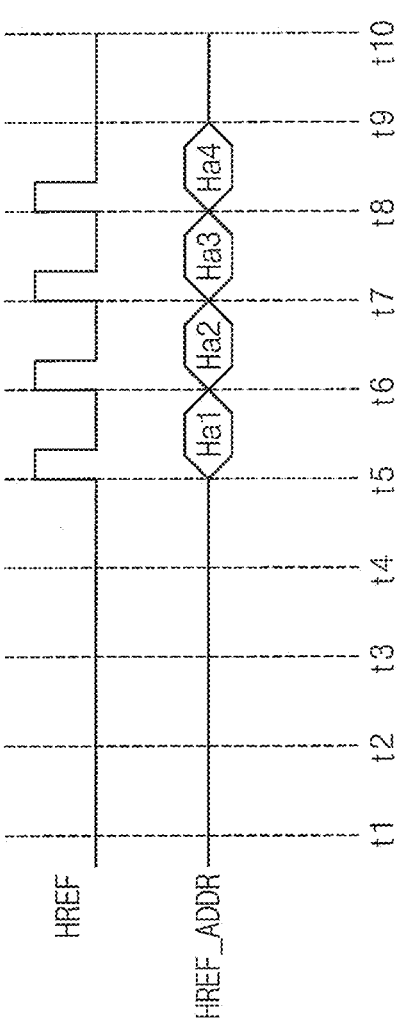

FIGS. 28A, 28B and 29 are timing diagrams illustrating example operations of a refresh control circuit of FIG. 6 according to example embodiments.

FIGS. 28A and 28B illustrate generations of a refresh clock signal RCK, a hammer refresh signal HREF, a counter refresh address CREF_ADDR, and a hammer refresh address HREF_ADDR, with respect to a refresh control signal IREF that is activated in a pulse shape. The intervals between the activation time points t1~t15 of the refresh control signal IREF may be regular or irregular.

Referring to FIGS. 6 and 28A, the refresh control logic 410 may activate the refresh clock signal RCK in synchronization with some time points t1~t4, t6~t10 and t12~t15 among the activation time points t1~t15 of the refresh control signal IREF, and may activate the hammer refresh signal HREF with the other time points t5 and t11.

The refresh counter 430 may generate the counter refresh address CREF_ADDR representing the sequentially changing addresses X+1~X+12 in synchronization with the activation time points t1~t4, t6~t10 and t12~15 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t11 of the hammer refresh signal HREF.

Referring to FIGS. 6 and 28B, the refresh control logic 410 may activate the refresh clock signal RCK in synchronization with some time points t1~t4 and t7~t10 among the activation time points t1~t10 of the refresh control signal IREF, and may activate the hammer refresh signal HREF with the other time points t5 and t6.

The refresh counter 430 may generate the counter refresh address CREF_ADDR representing the sequentially changing addresses X+1~X+7 in synchronization with the activation time points t1~t4 and t7~t10 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the hammer refresh signal HREF.

Referring to FIGS. 6 and 29, the hammer refresh address generator 440 may generate the hammer refresh address HREF_ADDR representing the address Ha1, Ha2, Ha3 and Ha4 of the rows that are physically adjacent to the row of the hammer address in synchronization with the activation time points t5, 16, 17, 18 of the hammer refresh signal HREF.

Figure 30:
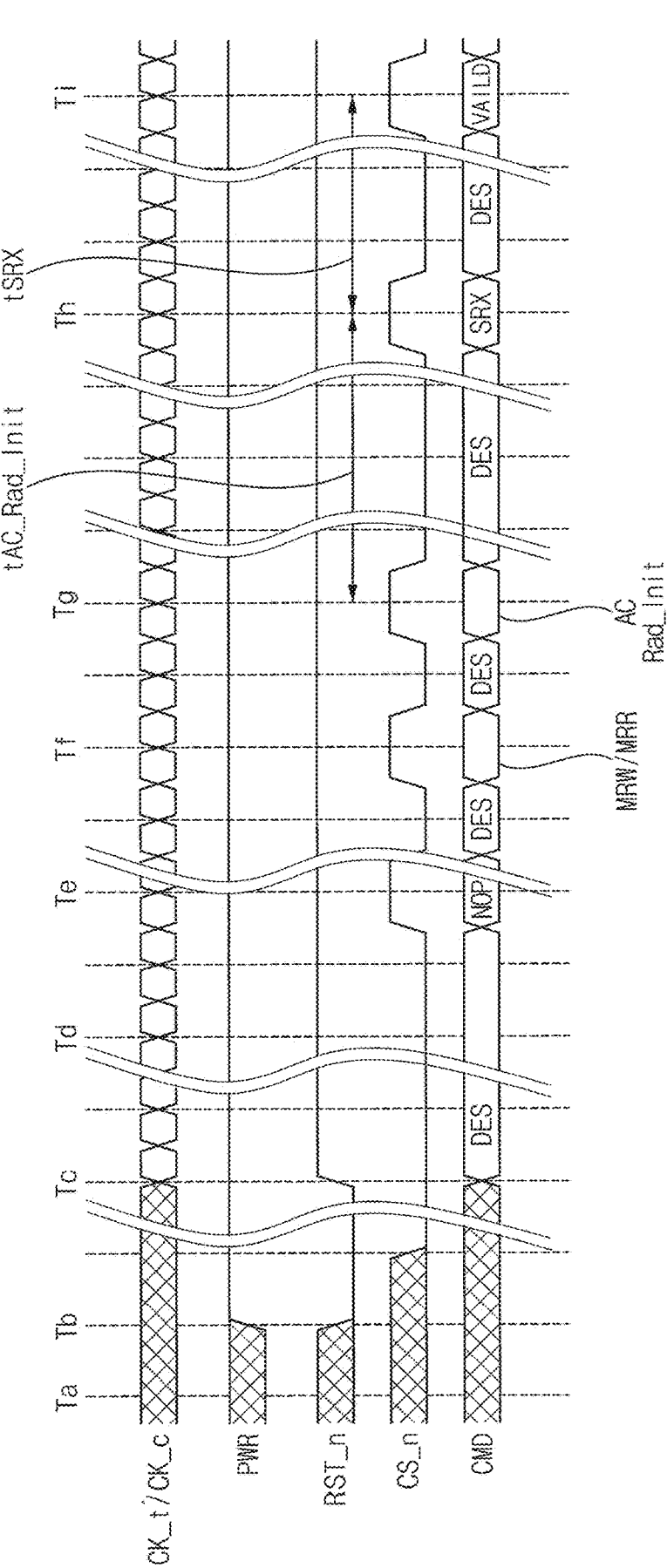
FIG. 30 illustrates an example of a command protocol of the memory system when the memory system uses a random initialization command according to example embodiments.

FIG. 30 illustrates an example of a command protocol of the memory system when the memory system uses a random initialization command according to example embodiments.

In FIG. 30, differential clock signal pair CK_t and CK_c and time points Ta, Tb, Tc, Td, Te, Tf, Tg, Th and Ti based on the differential clock signal pair CK_t and CK_c are illustrated.

Referring to FIGS. 1, 2, 3 and 30, the differential clock signal pair CK_t and CK_c and the command CMD are applied to the semiconductor memory device 200 from a time point Tc, a power PWR and a reset signal RST_n are applied to the semiconductor memory device 200 from a time point Tb, and a chip selection signal CS_n is applied to the semiconductor memory device 200 between the time points Tb and Tc.

At a time point Tf, the memory controller 30 applies a mode register write command MRW and a mode register read command MRR to the semiconductor memory device 200. At a time point Tg, the row hammer management circuit 500 in the semiconductor memory device 200 writes random count data in count cells in each of the memory cell rows in response to active count random initialization command AC Rad_Init from the memory controller 30, and the semiconductor memory device 200 enters into a self-refresh mode to maintain the random count data.

At a time point Th after a time interval corresponding to tAC_Rad_Init elapses from the time point Tf, the memory controller 30 applies a self-refresh exit command SRX to the semiconductor memory device 200, and the semiconductor memory device 200 exits from the self-refresh mode during a time interval tSRX between the time points Th and Ti and enters into a normal mode.

Figure 31:
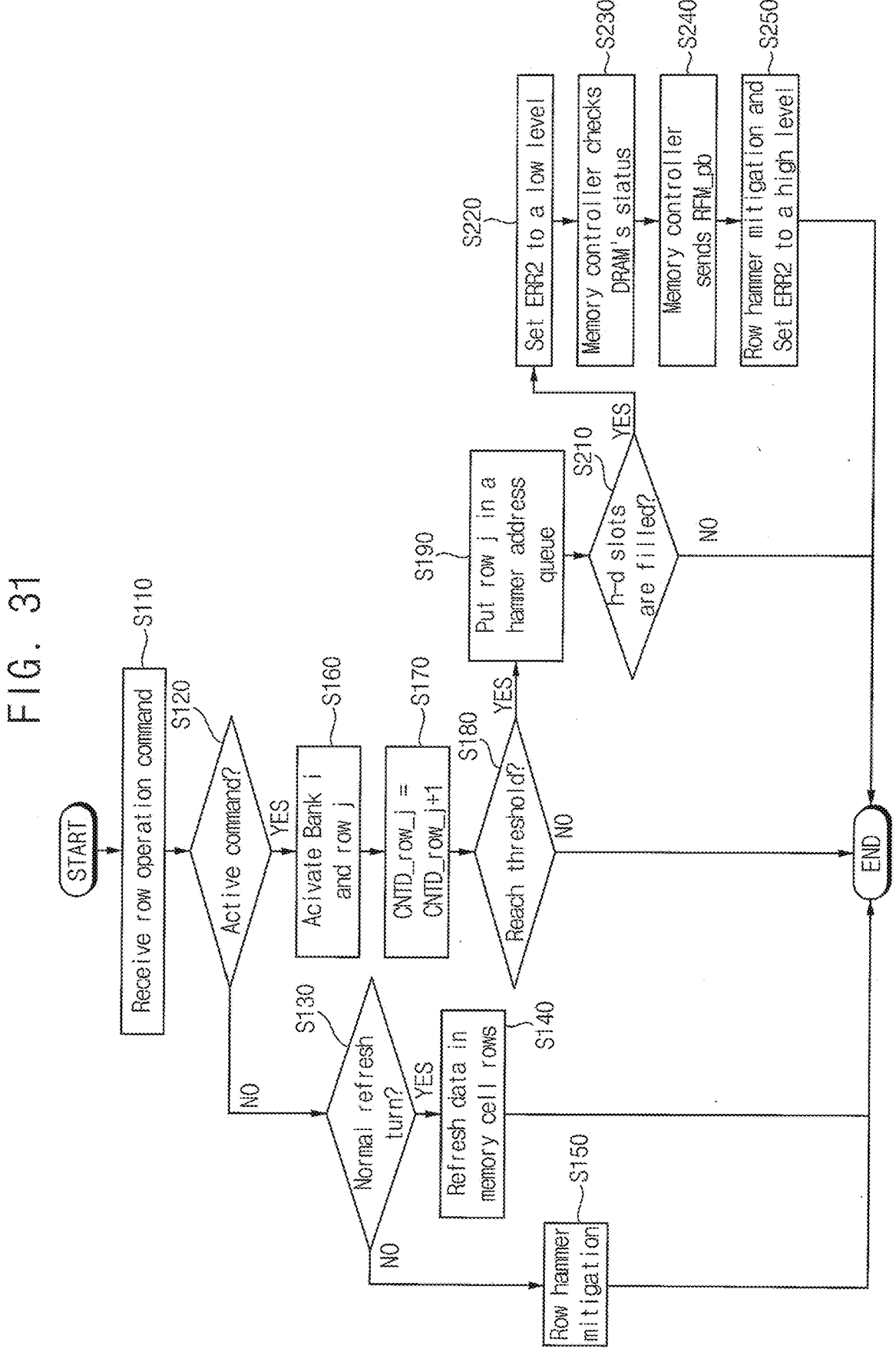
FIG. 31 is a flowchart illustrating an operation of the memory system according to example embodiments.

FIG. 31 is a flowchart illustrating an operation of the memory system according to example embodiments.

Referring to FIGS. 1 through 12 and 31, the semiconductor memory device 200 receives a row operation command from the memory controller 30 (operation S110) and the control logic circuit 210 determines whether the row operation command corresponds to an active command (operation S120).

When the row operation command does not correspond to an active command (NO in S120), the row operation command is a refresh command and the control logic circuit 210 determines whether the refresh command designates a turn of a normal refresh (operation S130). When the refresh command designates a turn of a normal refresh (YES in operation S130), the control logic circuit 210 controls the refresh control circuit 400 to perform a normal refresh operation to refresh data in memory cell rows (operation S140). When the refresh command does not designate a turn of a normal refresh (NO in operation S130), the control logic circuit 210 controls the refresh control circuit 400 to perform a hammer refresh operation to mitigate a row hammer (operation S150).

When the row operation command corresponds to an active command (YES in S120), the control logic circuit 210 activates a memory cell row (row j) in a bank array (bank i) and increases a count data CNTD_row_j of the memory cell row (row j) in the bank array (bank i) by one to update a count data CNTD_row_j+1 (operation S170).

The row hammer management circuit 500 determines whether a count data of the memory cell row (row j) in the bank array (bank i) reaches a first reference number of times (threshold) (operation S180). When the count data of the memory cell row (row j) does not reach the first reference number of times (NO in S180), the operation ends. When the count data of the memory cell row (row j) reaches the first reference number of times (YES in S180), the row hammer management circuit 500 puts a row address of the memory cell row (row j) in the hammer address queue 600 as a candidate hammer address (operation S190).

The monitor logic 550b determines whether a second number of FIFO registers (h-d slots) store candidate hammer addresses (operation S210). That is, the monitor logic 550b determines whether the h-d slots are filled. Here, h is a natural number greater than two and represents a total number of FIFO registers in the hammer address queue 600 and d is a natural number smaller than d. When the second number of FIFO registers do not store candidate hammer addresses (NO in S120), the operation ends. When the second number of FIFO registers store candidate hammer addresses (YES in S120), the monitor logic 650b sets the error signal to a second logic level (e.g., a logic low level) (operation S20).

The memory controller 30 checks the status of the semiconductor memory device 200 based on a logic level of the error signal ERR2 (operation S230), and applies a refresh management command RFM_pb to the semiconductor memory device 200 (operation S240).

The refresh control circuit 400 performs a hammer refresh operation on one or more victim memory cell rows, and the monitor logic 550b sets the error signal ERR1 to a first logic level (e.g., a logic high level) (operation S250).

Figure 32:
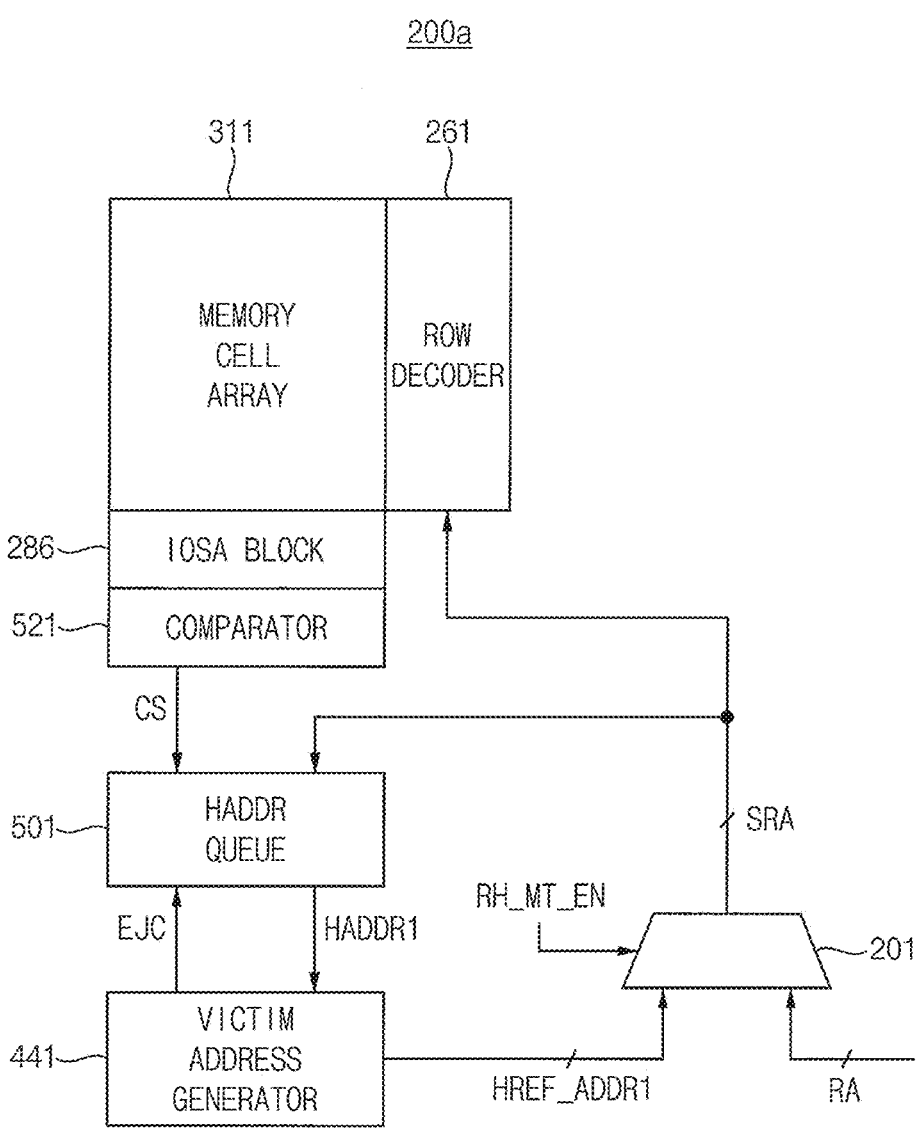
FIG. 32 is a block diagram illustrating a semiconductor memory device according to example embodiments.

FIG. 32 is a block diagram illustrating a semiconductor memory device according to example embodiments.

Referring to FIG. 32, a semiconductor memory device 200a may include a memory cell array 311, a row decoder 261, an I/O sense amplifier IOSA block IOSA BLOCK 286, a comparator 521, a hammer address queue HADDR QUEUE 501, a victim address generator 441 and a multiplexer 202.

The comparator 521, in response to a first command applied after an active command, may read count data stored in count cells of a target memory cell row from among a plurality of memory cell rows in the memory cell array 311, compare the read count data with a first reference number of times, may generate a comparison signal CS indicating a result of the comparison and may provide the comparison signal CS to the hammer address queue 501.

The hammer address queue 501, in response to the comparison signal CS indicating that the read count data is equal to or greater than the first reference number of times, may store a row address of the target memory cell row in FIFO registers therein as a candidate hammer address repeatedly, and may provide the victim address generator 441 with one of candidate hammer addresses stored in the FIFO registers, each of whose read count data is equal to or greater than the first reference number of times, as a hammer address HADDR1.

The victim address generator 441 may receive the hammer address HADDR1, may output one or more hammer refresh addresses HREF_ADDR1 designating one or more victim memory cell rows which are physically adjacent to a memory cell row corresponding to the hammer address HADDR1, and may apply an eject signal EJC to the hammer address queue 501 to empty one of the FIFO registers in the hammer address queue 501.

The multiplexer 202 may provide one of the hammer refresh addresses HREF_ADDR1 and a row address to the hammer address queue 501 and the row decoder 261 in response to a row hammer mitigation enable signal RH_MT_EN. The row hammer mitigation enable signal RH_MT_EN may be provided from the control logic circuit 210 in FIG. 3.

Figure 33A:
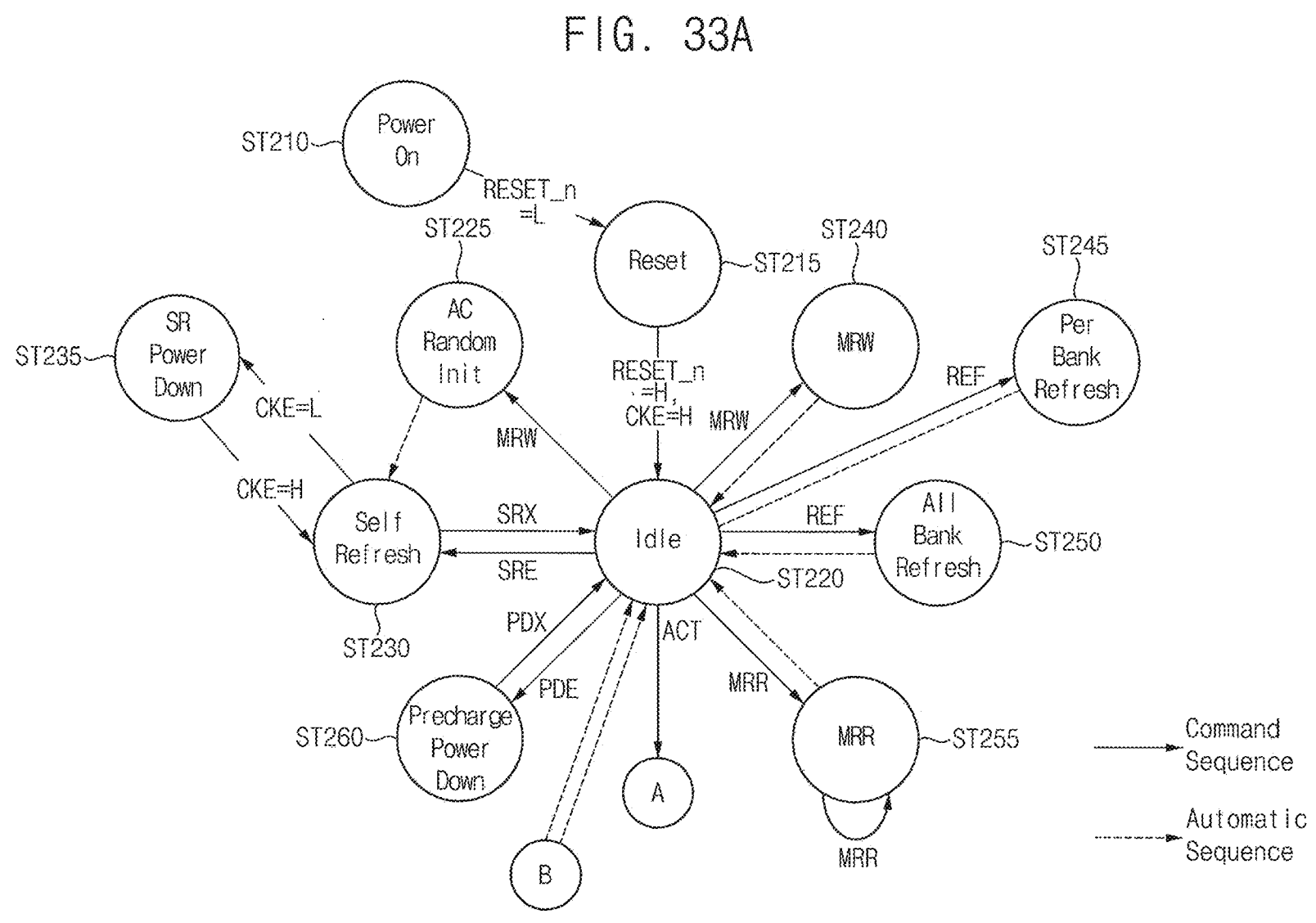
Figure 33B:
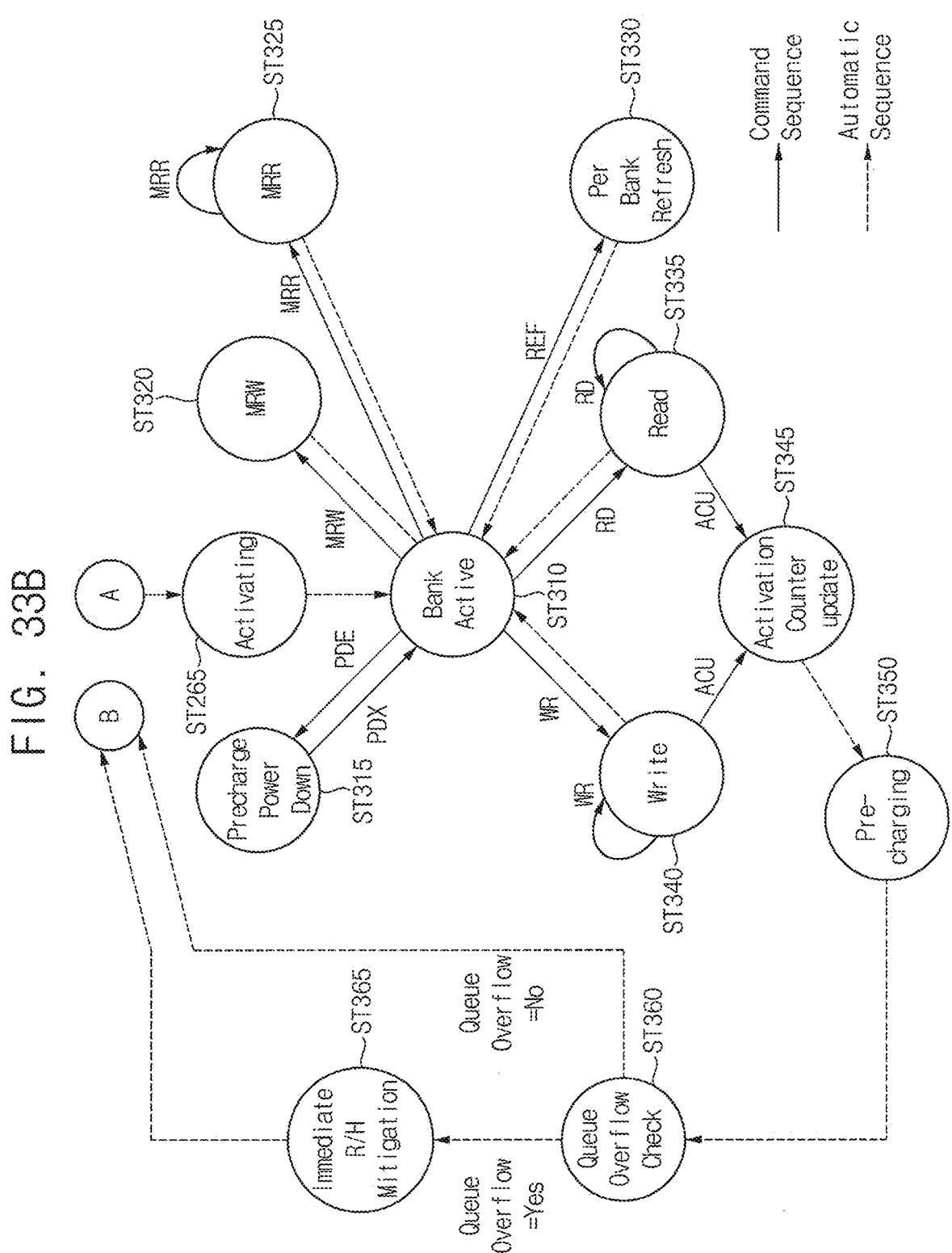

FIGS. 33A and 33B illustrate an example state diagram of a semiconductor memory device according to example embodiments.

Referring to FIGS. 1, 33A and 33B, the semiconductor memory device 200 may be in one of a plurality of operation mode states.

The semiconductor memory device 200 may enter into a power-on state ST210 when power is applied to the semiconductor memory device 200 from the memory controller 30. The power-on state ST210 may transition to a reset state ST215 in response to a reset signal RESET_n having a low level ('L'). The reset state ST215 may transition to an idle state ST220 in response to the reset signal RESET_n having a high level ('H') and a clock enable signal CKE having a high level. The idle state ST220 may define when the semiconductor memory device 200 does not operate, that is, when the semiconductor memory device 200 is not accessed. For example, when there is no command of the CPU 35 (FIG. 1), or when the CPU 35 is in a sleep mode, the semiconductor memory device 200 may be in the idle state ST220.

The idle state ST220 may transition to an active count random initialization state AC Random Init ST225 or a mode register write state ST240 in response to a mode register write command MRW. In the active count random initialization state ST225, the count data is stored in count cells and the active count random initialization state ST225 may automatically transition to a self-refresh state ST230. The self-refresh state ST230 may transition to a self-refresh SR power-down state ST235 in response to the clock enable signal CKE having a low level, and the self-refresh power-down state ST235 may transition to the self-refresh state ST230 in response to the clock enable signal CKE having a high level. The mode register write state ST240 may automatically transition to the idle state ST220.

The idle state ST220 may transition to a per-bank refresh state ST245 or an all bank refresh state ST250 in response to a refresh command REF. The per-bank refresh state ST245 and the all bank refresh state ST250 may automatically transition to the idle state ST220. The semiconductor memory device 200 may perform a refresh operation on the bank arrays 310a~310s sequentially in the per-bank refresh state ST245. The semiconductor memory device 200 may perform a refresh operation on the bank arrays 310a~310s concurrently in the all bank refresh state ST250.

The idle state ST220 may transition to a mode register read state ST255 in response to a mode register read command MRR. The mode register read state ST255 may automatically transition to the idle state ST220 or may be maintained at the mode register read state ST255 in response to the mode register read command MRR.

The idle state ST220 may transition to a precharge and power-down state ST260 in response to a power-down entry command PDE and the precharge and power-down state ST260 may transition to the idle state ST220 in response to a power-down exit command PDX.

The idle state ST220 may transition to a bank active state ST310 after activating a corresponding bank ST265. The bank active state ST310 may transition to an active power-down state ST315 in response to the power-down entry command PDE, and the active power-down state ST315 may transition to the bank active state ST310 in response to power-down exit command PDX.

The bank active state ST310 may transition to a mode register write state ST320 in response to the mode register write command MRW. The mode register write state ST320 may automatically transition to the bank active state ST310. The bank active state ST310 may transition to a mode register read state ST325 in response to the mode register read command MRR. The mode register read state ST325 may automatically transition to the bank active state ST310 or may be maintained at the mode register read state ST325 in response to the mode register read command MRR.

The bank active state ST310 may transition to a per-bank refresh state ST330 in response to the refresh command REF. The per-bank refresh state ST330 may automatically transition to the bank active state ST310.

The bank active state ST310 may transition to a read state S335 in response to a read command RD. The read state S335 may automatically transition to the bank active state ST310, may be maintained at the read state ST335 in response to the read command RD or may transition to an active count update state ST345 in response to an active count update command ACU.

The bank active state ST310 may transition to a write state S345 in response to a write command WR. The write state S345 may automatically transition to the bank active state ST310, may be maintained at the write state S345 in response to the write command WR or may transition to the active count update state ST345 in response to the active count update command ACU.

The active count update state ST345 may automatically transition to a precharge state ST350, and the precharge state ST350 may automatically transition to a hammer address queue overflow check state ST360. When queue overflow occurs (YES in ST360), the hammer address queue overflow check state ST360 may automatically transition to an immediate row hammer R/H mitigation state ST365, and the immediate row hammer mitigation state ST365 may automatically transition to the idle state ST220. When queue overflow does not occur (NO in ST360), the hammer address queue overflow check state ST360 may automatically transition to the idle state ST220.

Therefore, the semiconductor memory device according to example embodiments may store an active count of each of a plurality of memory cell rows in count cells of each of the plurality of memory cell rows as the count data, and may update the count data based on a subsequent command which is applied after the active command. In addition, a hammer address queue in the row hammer management circuit may transition a logic level of an error signal provided to a memory controller from a first logic level to a second logic level in response to candidate hammer addresses being stored in all or a portion of FIFO registers in the hammer address queue. Accordingly, the semiconductor memory device may manage row hammer attacks on the candidate hammer addresses after the candidate hammer addresses are stored in the hammer address queue.

Figure 34:
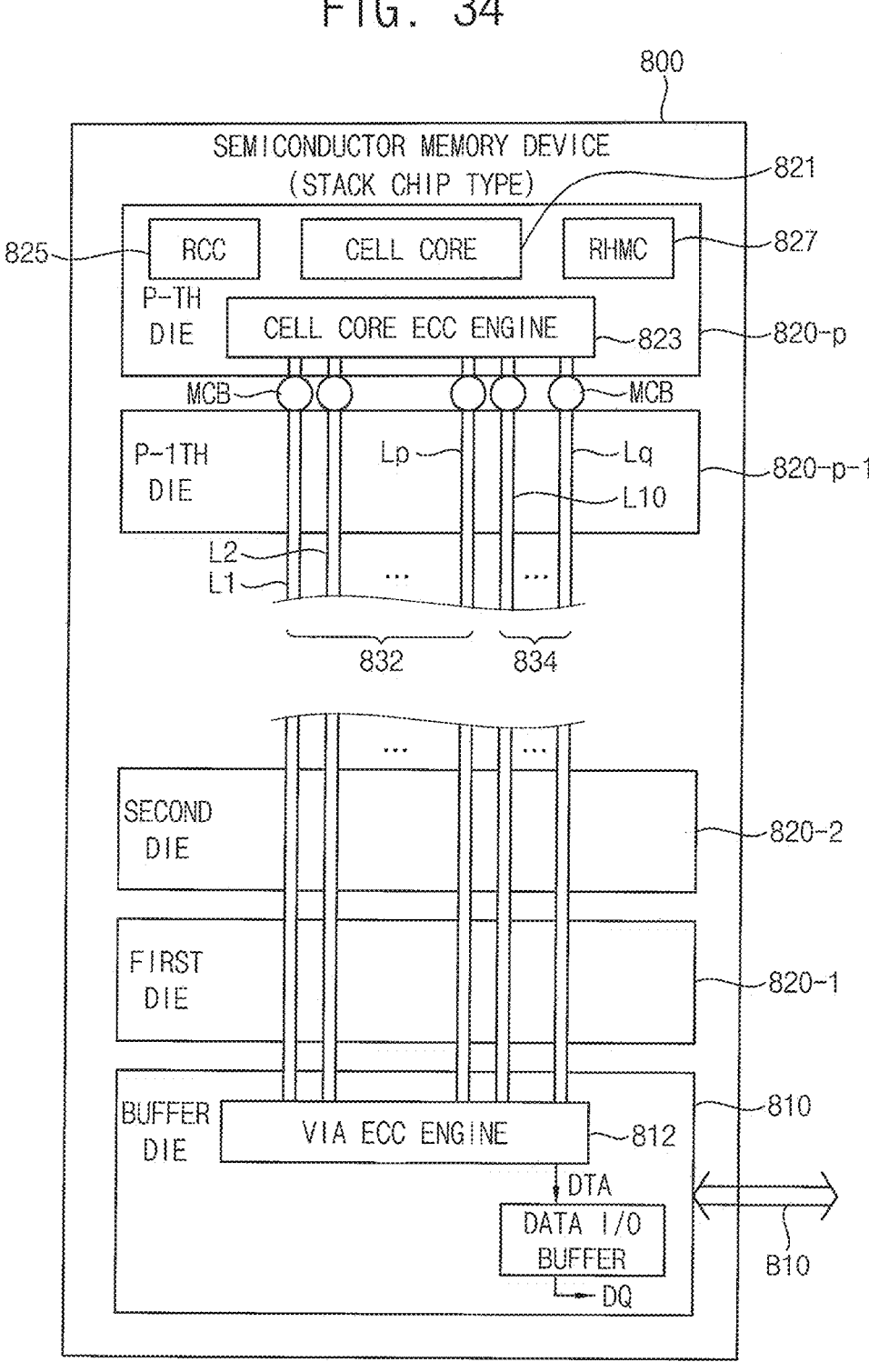
FIG. 34 is a block diagram illustrating a semiconductor memory device according to example embodiments.

FIG. 34 is a block diagram illustrating a semiconductor memory device according to example embodiments.

Referring to FIG. 34, a semiconductor memory device 800 may include at least one buffer die 810 and a plurality of memory dies 820-1 to 820-p (p is a natural number equal to or greater than three) providing a soft error analyzing and correcting function in a stacked chip structure.

The plurality of memory dies 820-1 to 820-p are stacked on the buffer die 810 and conveys data through a plurality of through silicon via (TSV) lines.

At least one of the memory dies 820-1 to 820-p may include a cell core 821 that stores data, a cell core ECC engine 823 that generates transmission parity bits (e.g., transmission parity data) based on transmission data to be sent to the at least one buffer die 810, a refresh control circuit (RCC) 825 and a row hammer management circuit (RHMC) 827. The cell core 821 may include a plurality of memory cells having DRAM cell structure.

The refresh control circuit 825 may employ the refresh control circuit 400 of FIG. 6 and the row hammer management circuit 827 may employ the row hammer management circuit 500a of FIG. 5A or the row hammer management circuit 500b of FIG. 5B. The row hammer management circuit 827 may store an active count of each of a plurality of memory cell rows in count cells in each of the plurality of memory cell rows as a count data, may update the count data based on a subsequent command which is applied after the active command, and thus, may manage the row hammer of all of the memory cell rows. The row hammer management circuit 827 may include a hammer address queue. The hammer address queue may transition a logic level of an error signal provided to a memory controller from a first logic level to a second logic level in response to candidate hammer addresses being stored in all or a portion of FIFO registers in the hammer address queue, and may output one of the candidate hammer addresses as a hammer address. The refresh control circuit 825 may receive a hammer address from the row hammer management circuit 827, and may perform a hammer refresh operation on one or more victim memory cell rows physically adjacent to a memory cell row corresponding to the hammer address.

The buffer die 810 may include a via ECC engine 812 which corrects a transmission error using the transmission parity bits when a transmission error is detected from the transmission data received through the TSV lines and generates error-corrected data.

The buffer die 810 may further include a data I/O buffer 816. The data I/O buffer 816 may generate the data signal DQ by sampling the data DTA from the via ECC engine 812 and may output the data signal DQ to outside of the data I/O buffer 816.

The semiconductor memory device 800 may be a stack chip type memory device or a stacked memory device which conveys data and control signals through the TSV lines. The TSV lines may be also referred to as 'through electrodes'.

The cell core ECC engine 823 may perform error correction on data which is outputted from the memory die 820-p before the transmission data is sent.

A data TSV line group 832 which is formed at one memory die 820-p may include TSV lines L1, L2, . . . , Lp, and a parity TSV line group 834 may include TSV lines L10 to Lq. The TSV lines L1, L2, . . . , Lp of the data TSV line group 832. The parity TSV lines L10 to Lq of the parity TSV line group 834 may be connected to micro bumps MCB which are correspondingly formed among the memory dies 820-1 to 820-p.

The semiconductor memory device 800 may have a three-dimensional (3D) chip structure or a 2.5D chip structure, and may communicate with the host through a data bus B10. The buffer die 810 may be connected with the memory controller through the data bus B10.

According to example embodiments, as illustrated in FIG. 34, the cell core ECC engine 823 may be included in the memory die, and the via ECC engine 812 may be included in the buffer die. Accordingly, embodiments of the present disclosure may detect and correct a soft data fail. The soft data fail may include a transmission error which is generated due to noise when data is transmitted through TSV lines.

Figure 35:
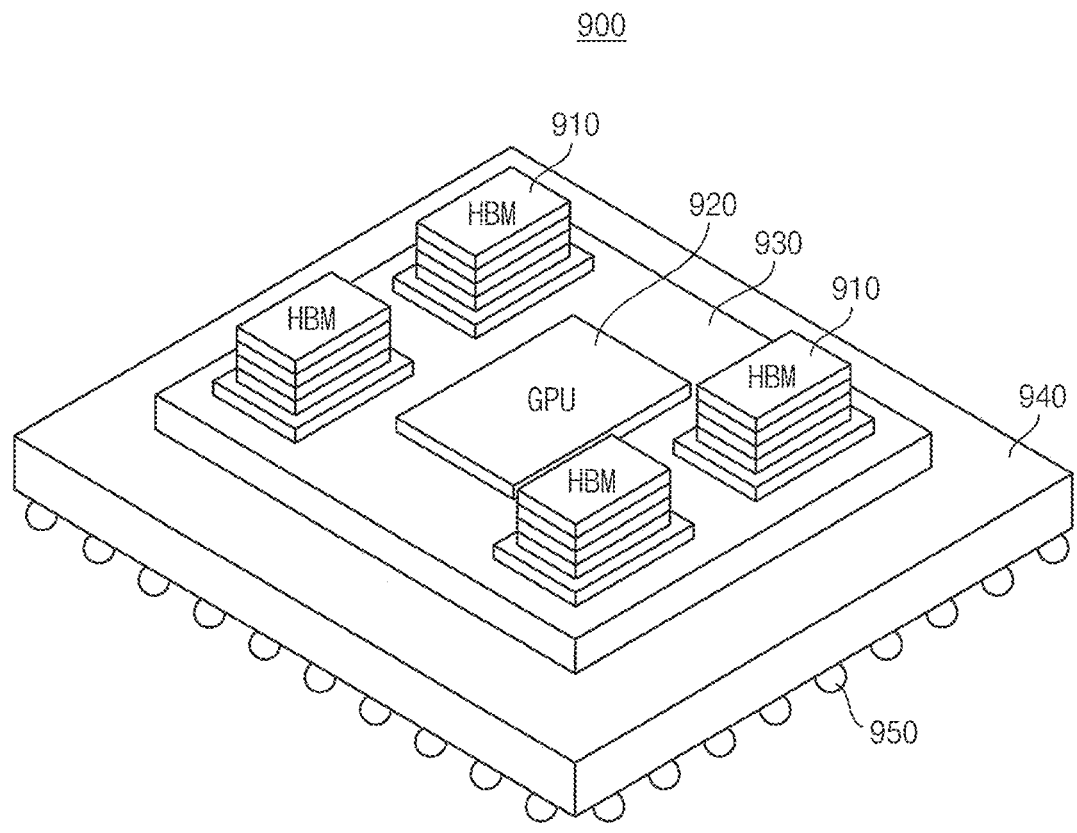
FIG. 35 is a configuration diagram illustrating a semiconductor package including the stacked memory device according to example embodiments.

FIG. 35 is a configuration diagram illustrating a semiconductor package including the stacked memory device according to example embodiments.

Referring to FIG. 35, a semiconductor package 900 may include one or more stacked memory devices 910 and a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940 mounted on solder balls 950. The GPU 920 may correspond to a semiconductor device which may perform a memory control function, and for example, the GPU 920 may be implemented as an application processor (AP). The GPU 920 may include a memory controller having a scheduler.

The stacked memory device 910 may be implemented in various forms. For example, the stacked memory device 910 may be a memory device having a high bandwidth memory (HBM) form in which a plurality of layers are stacked. Accordingly, the stacked memory device 910 may include a buffer die and a plurality of memory dies, and each of the plurality of memory dies includes a refresh control circuit and a row hammer management circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. When the stacked memory device 910 includes a direct access region, a test signal may be provided into the stacked memory device 910 through conductive means (e.g., solder balls 950) mounted under the package substrate 940 and the direct access region.

Figure 36:
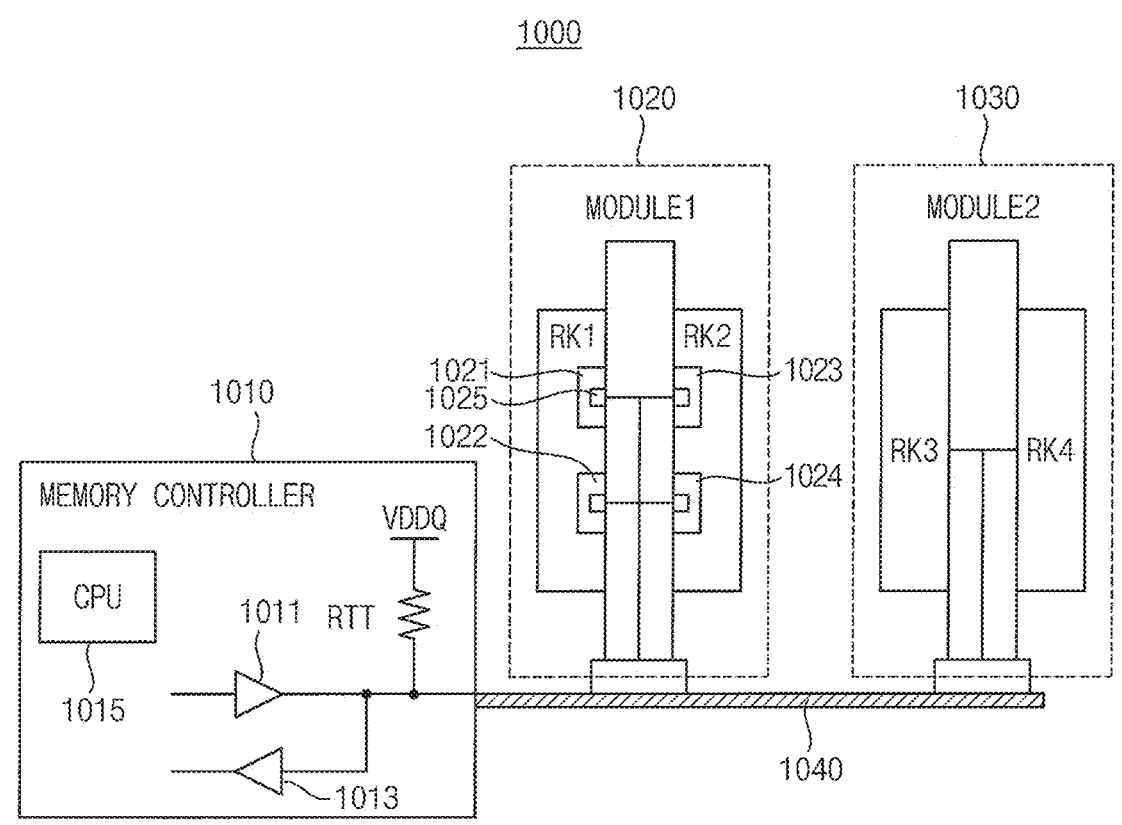
FIG. 36 is a block diagram illustrating a memory system having quad-rank memory modules according to example embodiments.

FIG. 36 is a block diagram illustrating a memory system having quad-rank memory modules according to example embodiments.

Referring to FIG. 36, a memory system 1000 may include a memory controller 1010 and/or memory modules 1020 and 1030. While two memory modules are depicted in FIG. 26, more or fewer memory modules may be included in the memory system 1000, according to some example embodiments.

The memory controller 1010 may control a memory module 1020 and/or 1030 so as to perform a command supplied from a processor and/or host. The memory controller 1010 may be implemented using processing circuitry (e.g., a processor) and/or may be implemented with a host, an application processor or a system-on-a-chip (SoC). For signal integrity, a source termination may be implemented with a resistor RTT on a bus 1040 of the memory controller

1010. The resistor RTT may be coupled to a power supply voltage VDDQ. The memory controller 1010 may include a transmitter 1011, which may transmit a signal to at least one of the memory modules 1020 and/or 1030, and a receiver 1013 that may receive a signal from at least one of the memory modules 1020 and/or 1030. The memory controller 1010 may include a CPU 1015.

The memory modules 1020 and 1030 may be referred to as a first memory module 1020 and a second memory module 1030, respectively. The first memory module 1020 and the second memory module 1030 may be coupled to the memory controller 1010 through the bus 1040. Each of the first memory module 1020 and the second memory module 1030 may include a plurality of semiconductor memory devices and/or a registered clock driver. The first memory module 1020 may include memory ranks RK1 and RK2, and the second memory module 1030 may include memory ranks RK3 and RK4.

The memory rank RK1 may include semiconductor memory devices 1021 and 1022, and the memory rank RK2 may include semiconductor memory devices 1023 and 1024. According to example embodiments, each of the memory ranks RK3 and RK4 may include semiconductor memory devices. Each of the semiconductor memory devices 1021, 1022, 1023 and 1024 may employ the semiconductor memory device 200 of FIG. 3.

Each of the semiconductor memory devices 1021, 1022, 1023 and 1024 may be connected to the memory controller 1010 through an alert pin 1025 and the bus 1040. Each of the semiconductor memory devices 1021, 1022, 1023 and 1024 may notify the memory controller 1010 of an error state by changing a logic level of an alert signal through the alter pin 1025.

The alter pin 1025 of each of the semiconductor memory devices 1021, 1022, 1023 and 1024 may be commonly connected to the bus 1040. When at least one of the semiconductor memory devices 1021, 1022, 1023 and 1024 changes a logic level of the alter signal, a voltage across the resistor RTT is changed, and thus, the CPU 1015 may identify that a situation of a hammer address queue being full occurs in at least one of the semiconductor memory devices 1021, 1022, 1023 and 1024.

FIG. 37 illustrates examples of mode registers in each of the semiconductor memory devices in FIG. 36 according to example embodiments.

Referring to FIG. 37, an error mode may be set in a mode register MRxx, a type of the mode register MRxx is a read type R and the mode register MRxx may indicate a hammer address queue PRHT_QUEUE is full by setting an operation code OP[7:0] to 'xxx1xxxx'.

A hammer address queue in a full state PRHT_QUEUE_FULL may be set in a mode register MRyy, a type of the mode register MRyy is a read type R and the mode register MRyy may indicate a bank array corresponding to the hammer address queue in a full state PRHT_QUEUE_FULL by setting a bank group address BG Address and a bank address Bank address in operation code OP[5:0]. An operation code OP[7:6] may be reserved for future use RFU.

In volatile memory devices according to a comparative example, such as dynamic random access memory (DRAM) devices, cell charges stored in a memory cell may be lost by a leakage current. In addition, when a word-line is transitioned frequently between an active state and a precharged state (e.g., when the word-line has been accessed intensively or frequently), an affected memory cell connected to a word-line that is adjacent to the frequently accessed word-line may lose stored charges. Charges stored in a memory cell may be maintained by recharging before data is lost by leakage of cell charges. Such recharge of cell charges is referred to as a refresh operation, and a refresh operation may be performed repeatedly before cell charges are significantly lost. As described herein, embodiments of the present disclosure may reduce or prevent the loss of data stored in memory devices that may otherwise occur in such a comparative example.

As is traditional in the field of the present disclosure, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

Aspects of the present disclosure may be applied to systems using semiconductor memory devices that employ volatile memory cells. For example, aspects of the present disclosure may be applied to systems such as, for example, a smartphone, a navigation system, a notebook computer, a desktop computer, a game console, etc. that use the semiconductor memory device as a working memory.

While the present disclosure has been particularly shown and described with reference to embodiments thereof, it will be understood by those of ordinary skill in the art that various changes in form and detail may be made therein without departing from the spirit and scope of the present invention as defined by the following claims.

What is claimed is:

1. A memory device comprising:
   a memory cell array comprising a plurality of memory cell rows, each including a plurality of memory cells;
   a row hammer management circuit configured to:
      count a number of active commands applied to at least one memory cell row among the plurality of memory cell rows and store count data indicating the number of active commands applied to the at least one memory cell row,
      compare the count data with a first threshold value among a plurality of threshold values,
      store an address of the at least one memory cell row corresponding to the count data as a candidate hammer address in a register among a plurality of registers based on the count data being greater than or equal to the first threshold value, and
      determine whether a number of candidate hammer addresses stored in the plurality of registers is equal to a second threshold value among the plurality of threshold values;
   an error pin configured to transmit an error signal to a memory controller based on the number of candidate hammer addresses stored in the plurality of registers being equal to the second threshold value; and
   a refresh control circuit configured to perform refresh operation on one or more adjacent rows to the at least one memory cell row based on receiving a refresh management command from the memory controller.

2. The memory device of claim 1, wherein the row hammer management circuit comprises:

a monitoring logic circuit configured to switch a logic level of the error signal from a first logic level to a second logic level to generate the error signal based on the number of candidate hammer addresses stored in the plurality of registers being equal to the second threshold value.

3. The memory device of claim 2, wherein the monitoring logic circuit is configured to switch the logic level of the error signal from the second logic level to the first logic level based on receiving the refresh management command from the memory controller.

4. The memory device of claim 2, wherein the row hammer management circuit is configured to store a second address of the at least one memory cell row as a second candidate hammer address in a second register among the plurality of registers based on second count data of the second address of the at least one memory cell row being greater than the first threshold value, wherein the row hammer management circuit is configured to set priority to the second candidate hammer address over the candidate hammer address based on the second count data of the second address being greater than or equal to a third threshold value among the plurality of threshold values and the count data of the address being less than the third threshold value, and wherein the third threshold value is greater than the first threshold value, and less than the second threshold value.

5. The memory device of claim 4, wherein the monitoring logic circuit is configured to generate a selection signal based on the priority, and control a multiplexer circuit to selectively output one of the candidate hammer address and the second candidate hammer address to the refresh control circuit, and wherein the refresh control circuit is configured to perform the refresh operation on one or more adjacent rows to the second candidate hammer address prior to performing the refresh operation on one or more adjacent rows to the candidate hammer address.

6. The memory device of claim 1, wherein the row hammer management circuit comprises:

a random number generator circuit configured to generate a random count data to be stored as the count data in one or more count cells in the at least one memory cell row based on a random initialization command received from the memory controller.

7. The memory device of claim 6, wherein the memory device is configured to enter a self-refresh mode to maintain the random count data based on receiving the random initialization command from the memory controller.

8. The memory device of claim 7, wherein the memory device is configured to enter a normal mode from the self-refresh mode based on receiving a self-refresh exit command from the memory controller.

9. The memory device of claim 1, wherein the memory device comprises:

a mode register set including first code for indicating an error mode of the memory device, and second code for indicating that the number of candidate hammer addresses stored in the plurality of registers is equal to the second threshold value.

10. A memory system comprising:
a memory controller comprising:
a refresh management control logic circuit configured to generate a refresh management command; and
a memory device comprising:
a memory cell array comprising a plurality of memory cell rows, each including a plurality of memory cells;
a row hammer management circuit configured to:
count a number of active commands applied to at least one memory cell row among the plurality of memory cell rows and store count data indicating the number of active commands applied to the at least one memory cell row,
compare the count data with a first threshold value among a plurality of threshold values,
store an address of the at least one memory cell row corresponding to the count data as a candidate hammer address in a register among a plurality of registers based on the count data being greater than or equal to the first threshold value, and
determine whether a number of candidate hammer addresses stored in the plurality of registers is equal to a second threshold value among the plurality of threshold values;
an error pin configured to transmit an error signal to a memory controller based on the number of candidate hammer addresses stored in the plurality of registers being equal to the second threshold value; and
a refresh control circuit configured to perform refresh operation on one or more adjacent rows to the at least one memory cell row based on receiving the refresh management command from the memory controller.

11. The memory system of claim 10, wherein the row hammer management circuit comprises:

a monitoring logic circuit configured to switch a logic level of the error signal from a first logic level to a second logic level to generate the error signal based on the number of candidate hammer addresses stored in the plurality of registers being equal to the second threshold value.

12. The memory system of claim 11, wherein the monitoring logic circuit is configured to switch the logic level of the error signal from the second logic level to the first logic level based on receiving the refresh management command from the memory controller.

13. The memory system of claim 11, wherein the row hammer management circuit is configured to store a second address of the at least one memory cell row as a second candidate hammer address in a second register among the plurality of registers based on second count data of the second address of the at least one memory cell row being greater than the first threshold value, wherein the row hammer management circuit is configured to set priority to the second candidate hammer address over the candidate hammer address based on the second count data of the second address being greater than or equal to a third threshold value among the plurality of threshold values and the count data of the address being less than the third threshold value, and wherein the third threshold value is greater than the first threshold value, and less than the second threshold value.

14. The memory system of claim 13, wherein the monitoring logic circuit is configured to generate a selection signal based on the priority, and control a multiplexer circuit to selectively output one of the candidate hammer address and the second candidate hammer address to the refresh control circuit, and wherein the refresh control circuit is configured to perform the refresh operation on one or more adjacent rows to the second candidate hammer address prior to performing the refresh operation on one or more adjacent rows to the candidate hammer address.

15. The memory system of claim 10, wherein the row hammer management circuit comprises:

a random number generator circuit configured to generate a random count data to be stored as the count data in one or more count cells in the at least one memory cell row based on a random initialization command received from the memory controller.

16. The memory system of claim 15, wherein the memory device is configured to enter a self-refresh mode to maintain the random count data based on receiving the random initialization command from the memory controller.

17. The memory system of claim 16, wherein the memory device is configured to enter a normal mode from the self-refresh mode based on receiving a self-refresh exit command from the memory controller.

18. The memory system of claim 10, wherein the memory device comprises:

a mode register set including first code for indicating an error mode of the memory device, and second code for indicating that the number of candidate hammer addresses stored in the plurality of registers is equal to the second threshold value.

19. The memory system of claim 10, wherein the memory controller is configured to hold transmitting an active command in response to receiving the error signal from the memory device.

* * * * *